(12) United States Patent
Yamamoto et al.

(10) Patent No.: US 10,636,975 B2
(45) Date of Patent: Apr. 28, 2020

(54) ORGANIC SEMICONDUCTOR ELEMENT, COMPOUND, ORGANIC SEMICONDUCTOR COMPOSITION, AND METHOD OF MANUFACTURING ORGANIC SEMICONDUCTOR FILM

(71) Applicant: FUJIFILM Corporation, Tokyo (JP)

(72) Inventors: Yosuke Yamamoto, Kanagawa (JP); Yuta Shigenoi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 4 days.

(21) Appl. No.: 15/857,746

(22) Filed: Dec. 29, 2017

(65) Prior Publication Data

US 2018/0145259 A1      May 24, 2018

Related U.S. Application Data

(63) Continuation of application No. PCT/JP2016/068471, filed on Jun. 22, 2016.

(30) Foreign Application Priority Data

Jul. 7, 2015 (JP) ................................. 2015-136448

(51) Int. Cl.
*C08G 61/12* (2006.01)
*H01L 29/786* (2006.01)
(Continued)

(52) U.S. Cl.
CPC .......... *H01L 51/0036* (2013.01); *C08G 61/12* (2013.01); *C08G 61/123* (2013.01);
(Continued)

(58) Field of Classification Search
CPC ............................ H01L 51/30; H01L 51/0036
(Continued)

(56) References Cited

U.S. PATENT DOCUMENTS

| | | |
|---|---|---|
| 7,939,818 B2 | 5/2011 | Heim et al. |
| 8,758,880 B2 | 6/2014 | Flores et al. |

(Continued)

FOREIGN PATENT DOCUMENTS

| | | |
|---|---|---|
| JP | 2007-516315 A | 6/2007 |
| JP | 2009-541548 A | 11/2009 |

(Continued)

OTHER PUBLICATIONS

International Search Report issued in PCT/JP2016/068471; dated Aug. 9, 2016.

(Continued)

*Primary Examiner* — Duc Truong
(74) *Attorney, Agent, or Firm* — Studebaker & Brackett PC

(57) ABSTRACT

An object of the present invention is to provide an organic semiconductor element (in particular, an organic thin film transistor) that exhibits high carrier mobility and can stably maintain carrier mobility even after long-term storage under high temperature and high humidity, a compound, an organic semiconductor composition, and a method of manufacturing an organic semiconductor film. The organic semiconductor element of the present invention contains a compound having a molecular weight of 2,000 or greater and a repeating unit represented by Formula (1). In Formula (1), A represents an electron acceptor unit, D is an electron donor unit, and at least one of D or A has at least one monovalent group represented by Formula (1-1). In Formula (1-1), Ar represents an aromatic heterocyclic group or an aromatic hydrocarbon group having 5 to 18 carbon atoms. $C_a$ represents $CR^1R^2$. $L_a$ represents an alkylene group having 1 to 20 carbon atoms. $L_b$ represents an alkyl group having 9 or more (Continued)

carbon atoms. l represents an integer of 1 to 5. * represents a bonding site to another structure.

$$\{-D-A-\}(1)*-C_a-L_a-Ar-(-L_b)_l \quad (1\text{-}1)$$

20 Claims, 1 Drawing Sheet

(51) Int. Cl.
*H01L 51/00* (2006.01)
*C09D 5/24* (2006.01)
*C09D 165/00* (2006.01)
*H01L 21/336* (2006.01)
*H01L 51/05* (2006.01)

(52) U.S. Cl.
CPC ............ *C08G 61/126* (2013.01); *C09D 5/24* (2013.01); *C09D 165/00* (2013.01); *H01L 29/786* (2013.01); *H01L 51/0043* (2013.01); *C08G 2261/124* (2013.01); *C08G 2261/148* (2013.01); *C08G 2261/149* (2013.01); *C08G 2261/1412* (2013.01); *C08G 2261/1424* (2013.01); *C08G 2261/18* (2013.01); *C08G 2261/228* (2013.01); *C08G 2261/314* (2013.01); *C08G 2261/3223* (2013.01); *C08G 2261/3241* (2013.01); *C08G 2261/3243* (2013.01); *C08G 2261/3246* (2013.01); *C08G 2261/334* (2013.01); *C08G 2261/344* (2013.01); *C08G 2261/414* (2013.01); *C08G 2261/51* (2013.01); *C08G 2261/514* (2013.01); *C08G 2261/92* (2013.01); *H01L 51/0003* (2013.01); *H01L 51/0558* (2013.01)

(58) Field of Classification Search
USPC ........................................................ 528/380
See application file for complete search history.

(56) References Cited

U.S. PATENT DOCUMENTS

| | | | |
|---|---|---|---|
| 9,018,397 | B2 | 4/2015 | Hao et al. |
| 9,048,433 | B2 | 6/2015 | Blouin et al. |
| 9,219,233 | B2 | 12/2015 | Facchetti et al. |
| 2010/0099840 | A1 | 4/2010 | Moon et al. |
| 2011/0127512 | A1 | 6/2011 | Goto et al. |
| 2012/0305899 | A1 | 12/2012 | Taki et al. |
| 2014/0001411 | A1 | 1/2014 | Blouin et al. |
| 2016/0049589 | A1 | 2/2016 | Turbiez et al. |
| 2016/0293849 | A1 | 10/2016 | Suzuki et al. |

FOREIGN PATENT DOCUMENTS

| | | |
|---|---|---|
| JP | 2010-018790 A | 1/2010 |
| JP | 2010-527327 A | 8/2010 |
| JP | 2011-501451 A | 1/2011 |
| JP | 2011-501743 A | 1/2011 |
| JP | 2011-514399 A | 5/2011 |
| JP | 2011-514913 A | 5/2011 |
| JP | 2012-131938 A | 7/2012 |
| JP | 2014-507488 A | 3/2014 |
| JP | 2014-515043 A | 6/2014 |
| JP | 2014-237733 A | 12/2014 |
| TW | 201245266 A | 11/2012 |
| WO | 2012/174561 A2 | 12/2012 |
| WO | 2015/076171 A1 | 5/2015 |

OTHER PUBLICATIONS

Written Opinion issued in PCT/JP2016/068471; dated Aug. 9, 2016.
Shi et al.; Alkylphenyl Substituted Naphthodithiophene: A New Building Unit with Conjugated Side Chains for Semiconducting Materials; Macromolecular Rapid Communications; vol. 35; 2014; pp. 1886-1889.
An Office Action mailed by Taiwan Intellectual Property Office dated Jan. 22, 2020, which corresponds to Taiwanese Patent Application No. 105120881 and is related to U.S. Appl. No. 15/857,746.

ORGANIC SEMICONDUCTOR ELEMENT, COMPOUND, ORGANIC SEMICONDUCTOR COMPOSITION, AND METHOD OF MANUFACTURING ORGANIC SEMICONDUCTOR FILM

CROSS-REFERENCE TO RELATED APPLICATIONS

This application is a Continuation of PCT International Application No. PCT/JP2016/068471 filed on Jun. 22, 2016, which claims priority under 35 U.S.C. § 119(a) to Japanese Patent Application No. 2015-136448 filed on Jul. 7, 2015. The above application is hereby expressly incorporated by reference, in its entirety, into the present application.

BACKGROUND OF THE INVENTION

1. Field of the Invention

The present invention relates to an organic semiconductor element, a compound, an organic semiconductor composition, and a method of manufacturing an organic semiconductor film.

2. Description of the Related Art

Since light weight, low cost, and flexibility can be achieved, an organic thin film transistor (organic TFT) having an organic semiconductor film (organic semiconductor layer) is used in a device using a logic circuit such as a field effect transistor (FET), a radio frequency identifier (RFID: RF tag), or a memory used in liquid crystal displays or an organic electro luminescence (EL) display.

As a compound for forming such an organic semiconductor film, it is known that a polymer (so-called a "D-A-type polymer") obtained by combining an electron donating (donor) unit and an electron accepting (acceptor) unit is useful.

As specific examples of the D-A-type polymer, JP2014-237733A discloses a compound obtained by introducing an aryl group to a side chain of a repeating unit (see Example 14 of JP2014-237733A).

SUMMARY OF THE INVENTION

Recently, in view of improving the performance of the organic thin film transistor, further improvement of the carrier mobility of the organic thin film transistor is required.

In accordance with popularization of the organic thin film transistors, it is expected that the types of devices equipped with the organic thin film transistors are diversified, and the mounting ratio thereof is rising, and characteristics in that carrier mobility can be stably maintained even after long-term storage under various circumstances, particularly under high temperature and high humidity are required.

In this manner, the present inventors have conducted research on an organic thin film transistor in which a D-A-type polymer obtained by introducing an aryl group to the side chain of the repeating unit as a substituent was used as an organic semiconductor compound disclosed in JP2014-237733A to find that the carrier mobility was insufficient and the carrier mobility in a case of long-term storage under high temperature and high humidity cannot be stably maintained.

An object of the present invention is to provide an organic semiconductor element (in particular, an organic thin film transistor) that exhibits high carrier mobility and can stably maintain carrier mobility even after long-term storage under high temperature and high humidity.

Another object of the present invention is to provide an organic semiconductor element, which exhibits high carrier mobility in a case of being used for an organic semiconductor layer of an organic semiconductor element (particularly, an organic thin film transistor), a compound in which carrier mobility is stably maintained even after long-term storage under high temperature and high humidity, an organic semiconductor composition using the compound, and a method of manufacturing an organic semiconductor film.

As a result of intensive studies on the above problems, the present inventors have found that a desired effect can be obtained by using a compound represented by Formula (1) described below, to as to conceive the present invention.

That is, the present inventors have found that the aforementioned objects can be achieved with the following configurations.

[1] An organic semiconductor element comprising: a compound having a molecular weight of 2,000 or greater and having a repeating unit represented by Formula (1).

[2] The organic semiconductor element according to [1], in which in $-(L_b)_l$ in Formula (1-1), the number of carbon atoms of at least one $L_b$ is 20 to 100.

[3] The organic semiconductor element according to [1] or [2], in which A in Formula (1) has at least one structure selected from the group consisting of structures represented by Formulae (A-1) to (A-12), as a partial structure.

[4] The organic semiconductor element according to any one of [1] to [3], in which D in Formula (1) is a structure represented by Formula (D-1).

[5] The organic semiconductor element according to any one of [1] to [4], in which the repeating unit represented by Formula (1) is a repeating unit represented by any one of Formulae (2) to (5).

[6] The organic semiconductor element according to [3], in which Formulae (A-1) to (A-12) each have at least one of $R^{A1}$ or $R^{A2}$, and in which at least one of $R^{A1}$ or $R^{A2}$ in each formula is a monovalent group represented by Formula (1-1).

[7] The organic semiconductor element according to [5], in which Formulae (2) to (5) each have at least one of $R^{A1}$ or $R^{A2}$, and in which at least one of $R^{A1}$ or $R^{A2}$ in each formula is a monovalent group represented by Formula (1-1).

[8] A compound having a molecular weight of 2,000 or greater and having a repeating unit represented by Formula (1), and in which A in Formula (1) has at least one structure selected from the group consisting of structures represented by Formulae (A-1) to (A-12), as a partial structure.

[9] The compound according to [8], in which the repeating unit represented by Formula (1) is a repeating unit represented by any one of Formulae (2) to (5).

[10] An organic semiconductor composition comprising: a compound having a molecular weight of 2,000 or greater and having a repeating unit represented by Formula (1); and a solvent.

[11] A method of manufacturing an organic semiconductor film, comprising: a coating step of coating a substrate with the organic semiconductor composition according to [10].

As described above, according to the present invention, it is possible to provide an organic semiconductor element (in particular, an organic thin film transistor) that exhibits high carrier mobility and can stably maintain carrier mobility even after long-term storage under high temperature and high humidity.

According to the present invention, it is possible is to provide an organic semiconductor element, which exhibits high carrier mobility in a case of being used for an organic semiconductor layer of an organic semiconductor element (particularly, an organic thin film transistor), a compound in which carrier mobility is stably maintained even after long-term storage under high temperature and high humidity, an organic semiconductor composition using the compound, and a method of manufacturing an organic semiconductor film.

DESCRIPTION OF THE PREFERRED EMBODIMENTS

Figure 1:
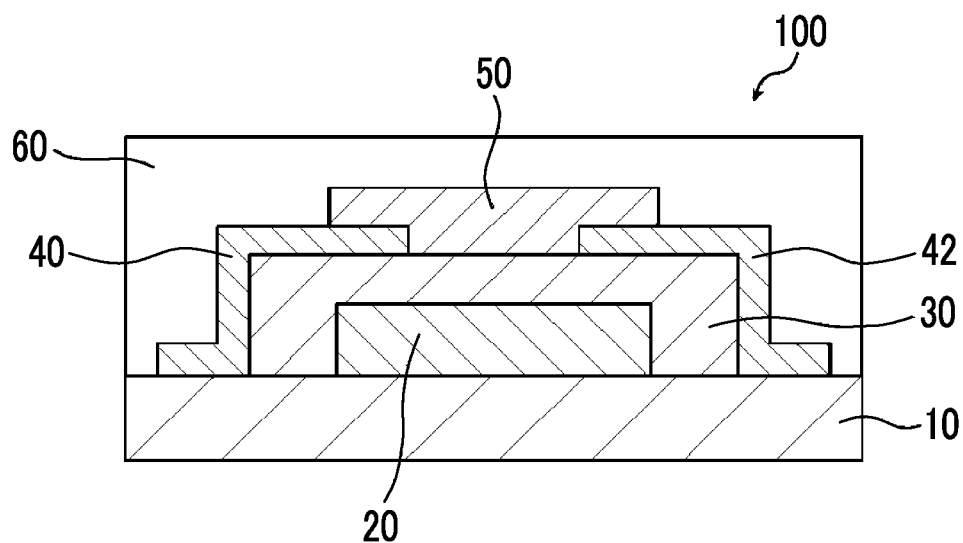
FIG. 1 is a cross-sectional view schematically illustrating a bottom contact type organic thin film transistor according to one embodiment of the present invention.

Hereinafter, the present invention is described below. The constituents in the following description will be explained based on typical embodiments of the present invention, but the present invention is not limited to the embodiments.

In the present specification, the definition of the compound is used in the meaning of including salts thereof and ions thereof, in addition to the compound itself.

In the present specification, in a case where a plurality of substituents, linking groups, or the like (hereinafter, referred to as "substituents or the like) represented by a specific reference numeral exist, or in a case where a plurality of substituents or the like are defined at the same time, the respective substituents or the like may be identical to or different from each other. The same is also applied to the definition of the number of substituents or the like.

Unless described otherwise, in a case where a plurality of substituents or the like are close to each other (particularly, adjacent to each other), this means that the substituents or the like are linked to each other or fused to each other to form a ring.

In the present specification, substituents or the like in which substitution or unsubstitution is not defined mean the substituents or the like may further have a substituent without deteriorating the desired effect. The same is applied to a compound in which substitution or unsubstitution is not defined.

In the present specification, the numerical range expressed by using "to" means a range including numerical values described before and after "to" as a lower limit value and an upper limit value.

[Organic Semiconductor Element]

The organic semiconductor element of the present invention contains a compound having a molecular weight of 2,000 or greater and a repeating unit represented by Formula (1).

As a result of intensive research, the present inventors have found that an organic thin film transistor having excellent carrier mobility and excellent atmospheric stability can be obtained by using a compound having a repeating unit represented by Formula (1). Details of the reason are not clarified, the following reasons are assumed.

The compound having a repeating unit represented by Formula (1) is a compound obtained by introducing a monovalent group represented by Formula (1-1), in the side chain of the main-chain skeleton formed from the electron donor unit and the electron acceptor unit.

Here, the terminal of a group represented by Formula (1-1), that is, a portion not directly bonded to the main-chain skeleton ("—Ar-$(L_b)_i$," in Formula (1-1)) has a structure in which an aromatic hydrocarbon group or an aromatic heterocyclic group ("Ar" in Formula (1-1)) is substituted with an alkyl group ($L_b$) having a specific carbon number.

In this manner, in a case where "$L_b$" in Formula (1-1) has a specific carbon number, the compound represented by Formula (1-1) has excellent hydrophobicity. It is assumed that, since temporal absorption of moisture of the organic semiconductor layer is suppressed, even in a case where the organic semiconductor element is stored under high temperature and high humidity for a long time, carrier mobility can be stably maintained (hereinafter, also referred to as "temporal stability under high temperature and high humidity").

In a case where an alkyl group ($L_b$) having a specific carbon number is introduced, the solubility of the compound represented by Formula (1-1) to an organic solvent is improved. An organic semiconductor film (organic semiconductor layer) excellent in uniformity with few structural defects such as voids can be obtained. As a result, it is assumed that, since loss of mobility due to structural defects or the like can be suppressed, the organic semiconductor element will have excellent carrier mobility. It is assumed that, since the introduction of the alkyl group ($L_b$) having a specific carbon number improves the hydrophobic interaction between alkyl, crystallization of the organic semiconductor compound in the formed organic semiconductor layer (organic semiconductor film) easily proceeds, and the organic semiconductor element has excellent carrier mobility.

Particularly, the main-chain skeleton of the D-A-type polymer has a planar structure in which ring structures are long in many cases. It is considered that such a D-A-type polymer tends to have low solubility in an organic solvent, and thus the effect of the substitution with a monovalent group represented by Formula (1-1) is remarkably exhibited.

Hereinafter, the configuration of the present invention is described below.

<Compound Having Molecular Weight of 2,000 or Greater and Having Repeating Unit Represented by Formula (1)>

The compound having a molecular weight of 2,000 or greater and a repeating unit represented by Formula (1) (hereinafter, simply referred to as a "specific compound") is preferably used as an organic semiconductor layer (organic semiconductor film) in an organic semiconductor element such as an organic thin film transistor.

  (1)

In Formula (1), A represents an electron acceptor unit including a partial structure having at least one of a sp2 nitrogen atom, a carbonyl group, or a thiocarbonyl group in a ring structure.

D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure.

In Formula 1, at least one of D or A has at least one monovalent group represented by Formula (1-1).

(1-1)

In Formula (1-1), Ar represents an aromatic heterocyclic group or an aromatic hydrocarbon group having 5 to 18 carbon atoms. $C_a$ represents $CR^1R^2$. $L_a$ represents an alkylene group having 1 to 20 carbon atoms that may contain at least one of —O—, —S—, or —$NR^3$—. $L_b$ represents an alkyl group having 9 or more carbon atoms that may contain at least one of —O—, —S—, or —$NR^4$—. $R^1$ to $R^4$ each independently represent a hydrogen atom or a substituent. l represents an integer of 1 to 5. In a case where l is 2 or greater, a plurality of $L_b$'s may be identical to as or different from each other. * represents a bonding portion to another structure.

(Electron Acceptor Unit)

In Formula (1), A represents an electron acceptor unit including a partial structure having at least one of a sp2 nitrogen atom, a carbonyl group, or a thiocarbonyl group in a ring structure.

A preferably has at least one structure selected from the group consisting of structures represented by Formulae (A-1) to (A-12) as a partial structure, and A is more preferably a structure represented by at least one selected from the group consisting of Formulae (A-1) to (A-12).

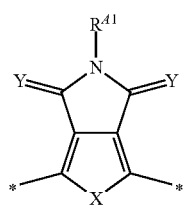
(A-1)

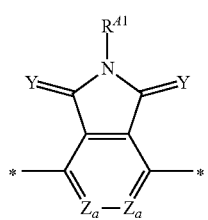
(A-2)

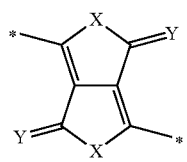
(A-3)

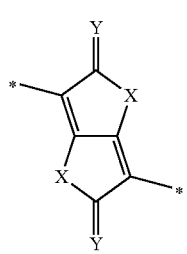
(A-4)

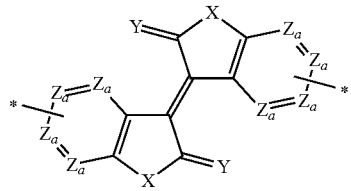
(A-5)

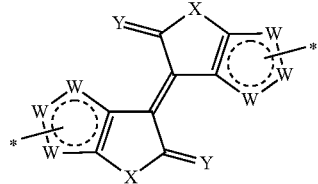
(A-6)

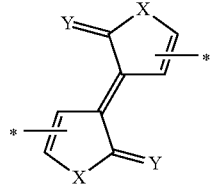
(A-7)

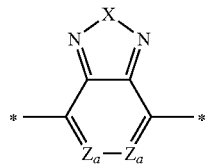
(A-8)

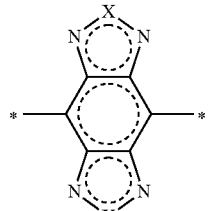
(A-9)

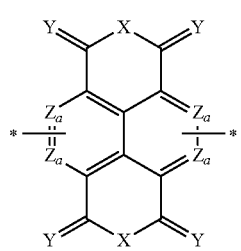
(A-10)

(A-11)

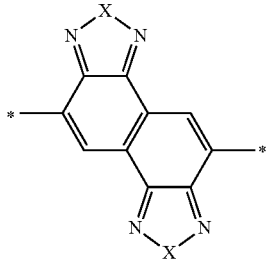

(A-12)

In Formulae (A-1) to (A-12), X's each independently represent an O atom, a S atom, a Se atom, or $NR^{41}$. Y's each independently represent an O atom or a S atom. $Z_a$'s each independently represent $CR^{42}$ or a N atom. W's each independently represent $C(R^{42})_2$, $NR^{41}$, a N atom, $CR^{42}$, an O atom, a S atom, or a Se atom. $R^4$'s each independently represent an alkyl group that may contain at least one of —O—, —S—, or —$NR^{43}$—, a monovalent group represented by Formula (1-1), or a bonding site to another structure. $R^{42}$'s each independently represent a hydrogen atom, a halogen atom, an alkyl group that may contain at least one of —O—, —S—, or —$NR^{43}$—, a monovalent group represented by Formula (1-1), or a bonding site to another structure. $R^{43}$'s each independently represent a hydrogen atom or a substituent. *'s each independently represent a bonding site to another structure.

In Formulae (A-5) and (A-10), in each of the two ring structures including $Z_a$, one of $Z_a$'s is $CR^{42}$, and $R^{42}$ represents a bonding site to another structure. This bonding site to another structure corresponds to * in the formula. Specifically, a bonding hand (hereinafter, simply referred to as a "bonding hand") in which * that represents a bonding site to another structure is positioned at a terminal stretching from any one of $Z_a$'s in each formula, and $Z_a$ from which this bonding hand stretches is $CR^{42}$ and corresponds to an aspect in which $R^{42}$ represents a bonding site to another structure.

In Formula (A-11), two $Z_a$'s are $CR^{42}$, and $R^{42}$ represents a bonding site to another structure. This bonding site to another structure corresponds to * in the formula.

In Formula (A-6), in each of the two ring structures including W's, one of W's represents at least one of the three following aspects.
Aspect 1: W represents $CR^{42}$, and $R^{42}$ represents a bonding site to another structure.
Aspect 2: W represents $NR^{41}$, and $R^{41}$ represents a bonding site to another structure.
Aspect 3: W represents $C(R^{42})_2$ and any one of $R^{42}$'s represents a bonding site to another structure.

In Formulae (A-1) to (A-12), X's each independently represent an O atom, a S atom, a Se atom, or $NR^{41}$, a S atom or $NR^{41}$ is preferable.

Y's each independently represent an O atom or a S atom, and an O atom is preferable.

$Z_a$'s each independently represent $CR^{42}$ or a N atom, and $CR^{42}$ is preferable.

W's each independently represent $C(R^{42})_2$, $NR^{41}$, a N atom, $CR^{42}$, an O atom, a S atom, or a Se atom, and $C(R^{41})_2$, $CR^{42}$, or a S atom is preferable.

$R^{41}$'s each independently represent an alkyl group that may contain at least one of —O—, —S—, or —$NR^{43}$—, a monovalent group represented by Formula (1-1), or a bonding site to another structure, and a monovalent group represented by Formula (1-1) is preferable.

In a case where $R^{41}$ represents an alkyl group that may contain at least one of —O—, —S—, or —$NR^{43}$—, an alkyl group having 2 to 30 carbon atoms is preferable, and an alkyl group having 8 to 25 carbon atoms is more preferable. The alkyl group may have a linear shape or a branched shape.

A bonding site to another structure in $R^{41}$ is a bonding site to another structure represented by * in Formulae (A-1) to (A-12).

$R^{42}$'s each independently represent an alkyl group that may contain at least one of —O—, —S—, or —$NR^{43}$—, a hydrogen atom, a halogen atom, a monovalent group represented by Formula (1-1), or a bonding site to another structure, and a hydrogen atom or a bonding site to another structure is preferable.

In a case where $R^{42}$ represents an alkyl group that may contain at least one of —O—, —S—, or —$NR^{43}$—, an alkyl group having 2 to 30 carbon atoms is preferable, and an alkyl group having 8 to 25 carbon atoms is more preferable. The alkyl group may have a linear shape or a branched shape.

In a case where $R^{42}$ represents a halogen atom, a F atom, a Cl atom, a Br atom, or an I atom is preferable, and a F atom is more preferable.

A bonding site to another structure in $R^{42}$ is a bonding site to another structure represented by * in Formulae (A-1) to (A-12).

$R^{43}$'s each independently represent a hydrogen atom or a substituent. The substituent in $R^{43}$ has the same meaning as the substituent in $R^1$ to $R^4$ described below.

With respect to the specific compound, A in Formula (1) preferably has at least one structure selected from the group consisting of structures represented by Formulae (A-1) to (A-12) as a partial structure, more preferably has at least one structure selected from the group consisting of structures represented by Formulae (A-1), (A-3), (A-4), (A-5), (A-6), (A-8), and (A-12), as a partial structure, even more preferably has at least one structure selected from the group consisting of structures represented by Formulae (A-1), (A-3), (A-5), (A-6), and (A-12), as a partial structure, particularly preferably has at least one structure selected from the group consisting of structures represented by Formulae (A-1) and (A-3), as a partial structure, and most preferably has at least one structure selected from the group consisting of structures represented by Formula (A-3), as a partial structure.

According to the respective aspects, the specific compound is preferably an aspect in which A in Formula (1) is a structure represented by each formula to an aspect in which A in Formula (1) is a structure represented by each formula, as a partial structure.

An example in which a structure represented by Formulae (A-1) to (A-12) is provided below, but the present invention is not limited thereto. In the following structural formulae, $R^{41}$ has the same meaning as $R^{41}$ in Formulae (A-1) to (A-12), preferable aspects thereof are also the same.

* represents a bonding site to another structure.

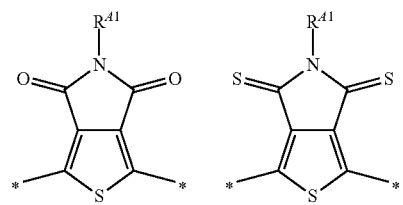

-continued
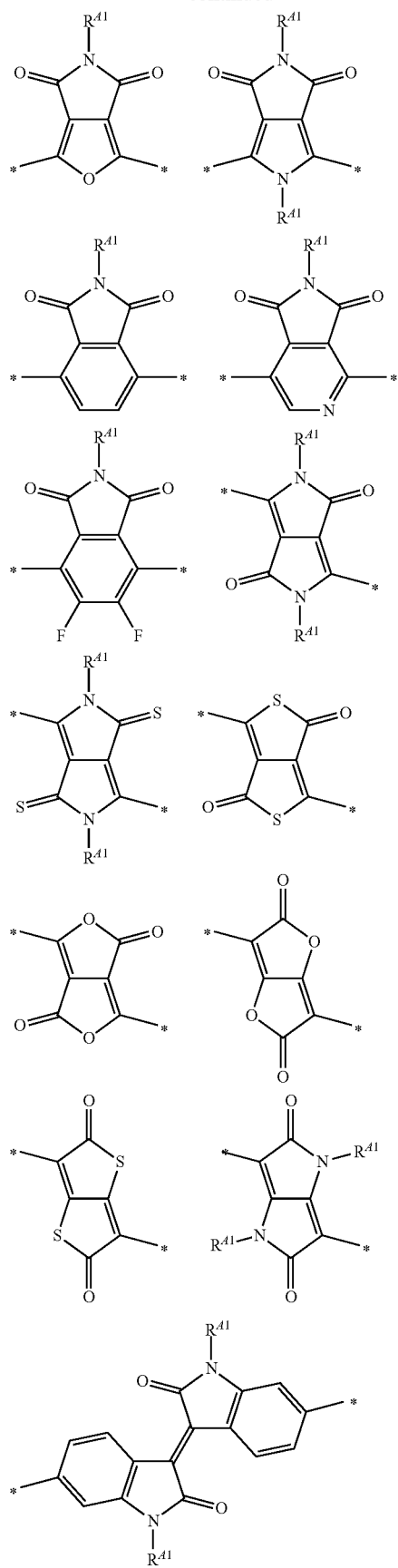
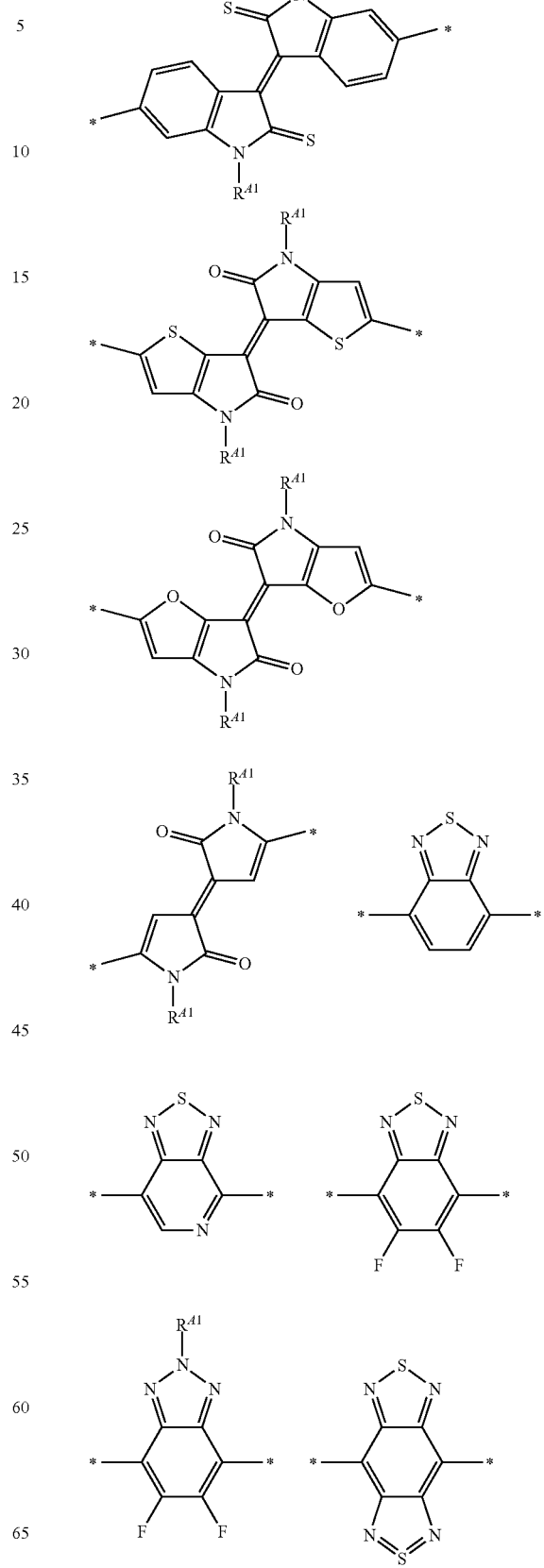

-continued

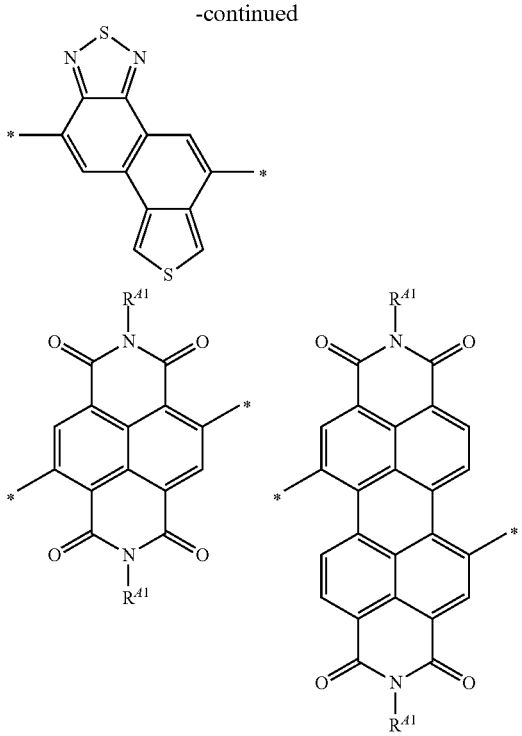

(Electron Donor Unit)

D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure.

The divalent aromatic heterocyclic group having at least one of a N atom, an O atom, a S atom, or a Se atom in a ring structure is preferably a divalent aromatic heterocyclic group having at least one S atom in a ring structure.

The divalent aromatic heterocyclic group may have a single ring or a fused ring structure having two or more rings, and preferably has a structure obtained by combining two or more divalent aromatic heterocyclic groups having single rings or a structure obtained by combining a divalent aromatic heterocyclic group having two or more single rings and a divalent aromatic heterocyclic group having one or more fused ring structures having two or more rings.

The divalent aromatic heterocyclic group may further have a substituent, and preferred examples of the substituents include an alkyl group that may include at least one of —O—, —S—, or —NR$^{D3}$— (for example, an alkyl group having 1 to 30 carbon atoms or an alkoxy group having 1 to 30 carbon atoms is preferable, and an alkyl group having 1 to 20 carbon atoms is more preferable), an alkenyl group (preferably having 2 to 30 carbon atoms), an alkynyl group (preferably having 2 to 30 carbon atoms), an aromatic hydrocarbon group (preferably having 6 to 30 carbon atoms), an aromatic heterocyclic group (preferably a 5-membered to 7-membered ring, and preferably an O atom, a N atom, a S atom, or a Se atom as a hetero atom), a halogen atom (a F atom, a Cl atom, a Br atom, or an I atom is preferable, a F atom or a Cl atom is more preferable, and a F atom is particularly preferable), and a monovalent group represented by Formula (1-1).

$R^{D3}$ has the same meaning as $R^{D3}$ in Formula (D-1), and preferable aspects thereof are also the same.

Examples of the divalent aromatic heterocyclic group are provided below, but the present invention is not limited thereto. In the structural formula, the hydrogen atom may be substituted with an alkyl group that may include at least one of —O—, —S—, or —NR$^{D3}$—, an alkenyl group, an alkynyl group, an aromatic hydrocarbon group, an aromatic heterocyclic group, a halogen atom, or a group represented by Formula (1-1), $R^{D1}$ has the same meaning as $R^{D1}$ in Formula (D-1) described below, the preferable aspect thereof is also the same, and * represents a bonding site to another structure. The alkyl group that may contain at least one of —O—, —S—, or —NR$^{D3}$— is preferably an alkyl group having 1 to 30 carbon atoms, and more preferably an alkyl group having 1 to 20 carbon atoms. $R^{D3}$ has the same meaning as $R^{D3}$ in Formula (D-1), and preferable aspects thereof are also the same.

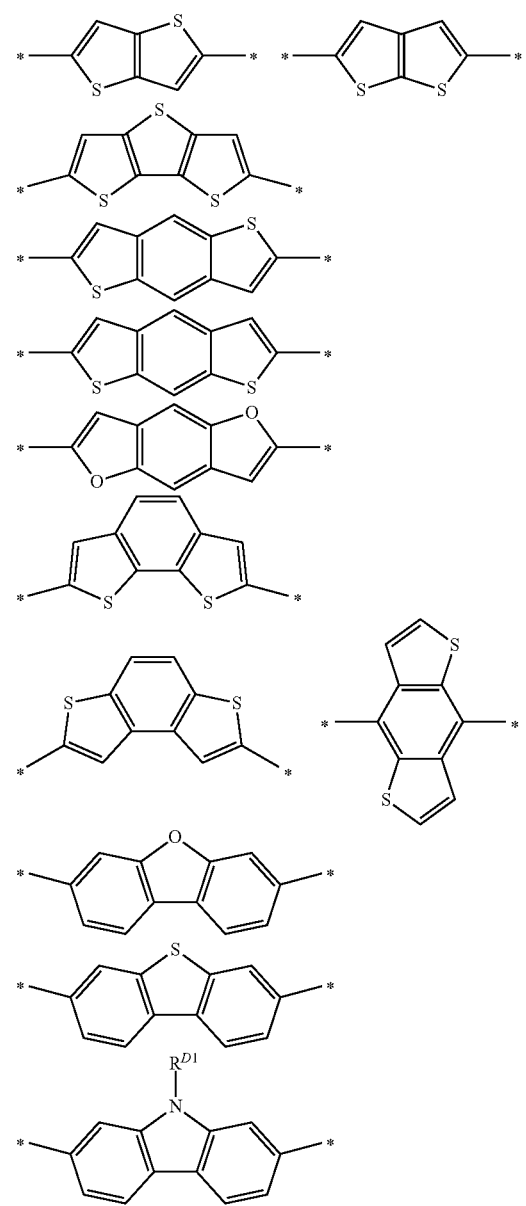

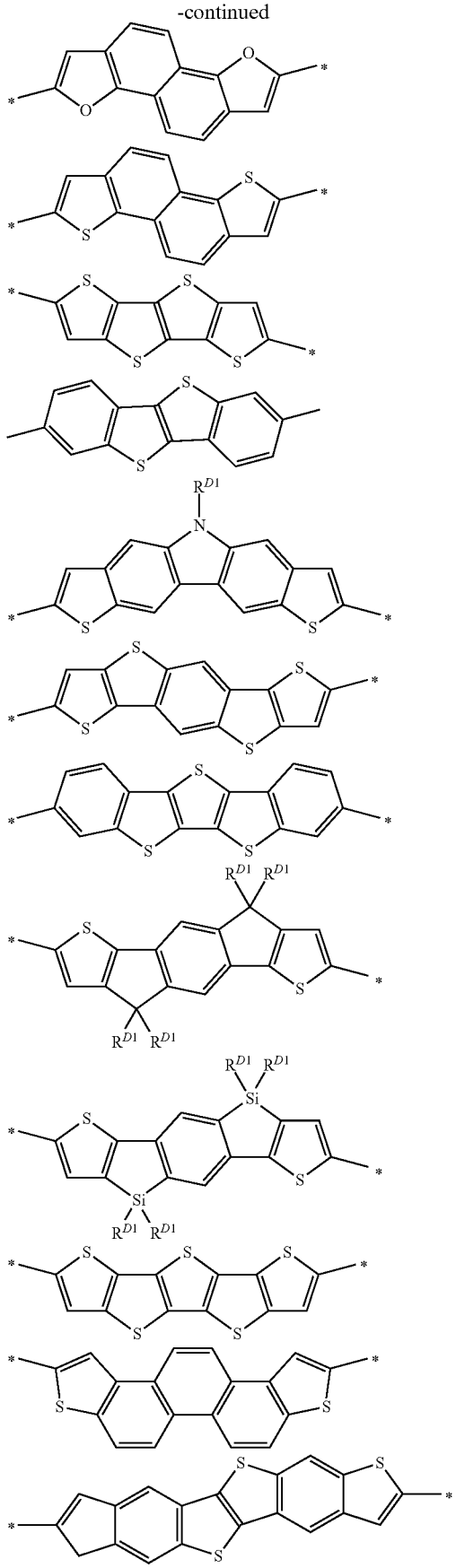

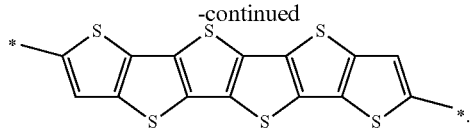

The aromatic hydrocarbon group consisting of a fused ring structure having two or more rings is preferably an aromatic hydrocarbon group having 10 to 20 carbon atoms, more preferably a fluorene group, a naphthylene group, or a group obtained by removing two hydrogen atoms from the aromatic hydrocarbon in which three or four rings are fused, and even more preferably a fluorene group, a naphthylene group, or a group obtained by removing two hydrogen atoms from an anthracene ring, a phenanthrene ring, a chrysene ring, or a pyrene ring.

The aromatic hydrocarbon group may further have a substituent, and preferable examples of the substituent include an alkyl group that may contain at least one of —O—, —S—, or —NR$^{D3}$—, a halogen atom, or a monovalent group represented by Formula (1-1). Preferable examples of the alkyl group that may contain at least one of —O—, —S—, or —NR$^{D3}$— and the halogen atom are the same as those described for the divalent aromatic heterocyclic group. R$^{D3}$ has the same meaning as R$^{D3}$ in Formula (D-1), and preferable aspects thereof are also the same.

In Formula (1), D is preferably a structure represented by Formula (D-1).

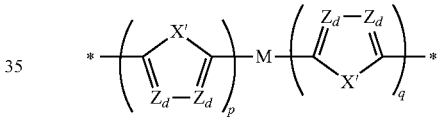

(D-1)

In Formula (D-1), X"s each independently represent an O atom, an S atom, a Se atom, or NR$^{D1}$, Z$_d$'s each independently represent an N atom or CR$^{D2}$, R$^{D1}$'s each independently represent a monovalent organic group that may be a monovalent group represented by Formula (1-1), R$^{D2}$'s each independently represent a hydrogen atom or a monovalent organic group that may be a monovalent group represented by Formula (1-1), M represents a single bond, a divalent aromatic heterocyclic group, a divalent aromatic hydrocarbon group, an alkenylene group, an alkynylene group, or a divalent group obtained by combining these, p and q each independently represent an integer of 0 to 4, and *'s each independently represent a bonding site to another structure. M may have an alkyl group that may contain at least one of —O—, —S—, or —NR$^{D3}$— or a monovalent group represented by Formula (1-1), as a substituent. R$^{D3}$'s each independently represent a hydrogen atom or a substituent.

In Formula (D-1), each repeating unit and M described above are bonded to each other at the bonding axis in a rotatable manner.

In Formula (D-1), X"s each independently represent an O atom, a S atom, a Se atom, or NR$^{D1}$, preferably an O atom or a S atom, and more preferably a S atom.

Z$_d$'s each independently represent a N atom or CR$^{D2}$ and more preferably represent CR$^{D2}$.

R$^{D1}$'s each independently represent a monovalent organic group, and the substituent is preferably an alkyl group that may include at least one of —O—, —S—, or —NR$^{D3}$— (for example, an alkyl group having 1 to 30 carbon atoms or an alkoxy group having 1 to 30 carbon atoms is preferable, and an alkyl group having 1 to 20 carbon atoms is more preferable), an alkynyl group (preferably having 2 to 30 carbon atoms), an alkenyl group (preferably having 2 to 30 carbon atoms), an aromatic hydrocarbon group (preferably having 6 to 30 carbon atoms), an aromatic heterocyclic group (preferably a 5-membered to 7-membered ring, an O atom, N atom, S atom, or Se atom is preferable as the hetero atom), a halogen atom (preferably an F atom, a Cl atom, a Br atom or an I atom, more preferably an F atom or a Cl atom, and particularly preferably an F atom), or a monovalent group represented by Formula (1-1), and more preferably an alkyl group, a halogen atom, or a monovalent group represented by Formula (1-1).

$R^{D2}$'s each independently represent a hydrogen atom or a monovalent organic group, preferably represent a hydrogen atom, an alkyl group which may contain at least one of —O—, —S—, or —$NR^{D3}$— (for example, an alkyl group having 1 to 30 carbon atoms or an alkoxy group having 1 to 30 carbon atoms is preferable, and an alkyl group having 1 to 20 carbon atoms is more preferable), an alkynyl group (preferably having 2 to 30 carbon atoms), an alkenyl group (preferably having 2 to 30 carbon atoms), an aromatic hydrocarbon group (preferably having 6 to 30 carbon atoms), an aromatic heterocyclic group (preferably 5- to 7-membered ring, O atom, N atom, S atom, Se atom is preferable as the hetero atom), a halogen atom (preferably a F atom, a Cl atom, a Br atom, an I atom, more preferably a F atom or a Cl atom, and particularly preferably a F atom), and a monovalent group represented by Formula (1-1), more preferably represents a hydrogen atom, an alkyl group, a halogen atom, and a monovalent group represented by Formula (1-1).

M represents a single bond, a divalent aromatic heterocyclic group, a divalent aromatic hydrocarbon group, an alkenylene group, an alkynylene group, or a divalent group obtained by combining these. M may have an alkyl group that may contain at least one of —O—, —S—, or —$NR^{D3}$— or a monovalent group represented by Formula (1-1), as a substituent.

The divalent aromatic heterocyclic group in M may have a single ring or may have a fused ring structure having two or more rings. Examples of the divalent aromatic heterocyclic group preferably used in the present invention are the same as those of the above divalent aromatic heterocyclic group having a fused ring structure having two or more rings.

The divalent aromatic hydrocarbon group in M is preferably an aromatic hydrocarbon group having 6 to 20 carbon atoms, more preferably a phenylene group, a biphenylene group, a fluorene group, a naphthylene group, or a group obtained by removing two hydrogen atoms from aromatic hydrocarbon in which three or four rings are fused, and even more preferably a fluorene group, a naphthylene group, an anthracene ring, a phenanthrene ring, a chrysene ring, or a group obtained by removing two or more hydrogen atoms from a pyrene ring.

The divalent aromatic heterocyclic group or the divalent aromatic hydrocarbon group in M may further have a substituent, and preferable examples of the substituents include an alkyl group that may include at least one of —O—, —S—, or —$NR^{D3}$— (for example, an alkyl group having 1 to 30 carbon atoms or an alkoxy group having 1 to 30 carbon atoms is preferable, and an alkyl group having 1 to 20 carbon atoms is more preferable), a halogen atom (preferably a F atom, a Cl atom, a Br atom, and an I atom, more preferably a F atom or a Cl atom, and particularly preferably a F atom), and a monovalent group represented by Formula (1-1).

An alkenylene group in M is preferably an alkenylene group having 2 to 10 carbon atoms, more preferably an alkenylene group having 2 to 4 carbon atoms, and even more preferably an ethenylene group.

An alkynylene group in M is preferably an alkynylene group having 2 to 10 carbon atoms, more preferably an alkynylene group having 2 to 4 carbon atoms, and even more preferably an ethynylene group.

$R^{D3}$'s each independently represent a hydrogen atom or a substituent. The substituent in $R^{D3}$ has the same meaning as the substituent in $R^1$ to $R^4$ described below.

p and q each independently represent an integer of 0 to 4, preferably an integer of 1 to 3, and more preferably an integer of 1 to 2. It is preferable that p and q have the same value. It is preferable that p+q is 2 to 4.

Examples of the structure represented by D are provided below, but the present invention is not limited to the following examples. In the structural formula, the hydrogen atom may be substituted with an alkyl group that may include at least one of —O—, —S—, or —$NR^{D3}$— or the group represented by Formula (1-1), $R^{D1}$ has the same meaning as $R^{D1}$ in Formula (D-1) described above, the preferable aspect thereof is also the same, and * represents a bonding site to another structure. The alkyl group that may contain at least one of —O—, —S—, or —$NR^{D3}$—, is preferably an alkyl group having 1 to 30 carbon atoms or an alkoxy group having 1 to 30 carbon atoms and more preferably an alkyl group having 8 to 30 carbon atoms. $R^{D3}$ has the same meaning as $R^{D3}$ in Formula (D-1), and preferable aspects thereof are also the same.

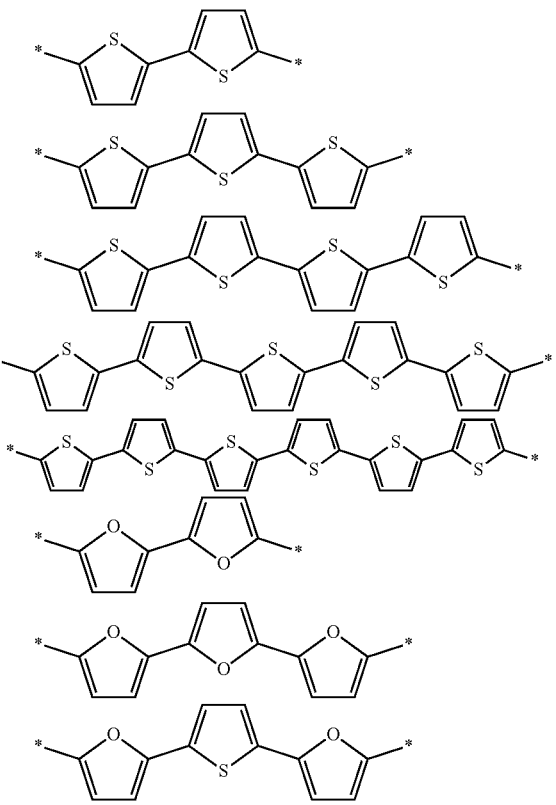

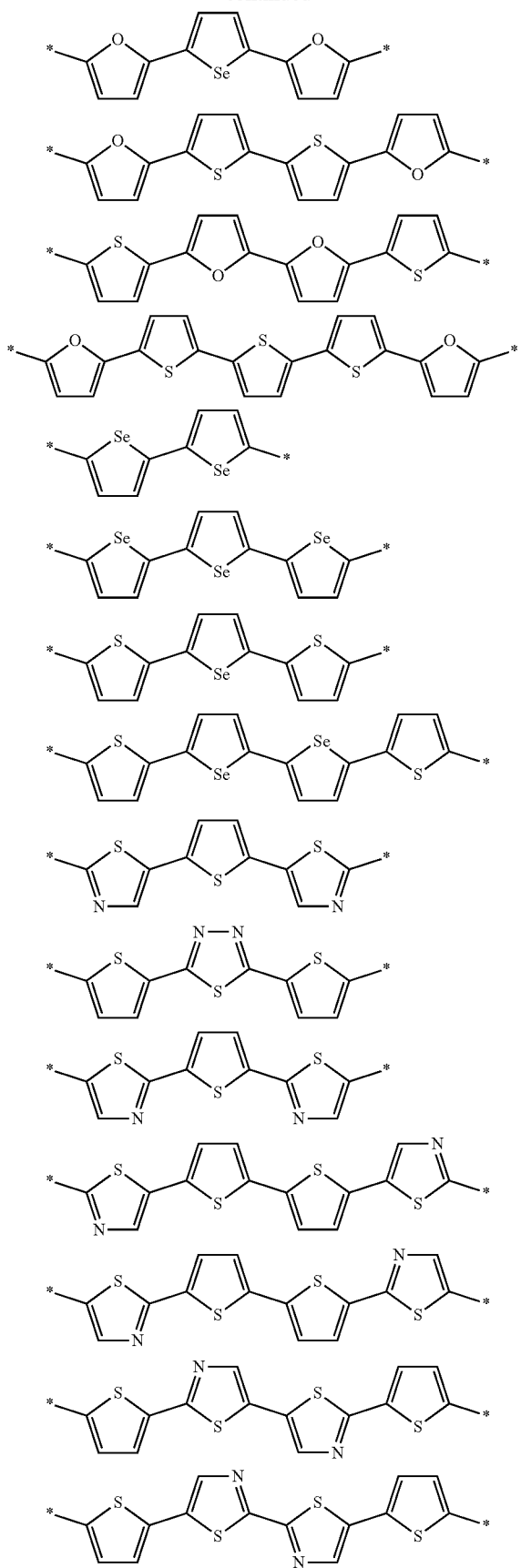
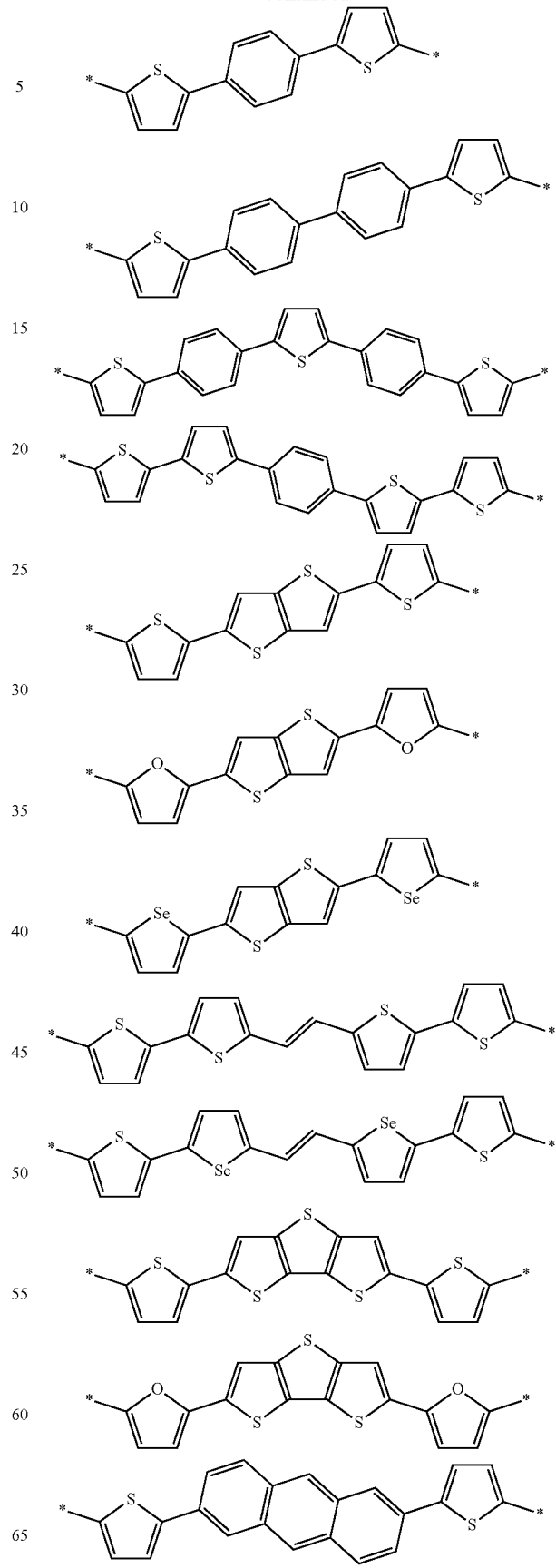

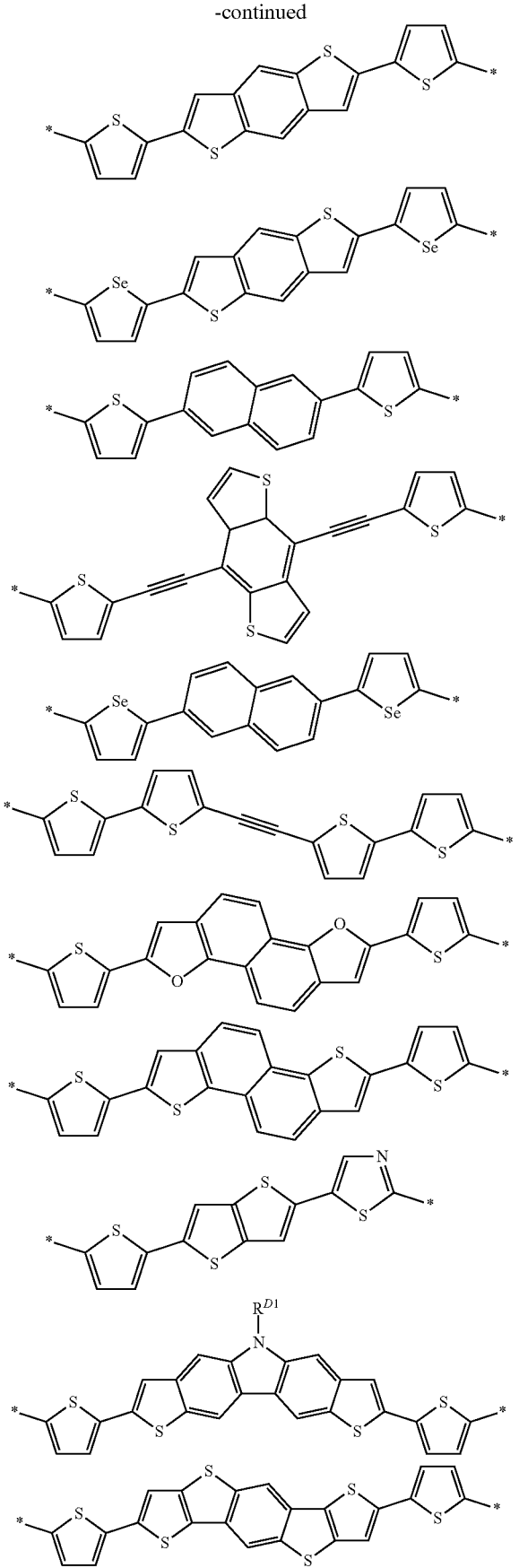
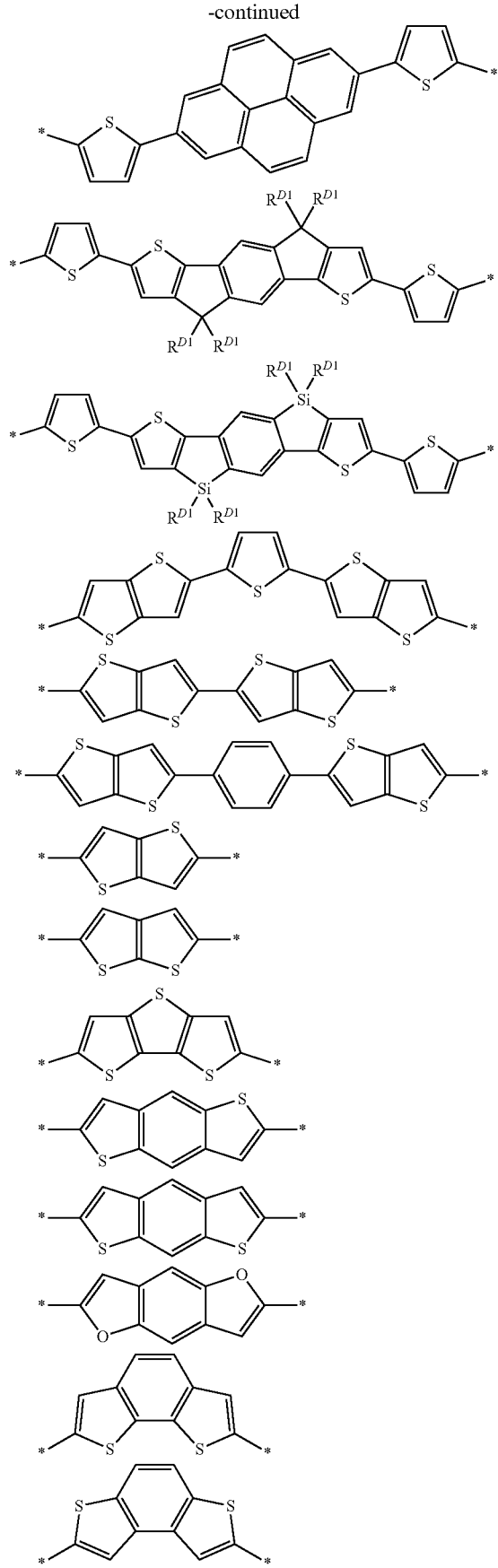

-continued
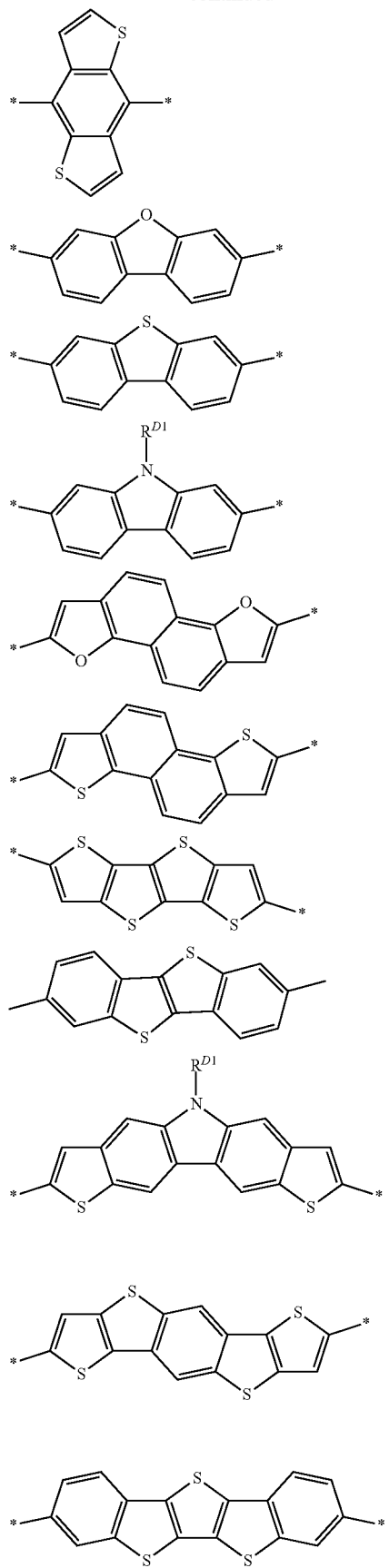
-continued
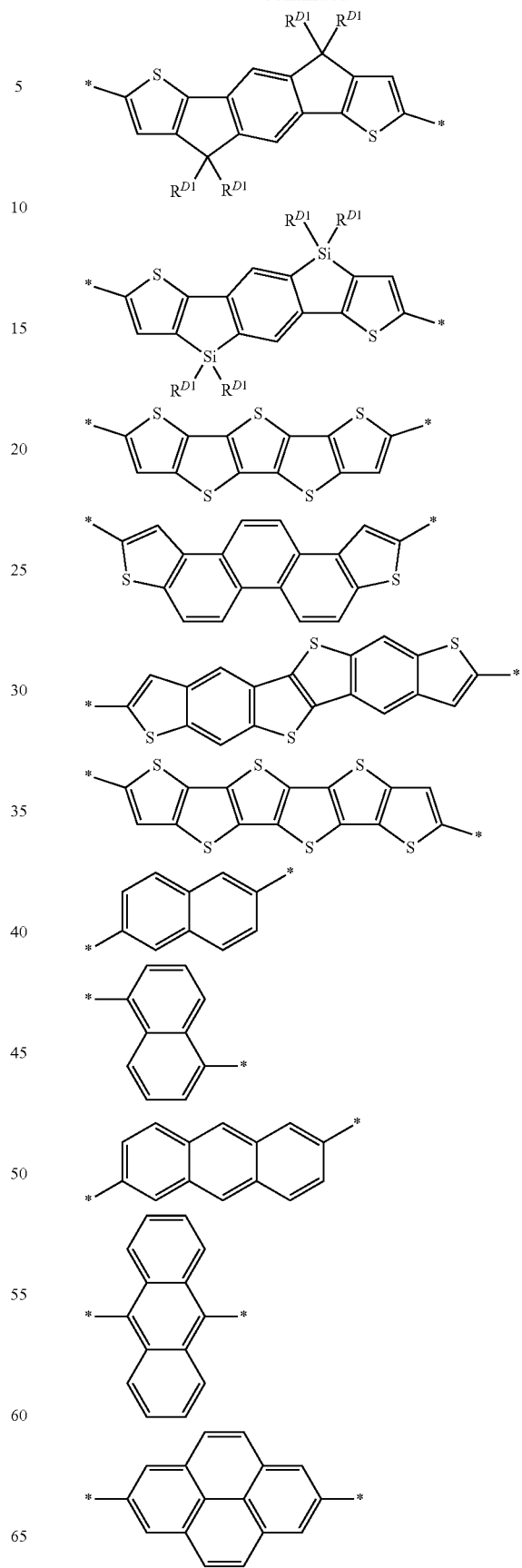

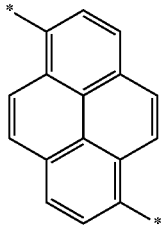

(Monovalent Group Represented by Formula (1-1))

In Formula (1), at least one of D or A has at least one monovalent group represented by Formula (1-1).

The number of monovalent groups represented by Formula (1-1) in the repeating unit represented by Formula (1) is preferably 1 or greater, more preferably 2 or greater, and even more preferably 2 to 4.

Particularly, in a case where the number of monovalent groups represented by Formula (1-1) is 2 or greater, the carrier mobility becomes excellent. That is, the symmetry of the molecule in the repeating unit represented by Formula (1) is improved and is advantageous for intermolecular packing. Since the solubility of the compound is increased by increasing the number of substituents having excellent solubility to an organic solvent, the film quality of the organic semiconductor film becomes excellent. For these reasons, it is assumed that carrier mobility becomes excellent.

In Formula (1-1), Ar represents an aromatic heterocyclic group or an aromatic hydrocarbon group having 5 to 18 carbon atoms.

Examples of the aromatic hydrocarbon group having 5 to 18 carbon atoms in Ar include a benzene ring group, a biphenyl group, a naphthalene ring group, and a group obtained by removing two or more hydrogen atoms from aromatic hydrocarbon (for example, a fluorene ring) in which three rings are fused. Among these, since the carrier mobility becomes excellent, a benzene ring group, a biphenyl group, or a naphthalene ring group is preferable, and a benzene ring group is more preferable.

The aromatic heterocyclic group in Ar may be a single ring or may have a fused ring structure of two or more rings. However, since the carrier mobility becomes excellent, the aromatic heterocyclic group is preferably a single ring. The aromatic heterocyclic group in Ar is preferably a 5-membered to 7-membered ring. The hetero atom included in the aromatic heterocyclic group is preferably a N atom, an O atom, a S atom, or a Se atom and more preferably a S atom.

$C_a$ represents $CR^1R^2$.

$L_a$ represents an alkylene group having 1 to 20 carbon atoms that may contain at least one of —O—, —S—, or —NR$^3$—. Here, the expression that the alkylene group includes —O— means the case where —O— is introduced in the middle of the carbon-carbon bond of the alkylene group or the case where —O— is introduced at one terminal or both terminals of the alkylene group. The same meaning also applies in a case where the alkylene group includes —S— or —NR$^3$—.

An alkylene group that is represented by $L_a$ may have any one of a linear shape, a branched shape, and a cyclic shape, but is preferably a linear or branched alkylene group and more preferably a linear alkylene group.

The number of carbon atoms in the alkylene group represented by $L_a$ is 1 to 20. However, since the carrier mobility becomes excellent, but the number of carbon atoms is preferably 1 to 15 and more preferably 1 to 10.

In the case where the alkylene group represented by $L_a$ has a branched shape, the number of carbon atoms in the branched portion is included in the number of carbon atoms of the alkylene group represented by $L_a$. However, in a case where $L_a$ contains —NR$^3$— and this R$^3$ includes a carbon atom, the number of carbon atoms in R$^3$ is not included in the number of carbon atoms in the alkylene group represented by $L_a$.

$L_b$ represents an alkyl group having 9 or more carbon atoms that may contain at least one of —O—, —S—, or —NR$^4$—. Here, the expression that the alkyl group includes —O— means the case where —O— is introduced in the middle of the carbon-carbon bond of the alkyl group or the case where —O— is introduced to one terminal (that is, a portion connected to "Ar" above) of the alkyl group. The same meaning also applies in a case where the alkyl group includes —S— or —NR$^4$—.

An alkyl group that is represented by $L_b$ may have any one of a linear shape, a branched shape, and a cyclic shape. However, since carrier mobility and temporal stability under high temperature and high humidity become excellent, a linear or branched alkyl group is preferable, and a branched alkyl group is more preferable. The alkyl group represented by $L_b$ may be a halogenated alkyl group having a halogen atom (preferably a F atom, a Cl atom, a Br atom, and an I atom, and more preferably a F atom) as a substituent.

The number of carbon atoms in the alkyl group represented by $L_b$ is 9 or greater and preferably 9 to 100. In a case where the number of carbon atoms in the alkyl group represented by $L_b$ is less than 9, the carrier mobility and temporal stability under high temperature and high humidity are insufficient.

Since carrier mobility and temporal stability under high temperature and high humidity become excellent, the number of carbon atoms of at least one $L_b$ in -($L_b$)$_l$ in Formula (1-1) is preferably 20 to 100 and more preferably 20 to 40.

In the case where the alkyl group represented by $L_b$ has a branched shape, the number of carbon atoms in the branched portion is included in the number of carbon atoms of the alkyl group represented by $L_b$. However, in a case where $L_b$ contains —NR$^4$— and this R$^4$ includes a carbon atom, the number of carbon atoms in R$^4$ is not included in the number of carbon atoms in the alkylene group represented by $L_b$.

$R^1$ to $R^4$ each independently represent a hydrogen atom or a substituent. The substituent represents an alkyl group (preferably a linear or branched alkyl group having 1 to 10 carbon atoms), a halogen atom (preferably a F atom, a Cl atom, a Br atom, or an I atom) or an aryl group (preferably an aryl group having 6 to 20 carbon atoms). Among these, $R^1$ to $R^4$ each independently and preferably represent a hydrogen atom or an alkyl group, $R^1$ and $R^2$ are more preferably a hydrogen atom, and $R^3$ and $R^4$ are more preferably an alkyl group.

l represents an integer of 1 to 5 and is preferably 1 or 2. In a case where l is 2 or greater, a plurality of $L_b$'s may be identical to as or different from each other.

* represents a bonding site to another structure.

At least one of A or D in Formula (1) has a monovalent group represented by Formula (1-1), but A in Formula (1) preferably has a monovalent group represented by Formula (1-1). As a result, the carrier mobility becomes excellent.

In the same point of view, in a case where A in Formula (1) is any one of Formulae (A-1) to (A-12), Formulae (A-1) to (A-12) each have at least one of R$^{A1}$ or R$^{A2}$, and at least one of R$^{A1}$ or R$^{A2}$ in each formula is preferably a monovalent group represented by Formula (1-1).

(Repeating Unit Represented by Formulae (2) to (5))

The repeating unit represented by Formula (1) is preferably a repeating unit represented by any one of Formulae (2) to (5), more preferably a repeating unit represented by Formula (2) or (3), and even more preferably a repeating unit represented by Formula (3).

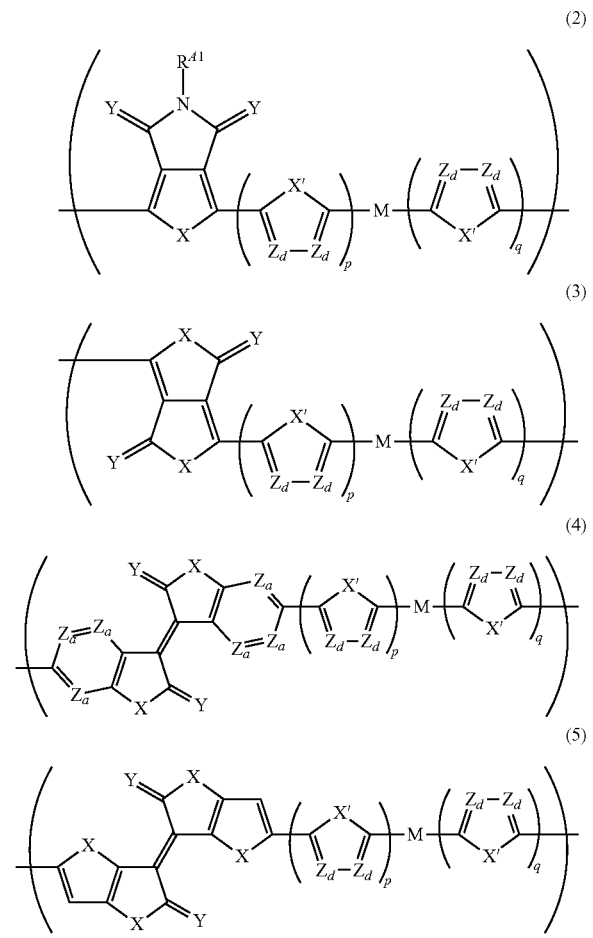

In Formulae (2) to (5), X's each independently represent an O atom, an S atom, a Se atom, or $NR^{41}$, Y's each independently represent an O atom or an S atom, $Z_a$'s each independently represent $CR^{42}$ or a N atom, $R^{41}$'s each independently represent an alkyl group that may contain at least one of —O—, —S—, or —$NR^{43}$—, a monovalent group represented by Formula (1-1), or a bonding site to another structure, $R^{42}$'s each independently represent a hydrogen atom, a halogen atom, an alkyl group that may contain at least one of —O—, —S—, or —$NR^{43}$—, a monovalent group represented by Formula (1-1), or a bonding site to another structure, X"s each independently represent an O atom, an S atom, a Se atom, or $NR^{D1}$, $Z_d$'s each independently represent an N atom or $CR^{D2}$, $R^{D1}$'s each independently represent a monovalent organic group that may be a monovalent group represented by Formula (1-1), $R^{D2}$'s each independently represent a hydrogen atom or a monovalent organic group that may be a monovalent group represented by Formula (1-1), M represents a single bond, a divalent aromatic heterocyclic group, a divalent aromatic hydrocarbon group, an alkenylene group, an alkynylene group, or a divalent group obtained by combining these, and p and q each independently represent an integer of 0 to 4. M may have an alkyl group that may contain at least one of —O—, —S—, or —$NR^{D3}$— or a monovalent group represented by Formula (1-1), as a substituent. $R^{43}$'s each independently represent a hydrogen atom or a substituent. $R^{D3}$'s each independently represent a hydrogen atom or a substituent.

In Formulae (2) to (5), X, Y, $Z_a$, $R^{41}$, $R^{42}$, and $R^{43}$ have the same meaning as X, Y, $Z_a$, $R^{41}$, $R^{42}$, and $R^{43}$ in Formulae (A-1) to (A-12), respectively, and preferable aspects thereof are also the same.

In Formulae (2) to (5), X', $Z_d$, $R^{D1}$, $R^{D2}$, $R^{D3}$, M, p, and q have the same meaning as X', $Z_d$, $R^{D1}$, $R^{D2}$, $R^{D3}$, M, p, and q in Formula (D-1), respectively, and preferable aspects thereof are also the same.

In preferable aspects of (2) to (5), Formulae (2) to (5) each have at least one of $R^{41}$ or $R^{42}$, and at least one of $R^{41}$ or $R^{42}$ in each formula is a monovalent group represented by Formula (1-1). This is because the structural twist in each formula decreases and the carrier mobility becomes excellent.

(Preferable Aspects of Specific Compound)

In the specific compound, the content of the repeating unit represented by Formula (1) is preferably 60 to 100 mass %, more preferably 80 to 100 mass %, and even more preferably 90 to 100 mass % with respect to the total mass of the specific compound. It is particularly preferable that the repeating unit is substantially formed only with the repeating unit represented by Formula (1). The expression "the repeating unit is substantially formed only with the repeating unit represented by Formula (1)" means that the content of the repeating unit represented by Formula (1) is 95 mass % or greater, preferably 97 mass % or greater, and more preferably 99 mass % or greater.

In a case where the content of the repeating unit represented by Formula (1) is in the range above, an organic semiconductor having excellent carrier mobility can be obtained.

The specific compound may include a repeating unit represented by Formula (1) singly or two or more kinds thereof may be included.

The specific compound is a compound having two or more repeating units represented by Formula (1) and may be an oligomer in which the number "n" of repeating units is 2 to 9 or may be a polymer in which the number "n" of repeating units is 10 or greater. Among these, a polymer in which the number "n" of repeating units is 10 or greater is preferable, in view of carrier mobility and obtainable physical properties of the organic semiconductor film.

In view of carrier mobility, the molecular weight of the compound having a repeating unit represented by Formula (1) is 2,000 or greater, preferably 5,000 or greater, more preferably 10,000 or greater, even more preferably 20,000 or greater, and particularly preferably 30,000 or greater. In view of solubility, the molecular weight is preferably 1,000,000 or less, more preferably 300,000 or less, even more preferably 150,000 or less, and particularly preferably 100,000 or less.

According to the present invention, in a case where the compound has a molecular weight distribution, the molecular weight of this compound means a weight-average molecular weight.

According to the present invention, the weight-average molecular weight and the number-average molecular weight can be measured by gel permeation chromatography (GPC) method, and can be obtained in terms of standard polystyrene. Specifically, for example, in GPC, HLC-8121 GPC (manufactured by Tosoh Corporation) is used, two columns of TSKgel GMH$_{HR}$-H (20) HT (manufactured by Tosoh Corporation, 7.8 mm ID×30 cm) are used as the column, 1,2,4-trichlorobenzene is used as an eluent. An infrared (IR) detector is used with conditions of a sample concentration of 0.02 mass %, a flow rate of 1.0 ml/min, a sample injection amount of 300 μl, and a measurement temperature of 160° C. The calibration curve is manufactured from 12 samples of "standard sample TSK standard, polystyrene": "F-128", "F-80", "F-40", "F-20", "F-10", "F-4", "F-2", "F-1", "A-5000", "A-2500", "A-1000", and "A-500" manufactured by Tosoh Corporation.

Although only one kind of specific compound may be contained or two or more kinds of specific compounds may be contained in an organic semiconductor layer described below, an organic semiconductor film described below, or an organic semiconductor composition described below.

The structure of the terminal of the specific compound is not particularly limited, and depends on the existence of other constitutional units, kinds of base substances used in the synthesis, and kinds of a quench agent (reaction terminator) used in the synthesis. Here, examples thereof include a hydrogen atom, a hydroxy group, a halogen atom, an ethylenically unsaturated group, an alkyl group, an aromatic heterocyclic group (preferably a thiophene ring), and an aromatic hydrocarbon group (preferably a benzene ring).

A method of synthesizing a specific compound is not particularly limited, and may be synthesized with reference to well-known methods. For example, with reference to JP2010-527327A, JP2007-516315A, JP2014-515043A, JP2014-507488A, JP2011-501451A, JP2010-18790A, WO2012/174561A, JP2011-514399A, and JP2011-514913A, synthesis may be performed by synthesizing a precursor of an electron acceptor unit and a precursor of an electron donor unit and performing cross-coupling reactions such as Suzuki coupling and Stille coupling of each precursor.

Hereinafter, preferable specific examples of the preferable repeating unit represented by Formula (1) are provided, but the present invention is not limited to the examples below.

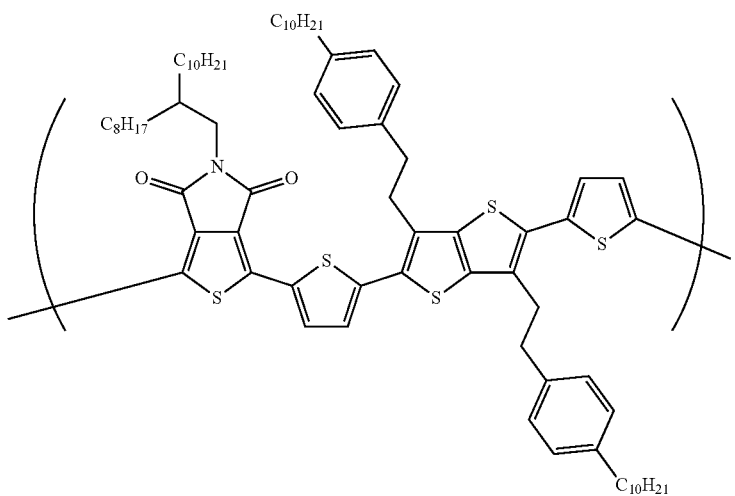

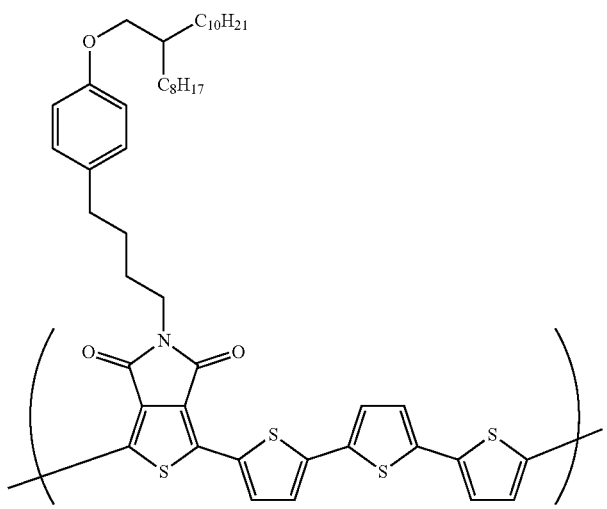

-continued
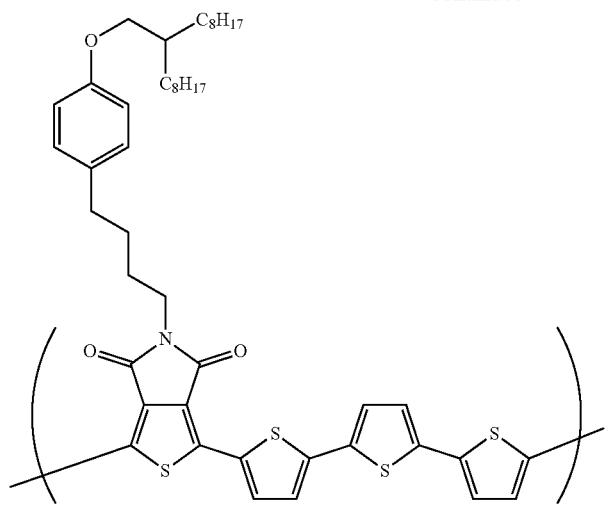
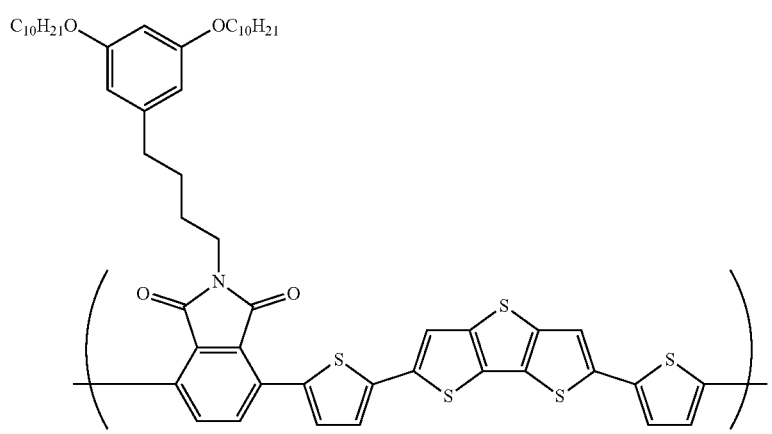
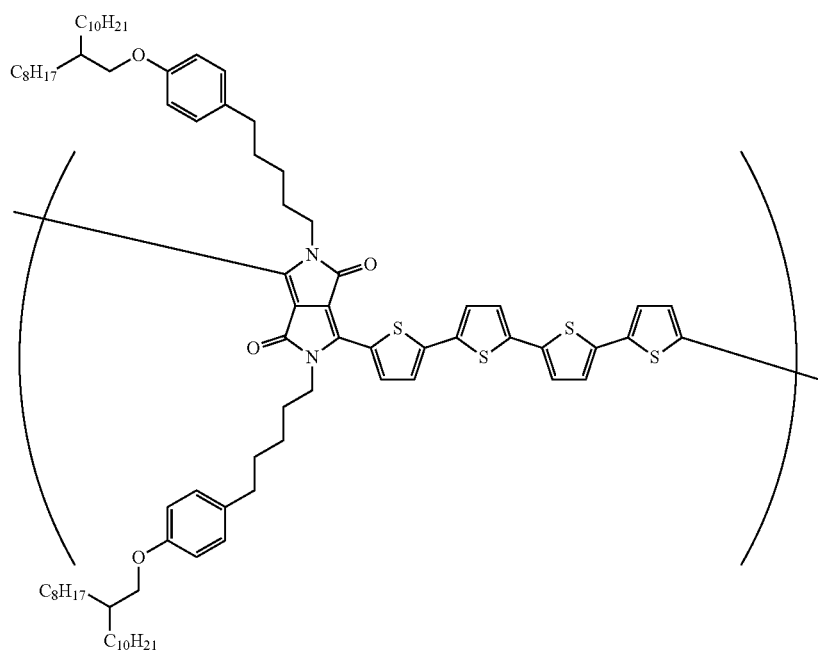

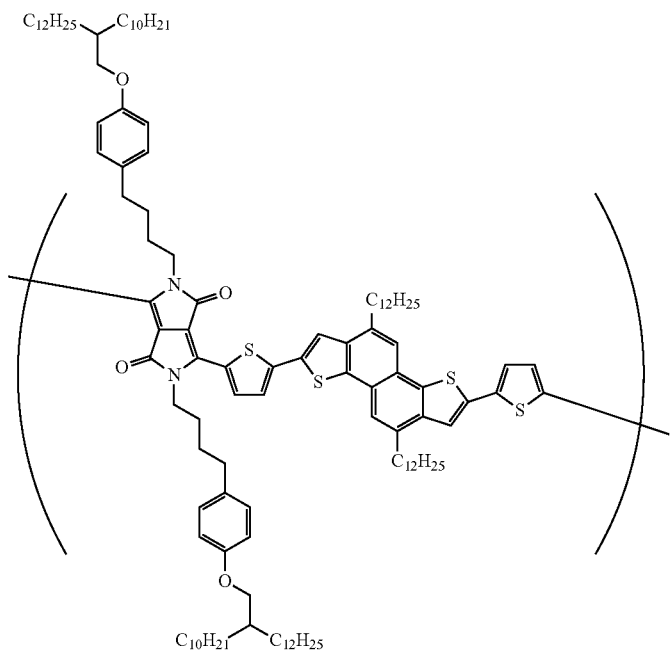
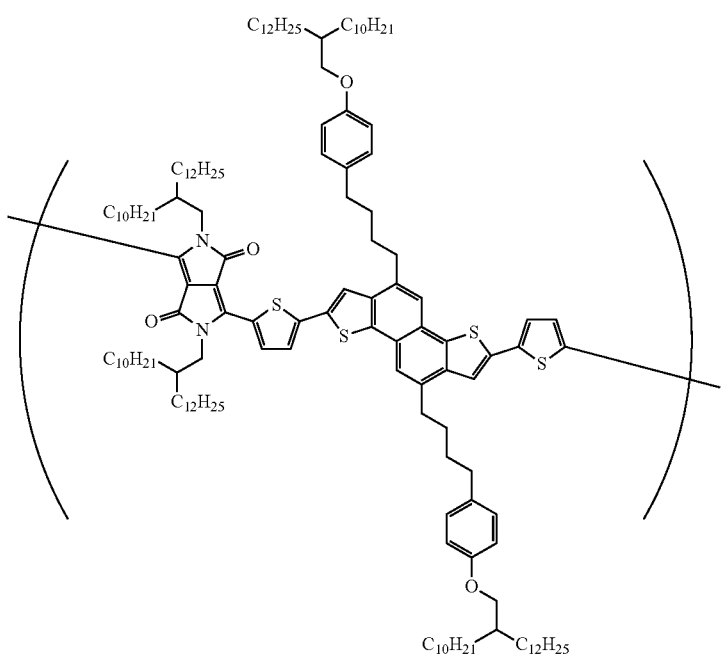

-continued
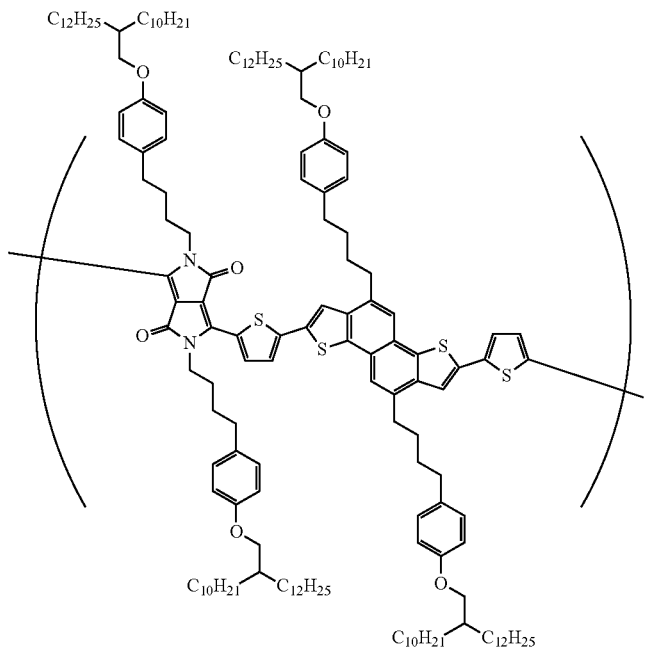
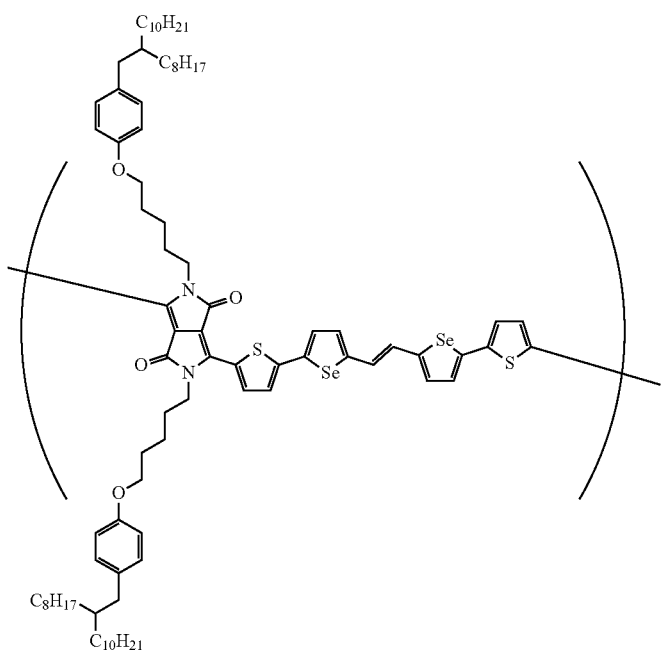

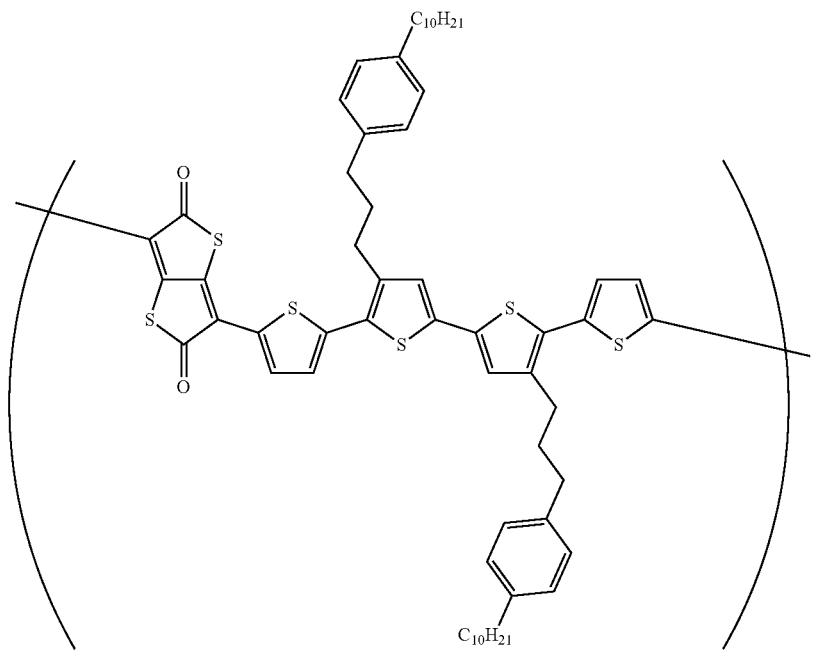
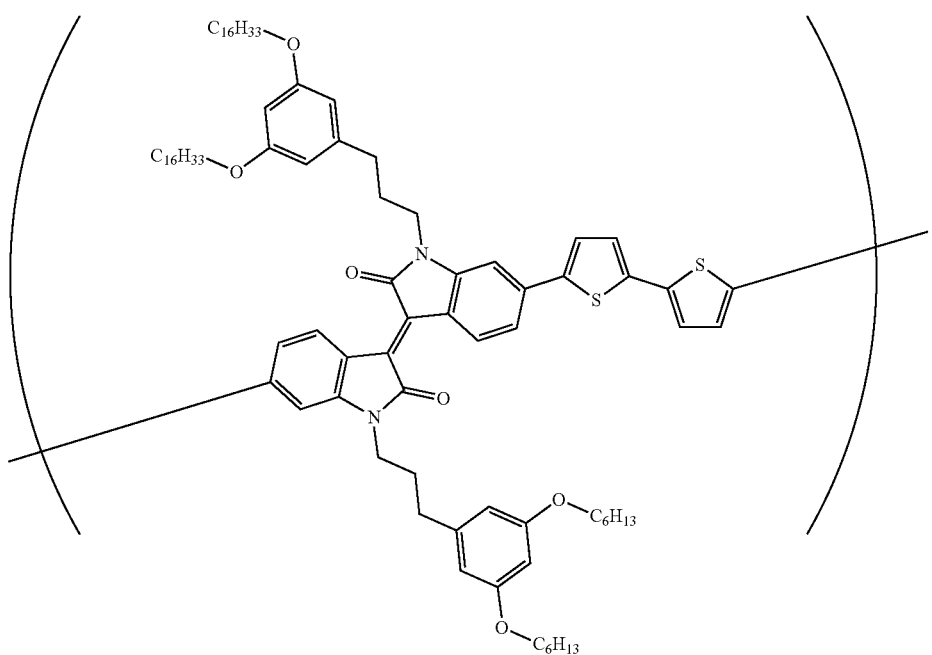

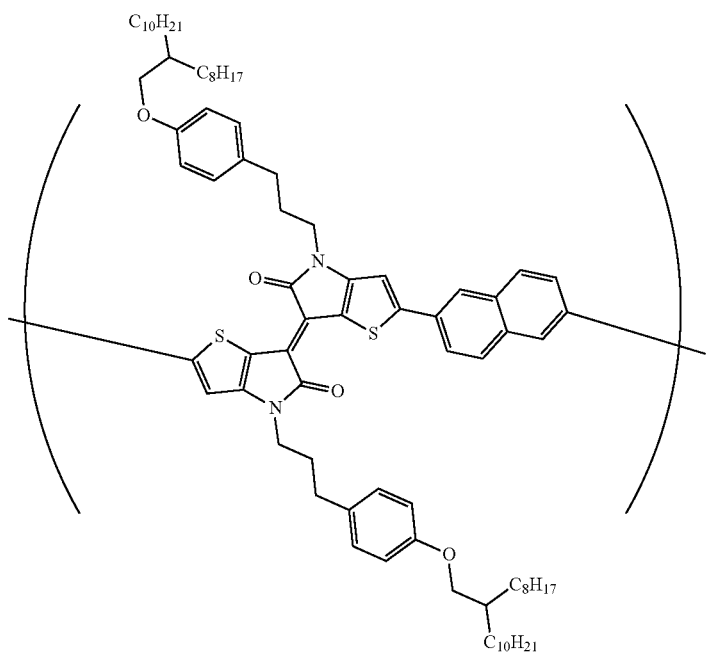
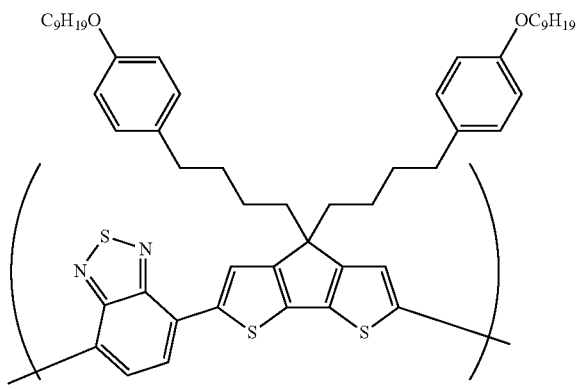
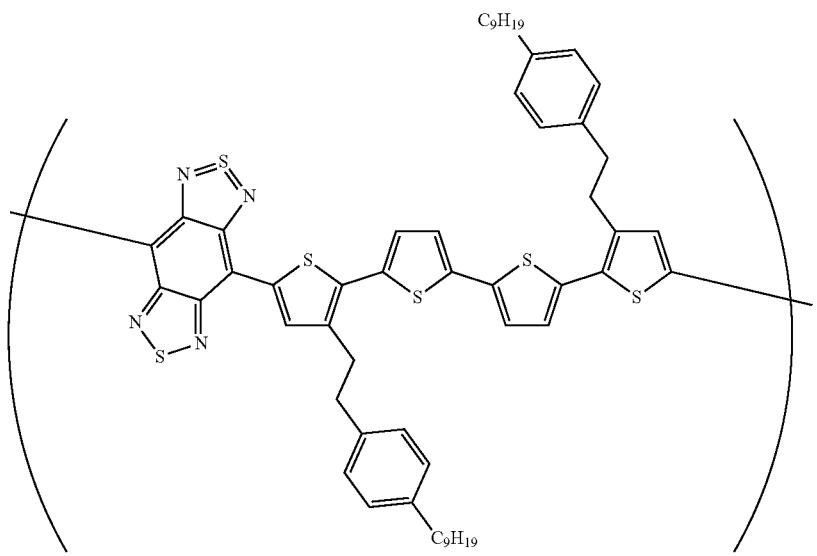

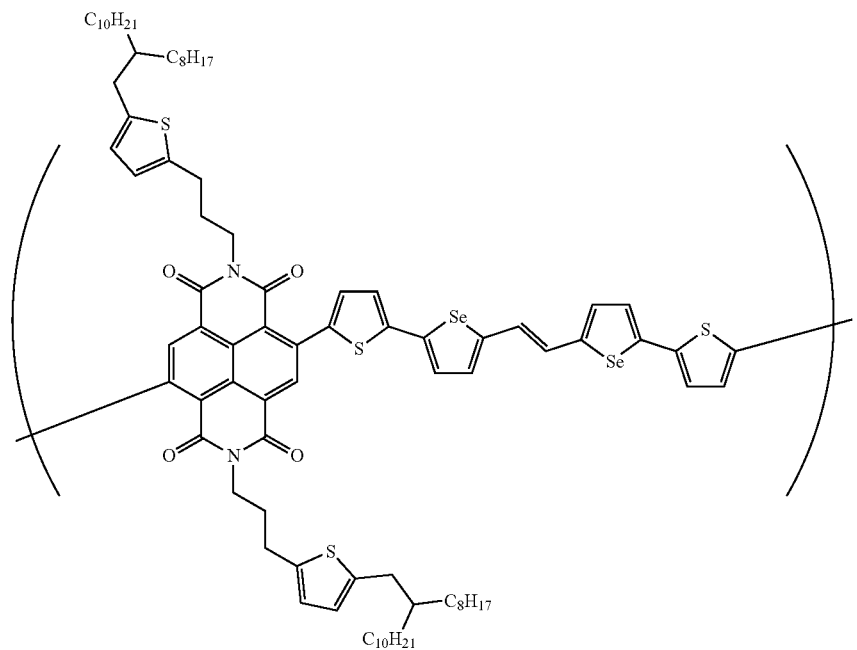
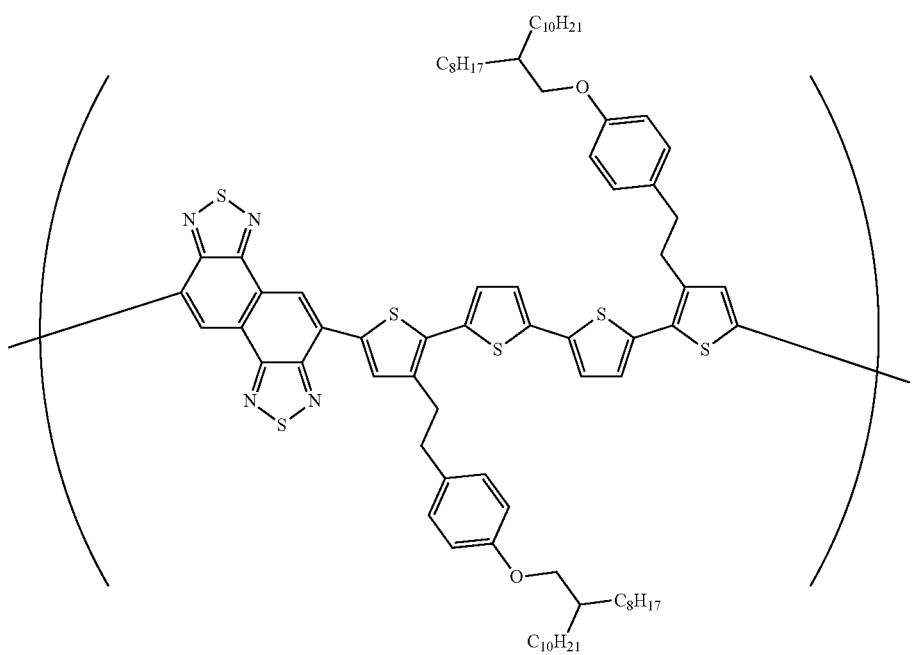

-continued
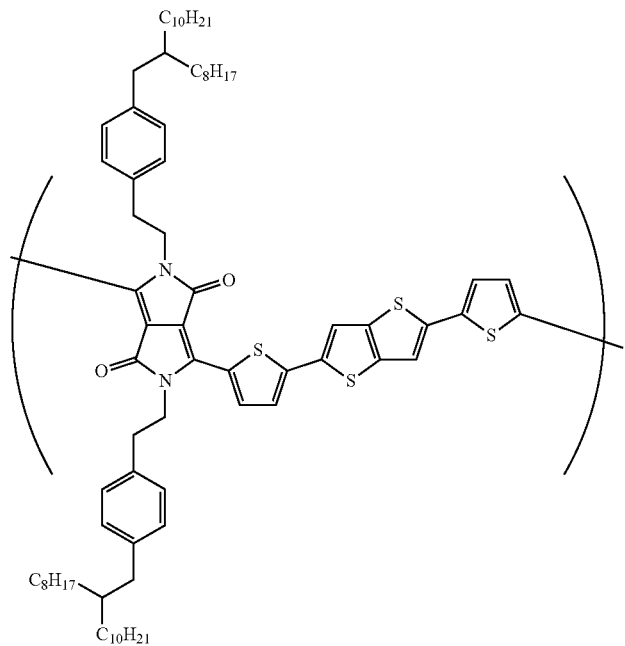
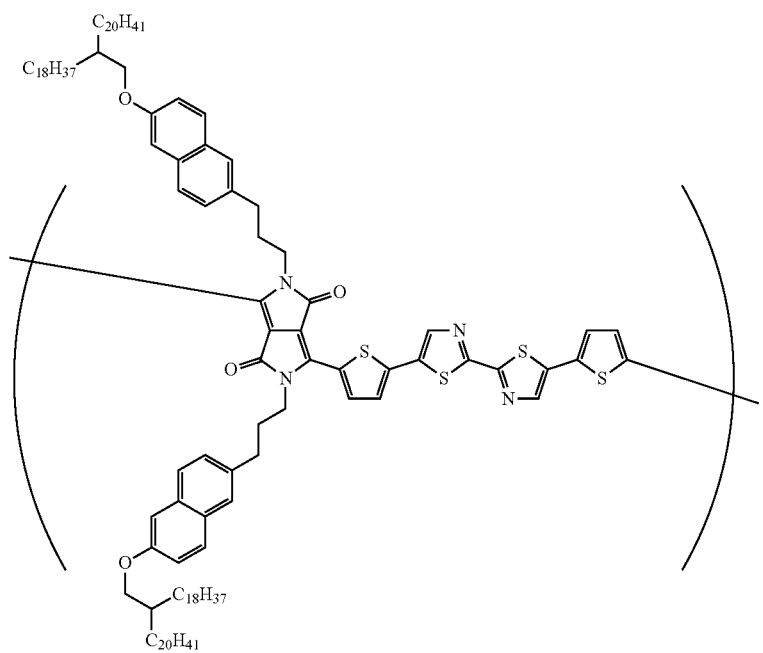

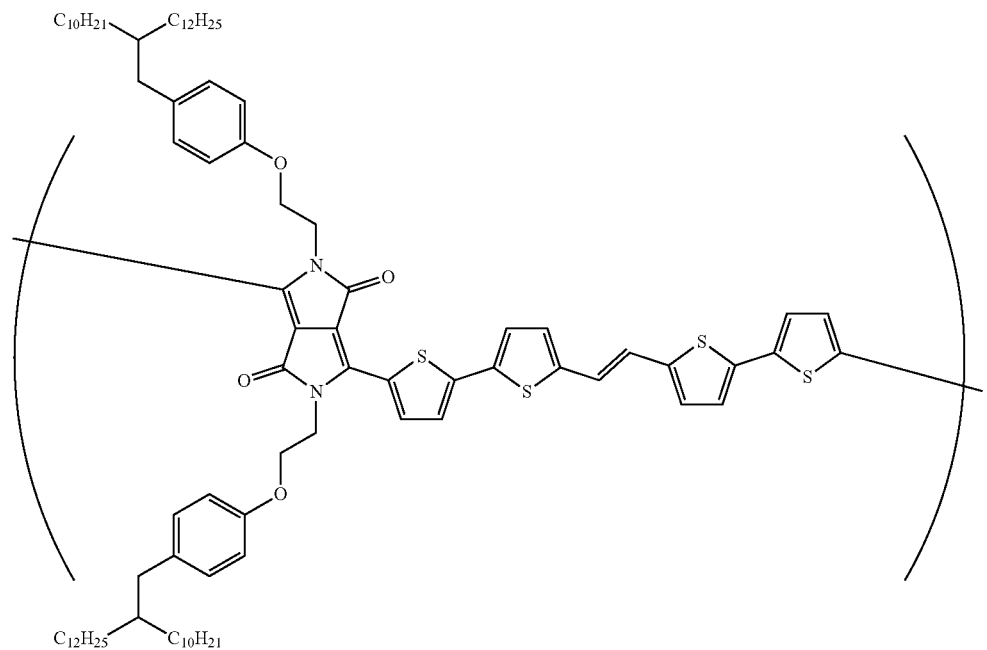
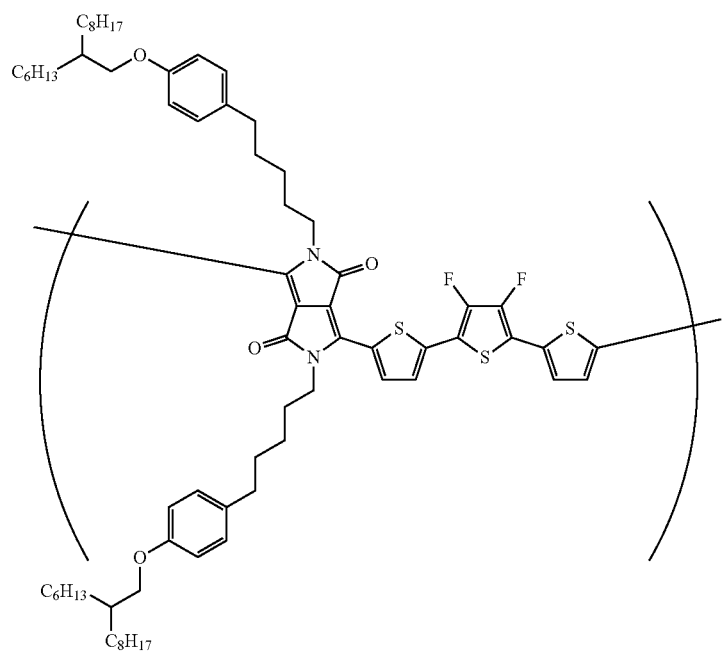

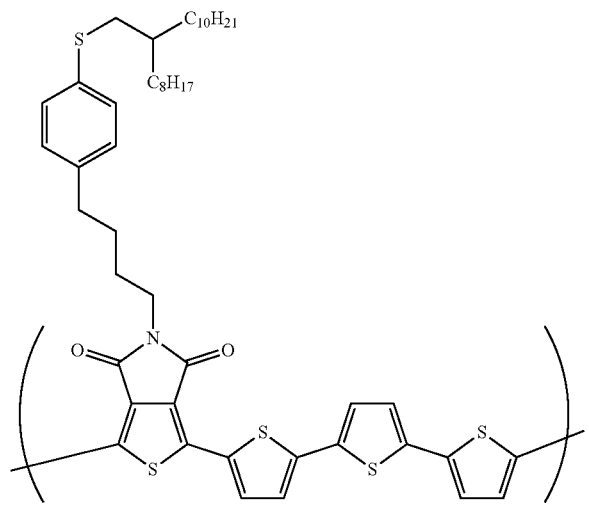
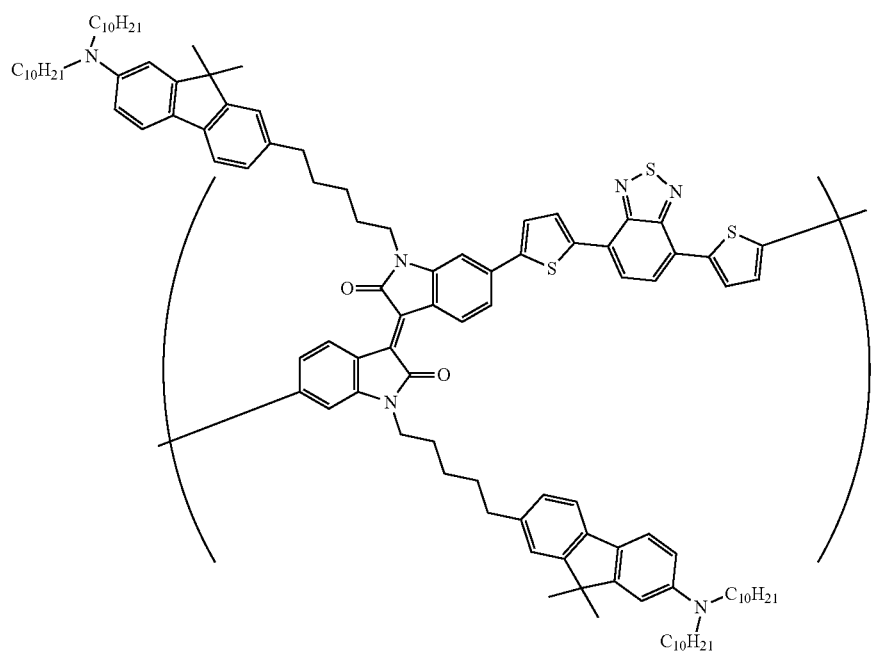

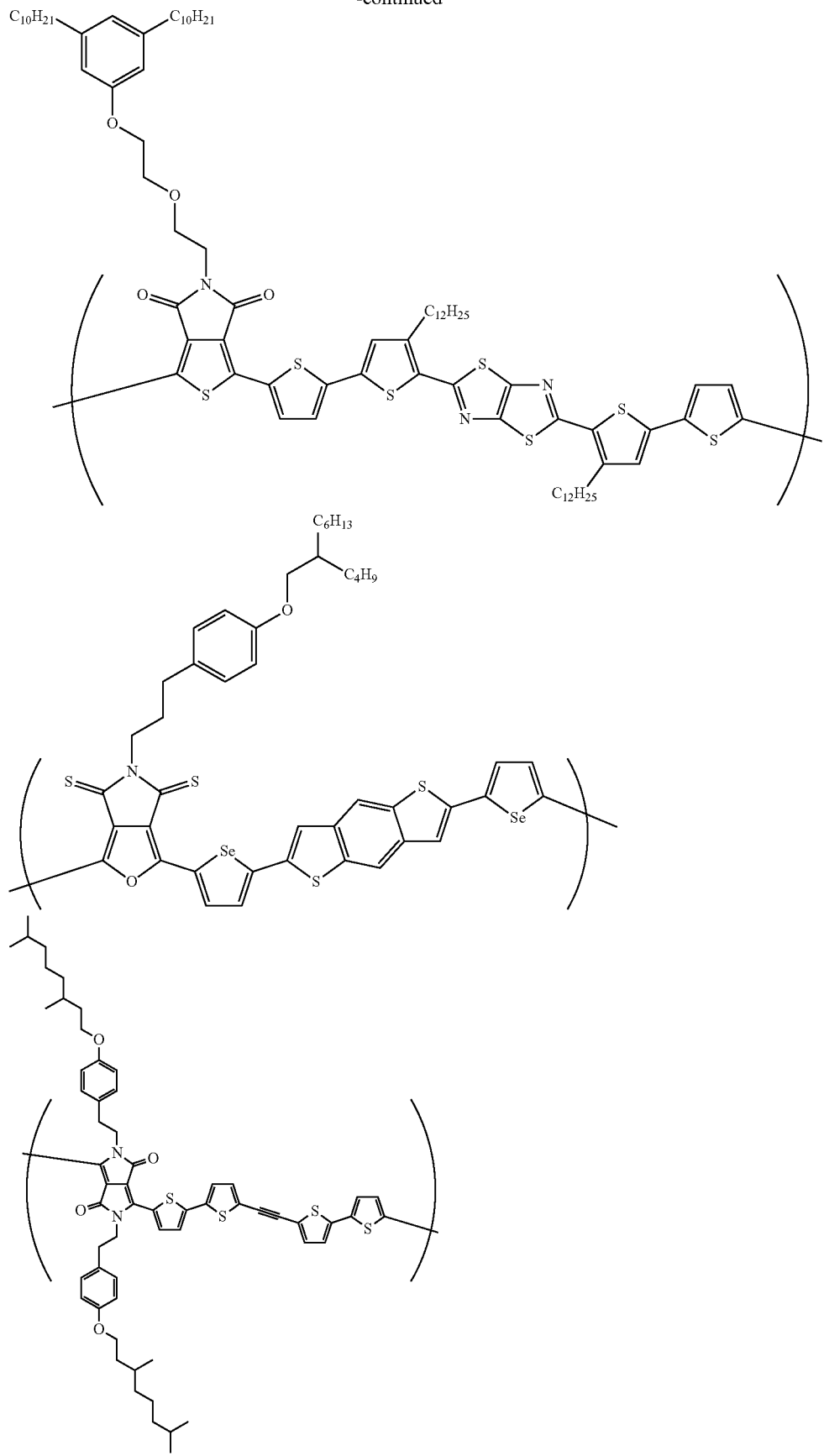

-continued
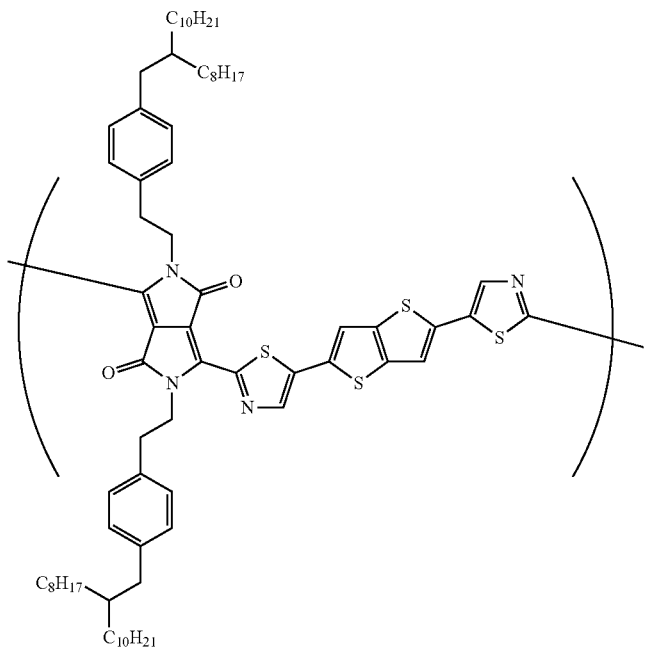
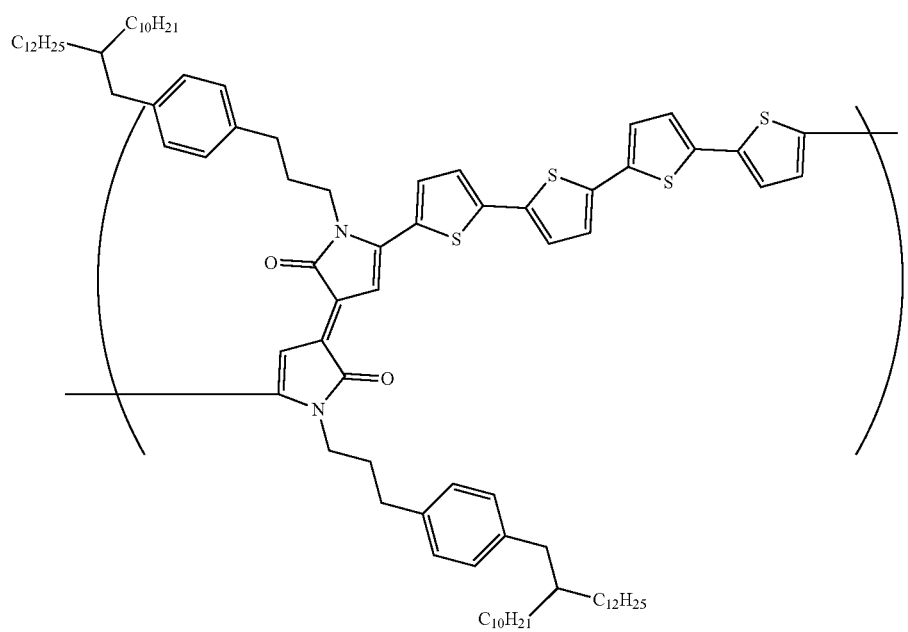

-continued
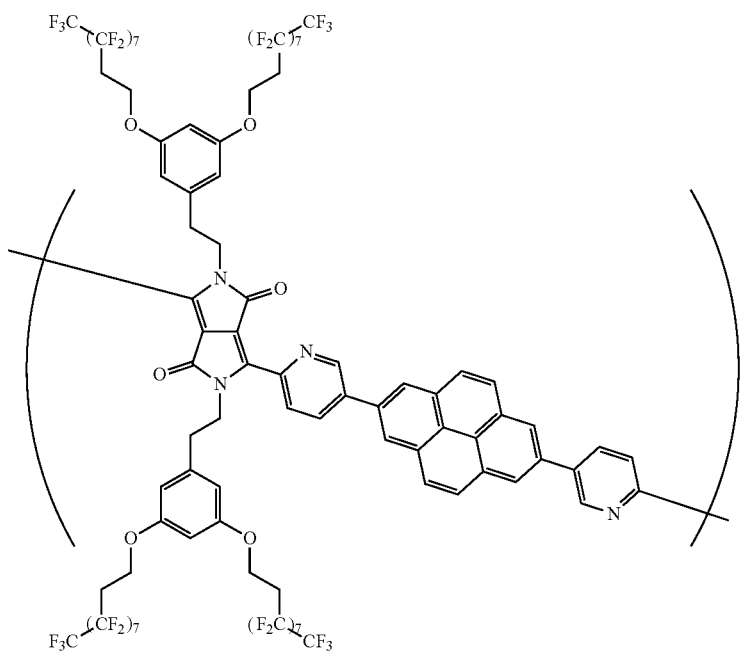
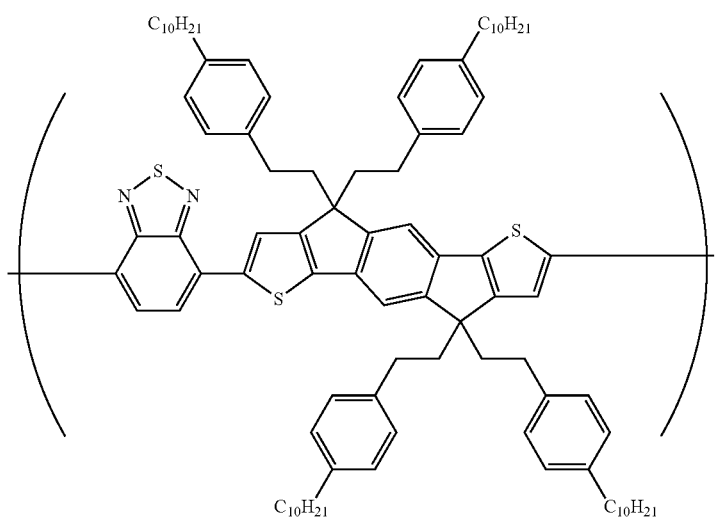
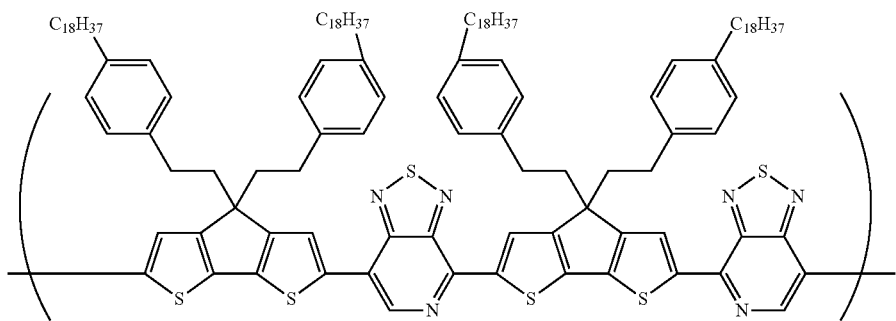

-continued
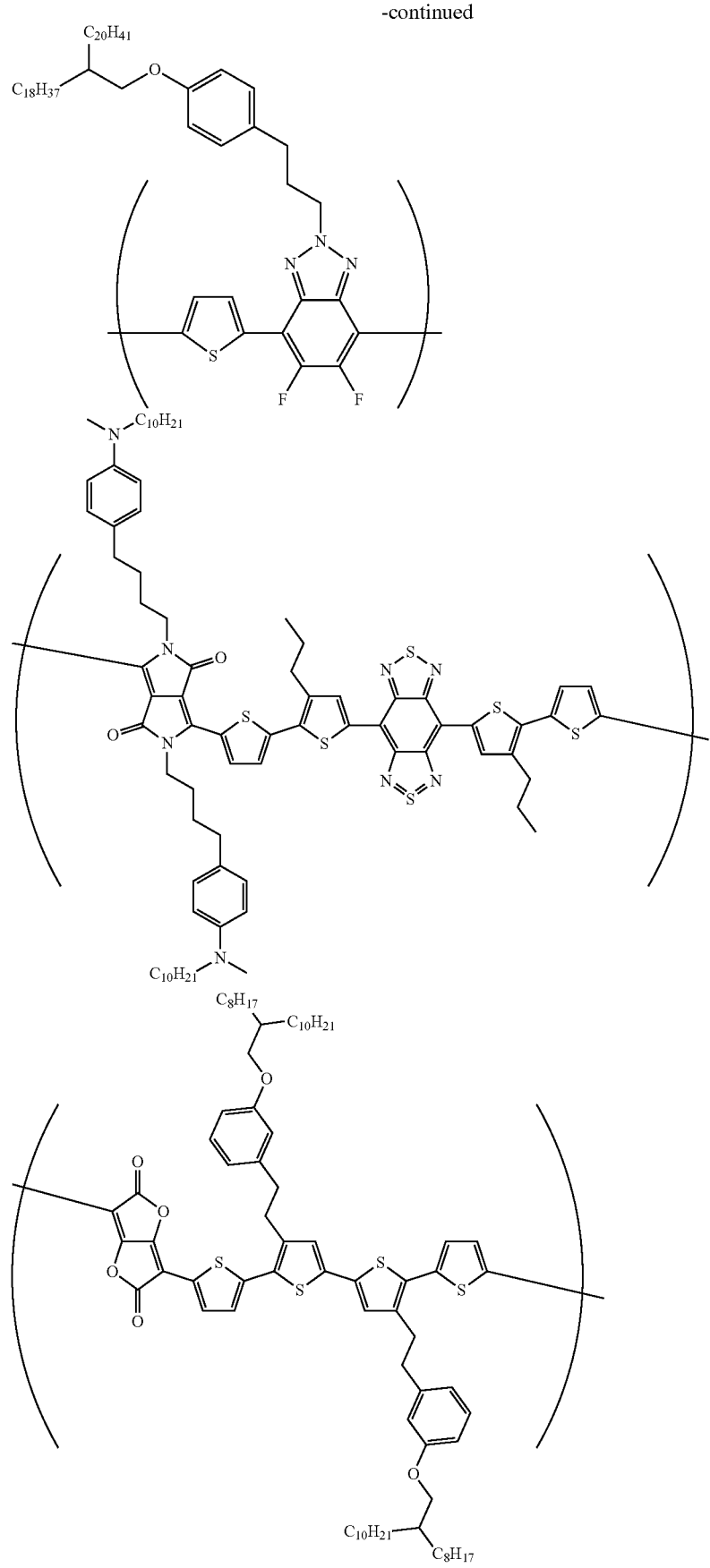

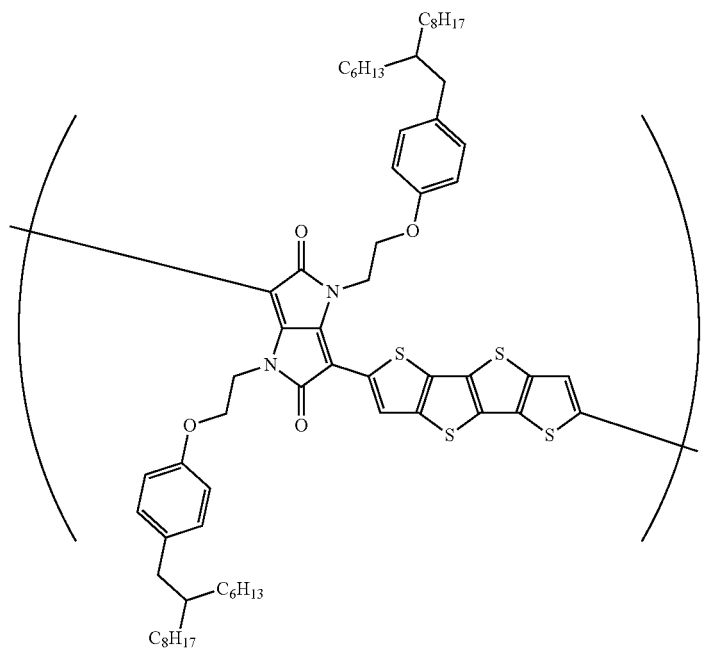
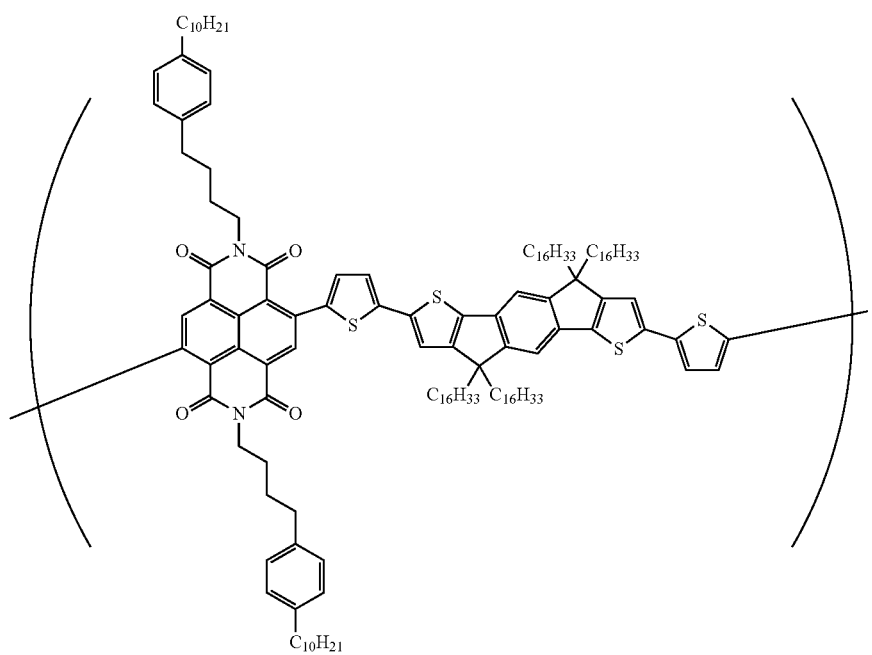

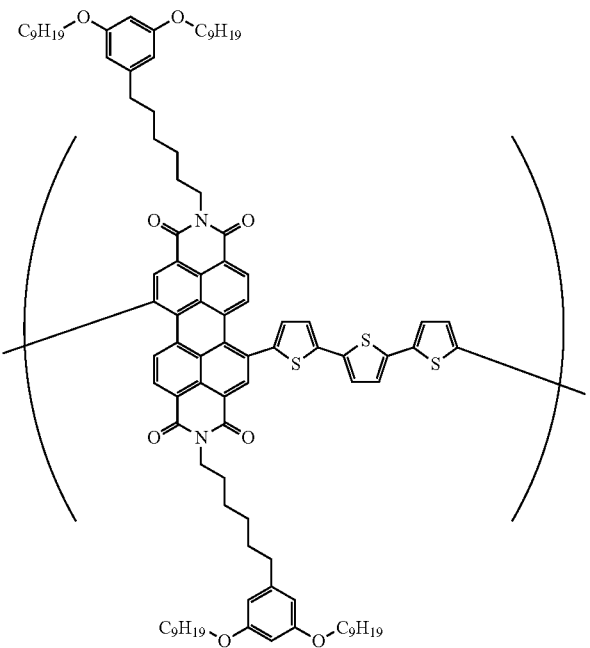
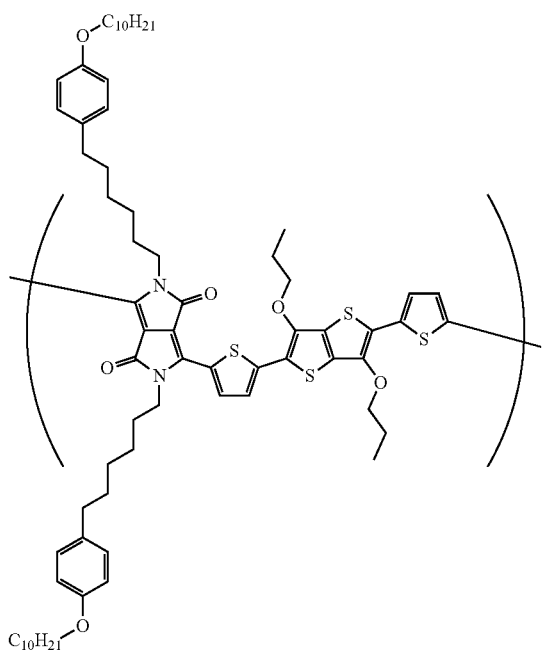

-continued

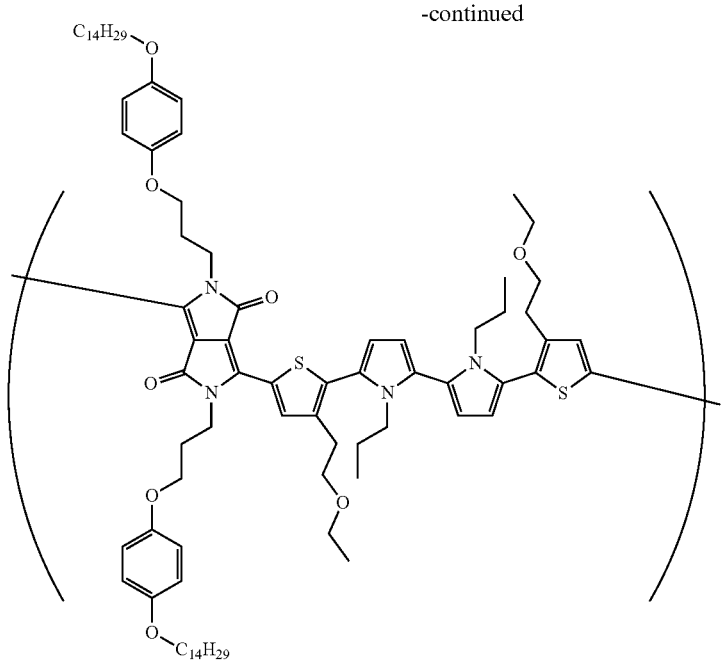

<Binder Polymer>

The organic semiconductor layer of the organic semiconductor element according to the present invention may contain the binder polymer.

The organic semiconductor element according to the present invention may be an organic semiconductor element having a layer including the organic semiconductor layer and the binder polymer.

The kinds of the binder polymer are not particularly limited, and well-known binder polymers can be used.

Examples of the binder polymer include insulating polymers such as polystyrene, poly(α-methylstyrene), polyvinylcinnamate, poly(4-vinylphenyl), and poly(4-methylstyrene), polycarbonate, polyarylate, polyester, polyamide, polyimide, polyurethane, polysiloxane, polysulfone, polymethyl methacrylate, polymethyl acrylate, cellulose, polyethylene, and polypropylene, and copolymers thereof, a semiconductor polymer such as polysilane, polycarbazole, polyarylamine, polyfluorene, polythiophene, polypyrrole, polyaniline, polyparaphenylenevinylene, polyacene, and polyheteroacene, and copolymers thereof, and rubber, and a thermoplastic elastomer.

Among these, as the binder polymer, a polymer compound (a polymer having a monomer unit having a benzene ring group) having a benzene ring is preferable. The content of the monomer unit having a benzene ring group is not particularly limited. However, the content is preferably 50 mol % or greater, more preferably 70 mol % or greater, and even more preferably 90 mol % or greater with respect to the total monomer unit. The upper limit is not particularly limited, but examples of the upper limit include 100 mol %.

The binder polymer preferably includes an insulating polymer.

The insulating polymer is not particularly limited, as long as the insulating polymer exhibits insulating properties. The "insulating polymer" according to the present invention means a polymer having volume resistivity of $10^6$ Ωcm or greater. The volume resistivity is measured by using the following method.

[Method of Measuring Volume Resistivity]

A clear glass substrate in a square of 50 mm was coated with the polymer, so as to obtain a polymer film having a thickness of 1 μm. The volume resistivity of the obtained film was measured by using LORESTA GP MCP-T 610 type (Trade name, manufactured by Mitsubishi Materials Corporation).

A weight-average molecular weight of the binder polymer is not particularly limited, but is preferably 1,000 to 2,000,000, more preferably 1,500 to 1,000,000, even more preferably 2,500 to 1,000,000, still even more preferably 3,000 to 200,000, and most preferably 20,000 to 150,000.

The polydispersity (weight-average molecular weight/number-average molecular weight) of the binder polymer is preferably 2.5 or less, more preferably 1.5 or less, and even more preferably 1.1 or less.

The weight-average molecular weight (Mw) and the number-average molecular weight (Mn) of the above binder polymer can be measured in terms of standard polystyrene, by using gel permeation chromatography (GPC, manufactured by Tosoh Corporation; HLC-8120; Tskgel Multipore HXL-M) and using tetrahydrofuran (THF) as a solvent.

A content of the binder polymer in the organic semiconductor layer of the organic semiconductor element of the present invention is preferably 1 to 200 parts by mass, more preferably 10 to 150 parts by mass, and even more preferably 20 to 120 parts by mass with respect to 100 parts by mass of the content of the specific compound. In a case where the content is within the above range, carrier mobility and temporal stability under high temperature and high humidity of the obtained organic semiconductor become excellent.

<Other Components>

Other components may be included other than the specific compound and the binder polymer may be included in the organic semiconductor layer according to the organic semiconductor element of the present invention.

As other components, well-known additives and the like can be used.

In the organic semiconductor layer, a content of the components other than the specific compound and the binder polymer is preferably 10 mass % or less, more preferably 5 mass % or less, and even more preferably 1 mass % or less. In a case where the content of other components is within the above range, film formability is excellent, and carrier mobility and temporal stability under high temperature and high humidity of the obtained organic semiconductor are excellent.

<Method of Forming Organic Semiconductor Layer>

The method of forming the organic semiconductor layer according to the organic semiconductor element of the present invention is not particularly limited. However, a desired organic semiconductor layer can be formed by applying the organic semiconductor composition according to the present invention described below to a predetermined base material (for example, a source electrode, a drain electrode, and a gate insulating film), and performing a drying treatment, if necessary.

The organic semiconductor element of the present invention is preferably manufactured by using the organic semiconductor composition of the present invention described below.

A method of manufacturing an organic semiconductor film or an organic semiconductor element by using the organic semiconductor composition of the present invention is not particularly limited, and well-known methods can be employed. Examples thereof include a method of manufacturing an organic semiconductor film by applying the composition onto a predetermined base material and if necessary, performing a drying treatment.

The method of applying the composition onto a base material is not particularly limited, and known methods can be adopted. Examples thereof include an ink jet printing method, a screen printing method, a flexographic printing method, a bar coating method, a spin coating method, a knife coating method, and a doctor blade method. An ink jet printing method, a flexographic printing method, and a screen printing method are preferable.

Preferred examples of the flexographic printing method include an aspect in which a photosensitive resin plate is used as a flexographic printing plate. By printing the composition onto a substrate according to the aspect, a pattern can be easily formed.

Among the above methods, the method of manufacturing an organic semiconductor element of the present invention preferably includes a coating step of coating a substrate with the organic semiconductor composition of the present invention described below and more preferably includes a coating step of coating a substrate with the organic semiconductor composition of the present invention and a removing step of removing the solvent from the composition with which the substrate is coated.

The organic semiconductor composition according to the present invention described below includes a solvent and preferably includes an organic solvent.

As the solvent, well-known solvents can be used.

Specific examples thereof include a hydrocarbon-based solvent such as hexane, octane, decane, toluene, xylene, mesitylene, ethylbenzene, amylbenzene, decalin, 1-methyl-naphthalene, 1-ethylnaphthalene, 1,6-dimethylnaphthalene, and tetralin, a ketone-based solvent such as acetone, methyl ethyl ketone, methyl isobutyl ketone, cyclohexanone, acetophenone, propiophenone, butyrophenone, α-tetralone, β-tetralone, a halogenated hydrocarbon-based solvent such as dichloromethane, chloroform, tetrachloromethane, dichloroethane, trichloroethane, tetrachloroethane, chlorobenzene, 1,2-dichlorobenzene, 1,2,4-trichlorobenzene, chlorotoluene, and 1-fluoronaphthalene, a heterocyclic solvent such as pyridine, picoline, quinoline, thiophene, 3-butyl thiophene, and thieno [2,3-b] thiophene, a halogenated heterocyclic solvent such as 2-chlorothiophene, 3-chlorothiophene, 2,5-dichlorothiophene, 3,4-dichlorothiophene, 2-bromothiophene, 3-bromothiophene, 2,3-dibromothiophene, 2,4-dibromothiophene, 2,5-dibromothiophene, 3,4-dibromothiophene, and 3,4-dichloro-1,2,5-thiadiazole, an ester-based solvent such as ethyl acetate, butyl acetate, amyl acetate, 2-ethylhexyl acetate, γ-butyrolactone, and phenyl acetate, an alcohol-based solvent such as methanol, propanol, butanol, pentanol, hexanol, cyclohexanol, methyl cellosolve, ethyl cellosolve, and ethylene glycol, an ether-based solvent such as dibutyl ether, tetrahydrofuran, dioxane, anisole, ethoxybenzene, propoxybenzene, isopropoxybenzene, butoxybenzene, 2-methylanisole, 3-methylanisole, 4-methylanisole, 4-ethylanisole, dimethyl anisole (any one of 2,3-, 2,4-, 2,5-, 2,6-, 3,4-, 3,5-, and 3,6-), 1,4-benzodioxane, 2,3-dihydrobenzofuran, phthalane, chroman, and isochroman, an amide-imide-based solvent such as N,N-dimethylformamide, N,N-dimethylacetamide, 1-methyl-2-pyrrolidone, l-methyl-2-imidazolidinone, and 1,3-dimethyl-2-imidazolidinone, a sulfoxide-based solvent such as dimethylsulfoxide, a phosphate ester-based solvent such as trimethyl phosphate, a nitrile-based solvent such as acetonitrile and benzonitrile, and a nitro-based solvent such as nitromethane and nitrobenzene.

The solvent may be used singly or a plurality of types thereof may be used in combination.

Among these, a hydrocarbon-based solvent, a ketone-based solvent, a halogenated hydrocarbon-based solvent, a heterocyclic solvent, a halogenated heterocyclic solvent, or an ether-based solvent are preferable, toluene, xylene, mesitylene, amylbenzene, tetralin, acetophenone, propiophenone, butyrophenone, α-tetralone, tetrachloroethane, chlorobenzene, 1,2-dichlorobenzene, 1,2,4-trichlorobenzene, chlorotoluene, 1-fluoronaphthalene, anisole, ethoxybenzene, propoxybenzene, isopropoxybenzene, butoxybenzene, 2-methylanisole, 3-methylanisole, 4-methylanisole, 2,3-dihydrobenzofuran, phthalane, chroman, isochroman, 1-fluoronaphthalene, 3-chlorothiophene, and 2,5-dibromothiophene are more preferable, and toluene, xylene, tetralin, acetophenone, propiophenone, butyrophenone, α-tetralone, chlorobenzene, 1,2-dichlorobenzene, anisole, ethoxybenzene, propoxybenzene, butoxybenzene, 2-methylanisole, 3-methylanisole, 4-methylanisole, 2,3-dihydrobenzofuran, phthalane, chroman, isochroman, 1-fluoronaphthalene, 3-chlorothiophene, and 2,5-dibromothiophene are particularly preferable.

The boiling point of the solvent is preferably 100° C. or greater, in view of film formability. The boiling point of the solvent is more preferably 100° C. to 300° C., even more preferably 125° C. to 275° C., and particularly preferably 150° C. to 250° C.

It is preferable that a boiling point of the solvent of which the content is the greatest is 100° C. or greater and, it is more preferable that a boiling point of the total solvent is 100° C. or greater.

In a case where the solvent is contained, the content of the specific compound in the organic semiconductor composition of the present invention is preferably 0.005 to 50 mass %, more preferably 0.01 to 25 mass %, even more preferably 0.05 to 15 mass %, particularly preferably 0.05 to 10 mass %, and most preferably 0.2 to 5 mass % with respect to the total mass of the organic semiconductor composition. In a case where a binder polymer is contained, the content of the binder polymer is preferably 0.01 to 50 mass %, more preferably 0.05 to 25 mass %, and even more preferably 0.1 to 15 mass %. In a case where the content is in the range above, the coating properties are excellent, and the organic semiconductor film can be easily formed.

The drying treatment in the removing step is a treatment performed if necessary, and the optimal treatment conditions are appropriately selected according to the type of the specific compound used and the solvent. Since carrier mobility and temporal stability under high temperature and high humidity of the obtained organic semiconductor are excellent and productivity is excellent, a heating temperature is preferably 20° C. to 200° C., more preferably 40° C. to 150° C., and even more preferably 40° C. to 120° C., and a heating time is preferably 10 to 300 minutes and more preferably 30 to 180 minutes.

The organic semiconductor composition according to the present invention may contain additives such as a surfactant, an antioxidant, a crystallization controlling agent, and a crystal alignment control agent, in addition to a binder polymer.

A thickness of the formed organic semiconductor layer is not particularly limited. In view of carrier mobility and temporal stability under high temperature and high humidity of the obtained organic semiconductor, the film thickness is preferably 10 to 500 nm and more preferably 30 to 200 nm.

The organic semiconductor element is not particularly limited, but is preferably an organic semiconductor element having 2 to 5 terminals, and more preferably an organic semiconductor element having 2 or 3 terminals.

It is preferable that the organic semiconductor element is not a photoelectric conversion element.

The organic semiconductor element according to the present invention is preferably a non-luminous organic semiconductor element.

Examples of a 2-terminal element include a rectifier diode, a constant voltage diode, a PIN diode, a Schottky barrier diode, a surge protection diode, a diac, a varistor, and a tunnel diode.

Examples of a 3-terminal element include a bipolar transistor, a Darlington transistor, a field effect transistor, an insulated gate bipolar transistor, a uni-junction transistor, a static induction transistor, a gate turn thyristor, a triac, and a static induction thyristor.

Among these, a rectifier diode and transistors are preferable, and a field effect transistor is more preferable.

An organic thin film transistor (organic TFT) which is one aspect of the organic semiconductor element of the present invention is described with reference to the drawings.

In FIG. 1, a cross-sectional view of a bottom contact type organic thin film transistor as one aspect of an organic thin film transistor (organic TFT) is schematically illustrated.

In FIG. 1, an organic thin film transistor 100 comprises a substrate 10, a gate electrode 20 disposed on the substrate 10, a gate insulating film 30 covering the gate electrode 20, a source electrode 40 and a drain electrode 42 which contact a surface of the gate insulating film 30 that is on the side opposite to the gate electrode 20 side, an organic semiconductor film 50 covering a surface of the gate insulating film 30 between the source electrode 40 and the drain electrode 42, and a sealing layer 60 covering each member. That is, the organic thin film transistor 100 is a bottom gate-bottom contact type organic thin film transistor.

In FIG. 1, the organic semiconductor film 50 corresponds to a film formed of the organic semiconductor composition according to the present invention described above.

Hereinafter, the substrate, the gate electrode, the gate insulating film, the source electrode, the drain electrode, the organic semiconductor film, the sealing layer, and a method of forming each of these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, and a ceramic substrate. Among these, from the viewpoint of applicability to each device and costs, a glass substrate or a plastic substrate is preferable.

Examples of materials of the plastic substrate include a thermosetting resin (for example, an epoxy resin, a phenol resin, a polyimide resin, or a polyester resin (for example, polyethylene terephthalate (PET) or polyethylene naphthalate (PEN)) and a thermoplastic resin (for example, a phenoxy resin, a polyethersulfone, polysulfone, or polyphenylene sulfone).

Examples of materials of the ceramic substrate include alumina, aluminum nitride, zirconia, silicon, silicon nitride, and silicon carbide.

Examples of materials of the glass substrate include soda lime glass, potash glass, borosilicate glass, quartz glass, aluminosilicate glass, and lead glass.

<Gate electrode, source electrode, and drain electrode>

Examples of materials of the gate electrode, the source electrode, and the drain electrode include metal such as gold (Au), silver, aluminum (Al), copper, chromium, nickel, cobalt, titanium, platinum, tantalum, magnesium, calcium, barium, or sodium; conductive oxide such as $InO_2$, $SnO_2$, or indium tin oxide (ITO); a conductive polymer such as polyaniline, polypyrrole, polythiophene, polyacetylene, or polydiacetylene; a semiconductor such as silicon, germanium, or gallium arsenide; and a carbon material such as fullerene, carbon nanotubes, or graphite. Among these, a metal is preferable, and gold, silver and aluminum are more preferable.

A thickness of each of the gate electrode, the source electrode, and the drain electrode is not particularly limited, but is preferably 20 to 200 nm.

A method of forming the gate electrode, the source electrode, and the drain electrode is not particularly limited, but examples thereof include a method of vacuum vapor-depositing or sputtering an electrode material onto a substrate, a method of coating a substrate with a composition for forming an electrode, and a method of printing a composition for forming an electrode onto a substrate. In a case where the electrode is patterned, examples of the patterning method include a photolithography method; a printing method such as ink jet printing, screen printing, offset printing, or relief printing; and a mask vapor deposition method.

<Gate Insulating Film>

The gate insulating film is not particularly limited, as long as the gate insulating film is a film provided between a gate electrode and an organic semiconductor layer and has insulating properties. The gate insulating film may be a film of a single layer or may be a film of multiple layers.

The gate insulating film is preferably formed of insulating materials. Examples of the insulating materials preferably include an organic material such as an organic polymer and an inorganic material such as an inorganic oxide. In view of handleability, it is preferable that an organic material is used.

The organic polymer, the inorganic oxide, and the like are not particularly limited, as long as the organic polymer, the inorganic oxide, and the like have insulating properties. It is preferable to form a thin film, for example, a thin film having a thickness of 1 μm or less.

The organic polymer and the inorganic oxide may be used singly or two or more kinds thereof may be used in combination. The gate insulating film may be a hybrid layer in which an organic polymer described below and inorganic oxide described below are mixed.

Examples of the material of the gate insulating film include a polymer such as polymethyl methacrylate, polystyrene, polyvinyl phenol, polyimide, polycarbonate, polyester, polyvinyl alcohol, polyvinyl acetate, polyurethane, polysulfone, polybenzoxazole, polysilsesquioxane, an epoxy resin, and a phenol resin; oxide such as silicon dioxide, aluminum oxide, and titanium oxide; and nitride such as silicon nitride. Among these materials, in view of the compatibility with the organic semiconductor film, it is preferable that the material of the gate insulating film is a polymer.

In a case where a polymer is used as the material of the gate insulating film, it is preferable to use a crosslinking agent (for example, 2,4,6,-tris[bis(methoxymethyl)amino]-1,3,5,-triazine) in combination. In a case where the crosslinking agent is used in combination, the polymer is crosslinked, and the durability of the formed gate insulating film is improved.

The film thickness of the gate insulating film is not particularly limited but is preferably 100 to 1,000 nm.

The method of forming the gate insulating film is not particularly limited, and examples thereof include a method of coating a substrate on which a gate electrode is formed with a composition for forming a gate insulating film and a method of vapor-depositing or sputtering a material of a gate insulating film. A method of coating the composition for forming a gate insulating film is not particularly limited, and a well-known method (a bar coating method, a spin coating method, a knife coating method, a doctor blade method) can be used.

In a case where the gate insulating film is formed by applying the composition for forming a gate insulating film, heating (baking) may be performed after coating for the purpose of removing a solvent, causing crosslinking, or the like.

The gate insulating film may be subjected to a surface treatment such as a corona treatment, a plasma treatment, and an ultraviolet (UV)/ozone treatment. However, in this case, it is preferable that surface roughness does not become coarse due to the treatment. The arithmetic average roughness Ra or root mean square roughness $R_{MS}$ of the gate insulating film surface is preferably 0.5 nm or less.

As the method of adjusting surface energy of the insulating film, an ultraviolet (UV)/ozone treatment is effective, and it is possible to hydrophilize a gate insulating film surface by appropriately selecting the treatment time.

<Binder Polymer Layer>

The organic semiconductor element of the present invention may have the binder polymer layer between the organic semiconductor layer and the gate insulating film. In a case where the organic semiconductor element has the binder polymer layer, the organic semiconductor element preferably has the binder polymer layer between the organic semiconductor layer and the gate insulating film. A film thickness of the binder polymer layer is not particularly limited, but is preferably 20 to 500 nm. The binder polymer layer should be a layer containing the aforementioned polymer, and is preferably a layer composed of the aforementioned binder polymer.

A method of forming the binder polymer layer is not particularly limited, and a known method (a bar coating method, a spin coating method, a knife coating method, a doctor blade method, or an ink jet method) can be used.

In a case where the binder polymer layer is formed by performing coating by using a composition for forming a binder polymer layer, for the purpose of removing a solvent, causing crosslinking, or the like, the composition may be heated (baked) after coating.

<Sealing Layer>

From the viewpoint of durability, the organic semiconductor element of the present invention preferably comprises a sealing layer as an outermost layer. In the sealing layer, a known sealant can be used.

A thickness of the sealing layer is not particularly limited, but is preferably 0.2 to 10 μm.

A method of forming the sealing layer is not particularly limited, but examples thereof include a method of coating a substrate, on which the gate electrode, the gate insulating film, the source electrode, the drain electrode, and the organic semiconductor film are formed, with a composition for forming a sealing layer. Specific examples of the method of coating the substrate with the composition for forming a sealing layer are the same as the examples of the method of coating the substrate with the composition for forming a gate insulating film. In a case where the organic semiconductor film is formed by coating the substrate with the composition for forming a sealing layer, for the purpose of removing the solvent, causing crosslinking, or the like, the composition may be heated (baked) after coating.

Figure 2:
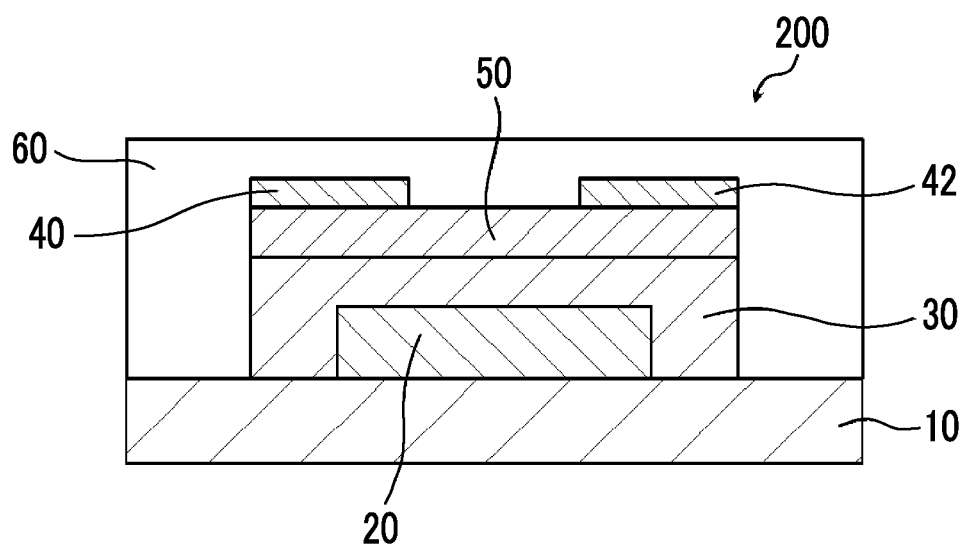
FIG. 2 is a cross-sectional view schematically illustrating a top contact type organic thin film transistor according to one embodiment of the present invention.

In FIG. 2, a cross-sectional view of a top contact type organic thin film transistor as another aspect of an organic thin film transistor (organic TFT) is schematically illustrated.

In FIG. 2, an organic thin film transistor 200 comprises the substrate 10, the gate electrode 20 disposed on the substrate 10, the gate insulating film 30 covering the gate electrode 20, the organic semiconductor film 50 disposed on the gate insulating film 30, the source electrode 40 and the drain electrode 42 disposed on the organic semiconductor film 50, and the sealing layer 60 covering each member. Herein, the source electrode 40 and the drain electrode 42 are formed using the aforementioned composition of the present invention. That is, the organic thin film transistor 200 is a bottom gate-top contact type organic thin film transistor.

The substrate, the gate electrode, the gate insulating film, the source electrode, the drain electrode, the organic semiconductor film, and the sealing layer are as described above.

In FIGS. 1 and 2, the aspects of the bottom gate-bottom contact type organic thin film transistor and the bottom gate-top contact type organic thin film transistor were specifically described. However, the organic semiconductor element of the present invention can also be suitably used in a top gate-bottom contact type organic thin film transistor and a top gate-top contact type organic thin film transistor.

The organic thin film transistor described above can be suitably used for electronic paper and a display device.

[Compound]

The compound according to the present invention has the repeating unit represented by any one of Formulae (2) to (5) and has a molecular weight of 2,000 or greater. Formulae (2) to (5) each have at least one monovalent group represented by Formula (1-1).

With respect to the compound according to the present invention, the compound having a repeating unit represented by any one of Formulae (2) to (5) and having a molecular weight of 2,000 or greater is the same as the compound having a repeating unit represented by any one of Formulae (2) to (5), and preferable aspects thereof are the same.

The compound of the present invention can be preferably used as the compound for an organic semiconductor (a compound for forming an organic semiconductor layer) as described above.

[Organic Semiconductor Composition]

The organic semiconductor composition according to the present invention contains the compound (aforementioned specific compound) according to the present invention and a solvent.

The organic semiconductor composition according to the present invention may contain a binder polymer.

The specific compound, the binder polymer, and the solvent in the organic semiconductor composition according to the present invention have the same meanings as the specific compound, the binder polymer, and the solvent described above, and preferable aspects thereof are also the same.

The content of the specific compound in the organic semiconductor composition according to the present invention is not particularly limited, but is preferably 0.005 to 10 mass %, more preferably 0.01 to 5 mass %, and even more preferably 0.05 to 3 mass % with respect to the total mass of the organic semiconductor composition.

The organic semiconductor composition according to the present invention may include other components in addition to the specific compound, the binder polymer, and the solvent.

As other components, well-known additives and the like can be used.

The content of the component in addition to the specific compound, the binder polymer, and the solvent in the organic semiconductor composition according to the present invention is preferably 10 mass % or less, more preferably 5 mass % or less, even more preferably 1 mass % or less, and particularly preferably 0.1 mass % or less with respect to the total solid content. In a case where the content of other components is within the above range, film formability is improved, and carrier mobility and temporal stability under high temperature and high humidity of the obtained organic semiconductor are further improved. The solid content is an amount of the components excluding the volatilizable component such as the solvent.

The viscosity of the organic semiconductor composition according to the present invention is not particularly limited. However, in view of excellent coating properties, the viscosity is preferably 3 to 100 mPa·s, more preferably 5 to 50 mPa·s, and even more preferably 9 to 40 mPa·s. The viscosity according to the present invention refers to the viscosity at 25° C.

As a method of measuring the viscosity, a measuring method in conformity of JIS Z8803 is preferable.

The method of manufacturing the organic semiconductor composition according to the present invention is not particularly limited, and well-known methods can be applied. For example, a desired composition can be obtained by adding a specific amount of a specific compound in the solvent and applying an appropriate stirring treatment. In a case where the binder polymer is used, the specific compound and the binder polymer are simultaneously or sequentially added, so as to suitably manufacture the composition.

[Organic Semiconductor Film]

The organic semiconductor film according to the present invention contains the specific compound.

The organic semiconductor film according to the present invention preferably contains a binder polymer.

The specific compound and the binder polymer in the organic semiconductor film according to the present invention have the same meanings as the specific compound and the binder polymer described above in the organic semiconductor element according to the present invention, and preferable aspects thereof are also the same.

The organic semiconductor film according to the present invention may include other components in addition to the specific compound and the binder polymer.

As other components, well-known additives and the like can be used.

A content of the components other than the specific compound and the binder polymer in the organic semiconductor film according to the present invention is preferably 10 mass % or less, more preferably 5 mass % or less, and even more preferably 1 mass % or less. In a case where the content of other components is within the above range, film formability is excellent, and carrier mobility and temporal stability under high temperature and high humidity of the obtained organic semiconductor are excellent. The solid content is an amount of the components excluding the volatilizable component such as the solvent.

The film thickness of the organic semiconductor film according to the present invention is not particularly limited. However, in view of carrier mobility and temporal stability under high temperature and high humidity of the obtained organic semiconductor, the film thickness is preferably 10 to 500 nm and more preferably 30 to 200 nm.

The organic semiconductor film according to the present invention can be suitably used in the organic semiconductor element, and can be particularly suitably used in the organic thin film transistor.

The organic semiconductor film according to the present invention can be suitably manufactured by using the organic semiconductor composition according to the present invention.

The method of manufacturing the organic semiconductor film according to the present invention is not particularly limited, and well-known methods can be employed. Examples thereof include a method of manufacturing an organic semiconductor film by applying the organic semiconductor composition according to the present invention on a predetermined base material and performing a drying treatment, if necessary.

The method of applying the composition onto a base material is not particularly limited, and known methods can be employed. Examples thereof include an ink jet printing method, a screen printing method, a flexographic printing method, a bar coating method, a spin coating method, a knife coating method, a doctor blade method, and the like. An ink jet printing method, a flexographic printing method, and a screen printing method are preferable.

Among these, the method of manufacturing the organic semiconductor film according to the present invention preferably includes a coating step of coating the substrate with the organic semiconductor composition according to the present invention and more preferably includes a coating step of coating a substrate with the organic semiconductor composition according to the present invention and a removing step of removing the solvent from the coated composition.

EXAMPLES

Hereinafter, the present invention is specifically described with reference to examples. The materials and the amount thereof used, the proportion of the materials, the content and procedure of treatments, and the like described in the following examples can be appropriately changed within a scope that does not depart from the gist of the present invention. Therefore, the scope of the present invention is not limited to the following specific examples. Herein, unless otherwise specified, "part" and "%" are based on mass.

Examples 1 to 16 and Comparative Examples 1 to 9

<Organic Semiconductor Compound>

Structures of Example Compounds 1 to 16 and Comparative Example Compounds 1 to 9 which were used in the organic semiconductor layer are provided below. Mw represents a weight-average molecular weight of each compound, and the measuring method thereof is as described above.

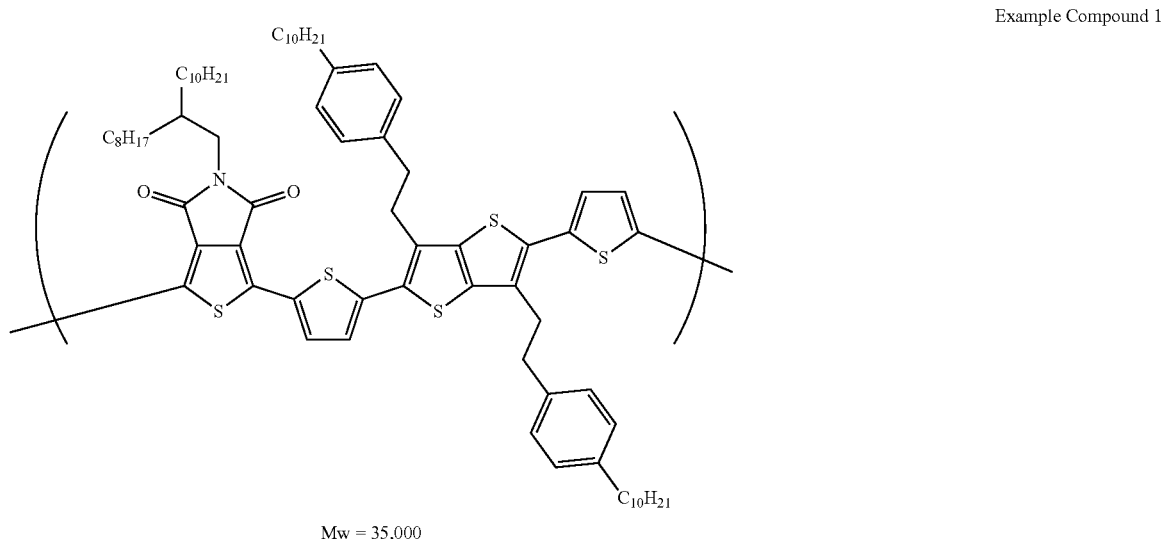

Example Compound 1

Mw = 35,000

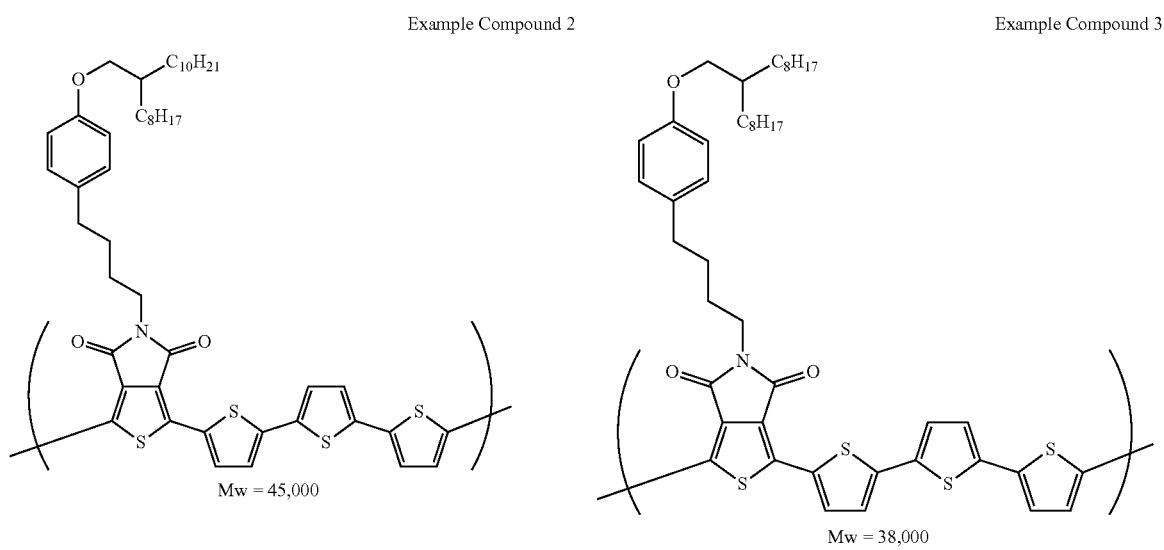

Example Compound 2

Mw = 45,000

Example Compound 3

Mw = 38,000

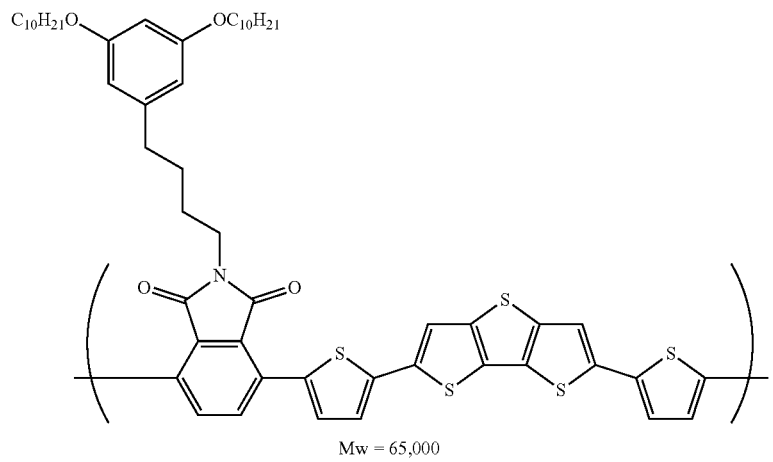
Example Compound 4
Mw = 65,000
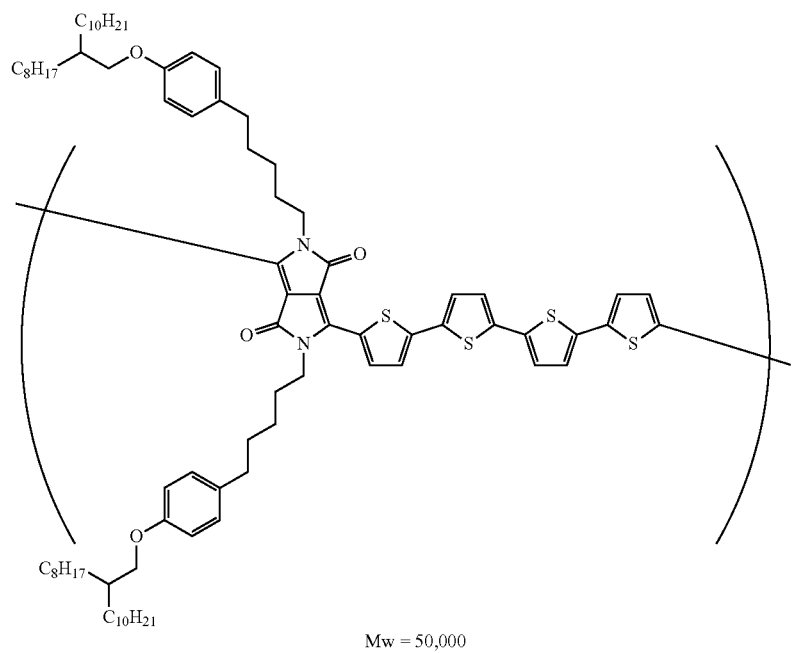
Example Compound 5
Mw = 50,000

Example Compound 6
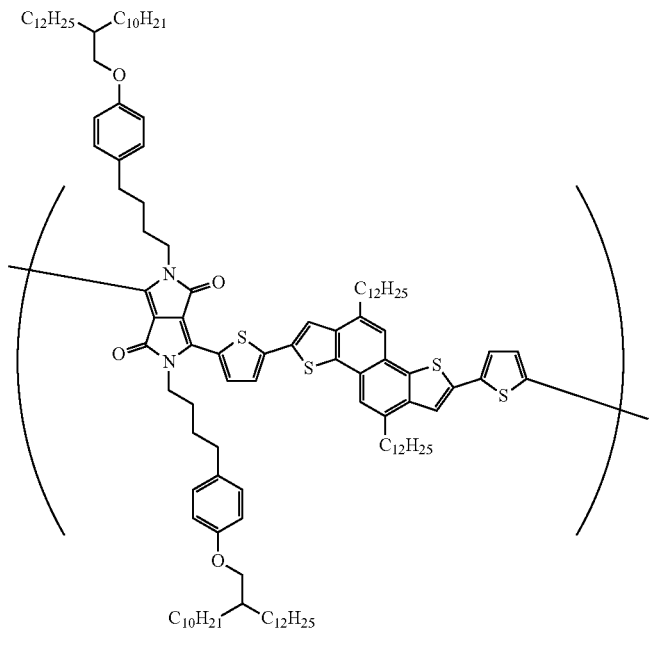
Mw = 48,000
Example Compound 7
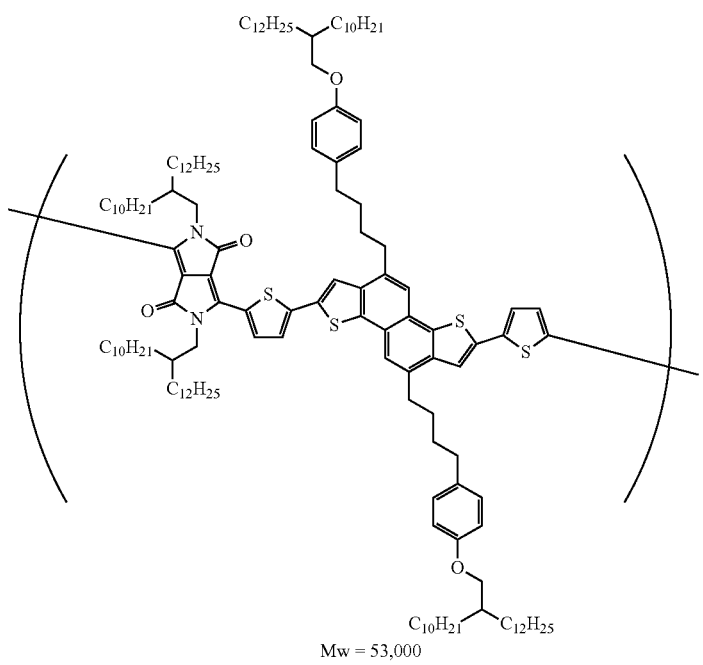
Mw = 53,000

Example Compound 8
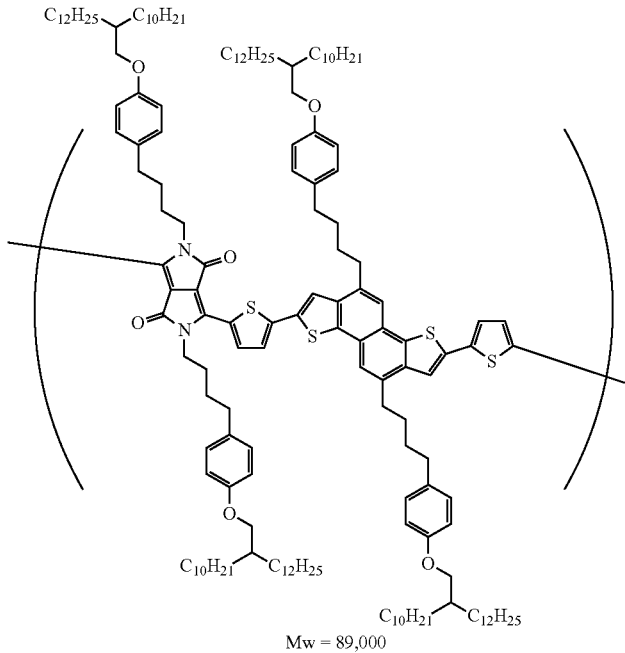
Mw = 89,000
Example Compound 9
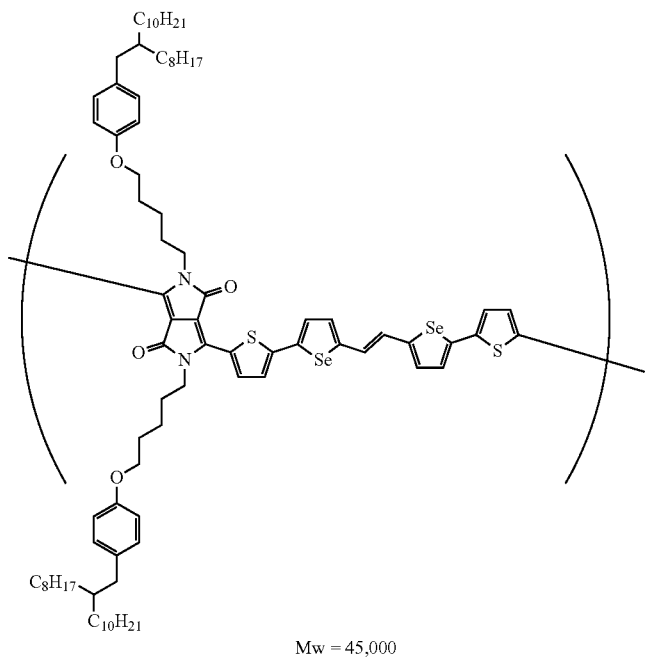
Mw = 45,000

Example Compound 10
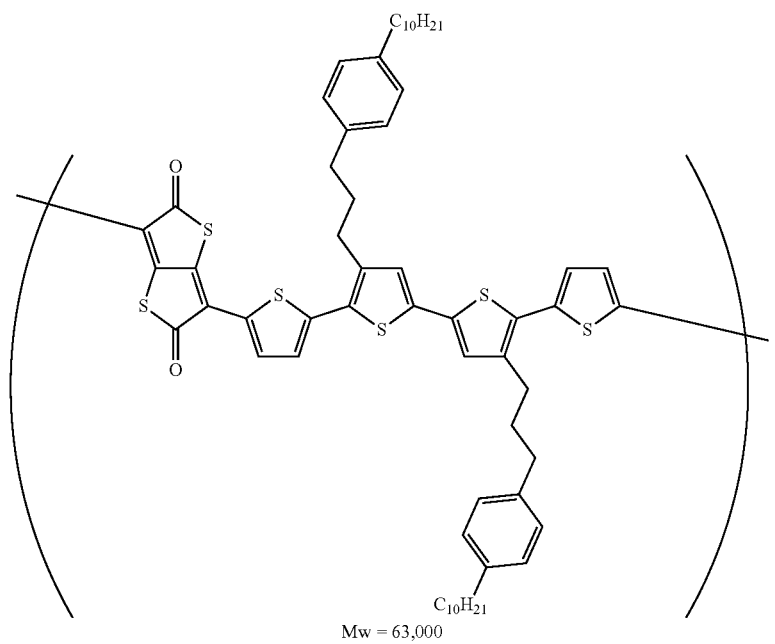
Mw = 63,000
Example Compound 11
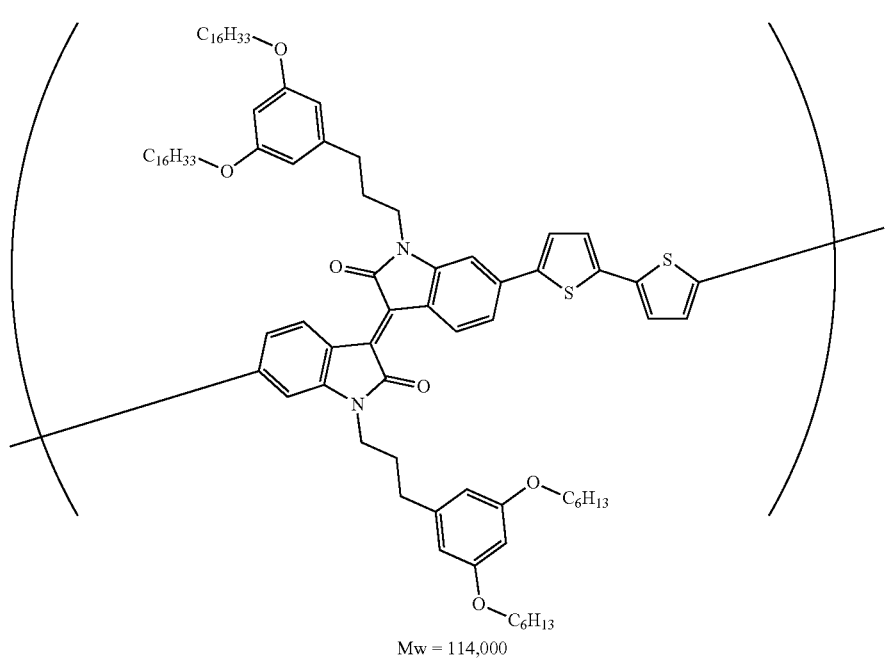
Mw = 114,000

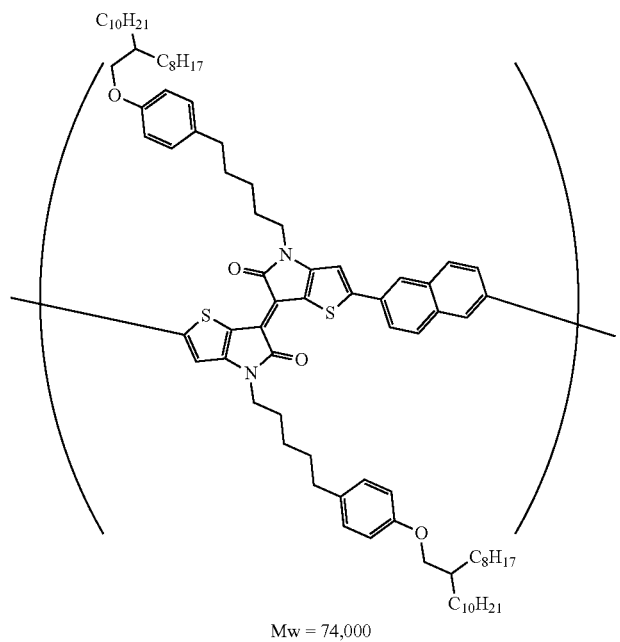
Example Compound 12
Mw = 74,000
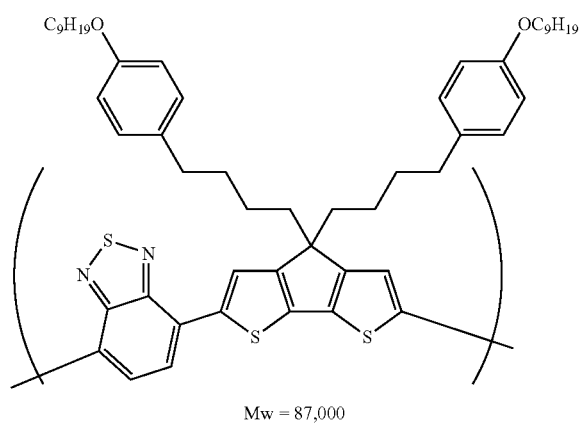
Example Compound 13
Mw = 87,000

Example Compound 14
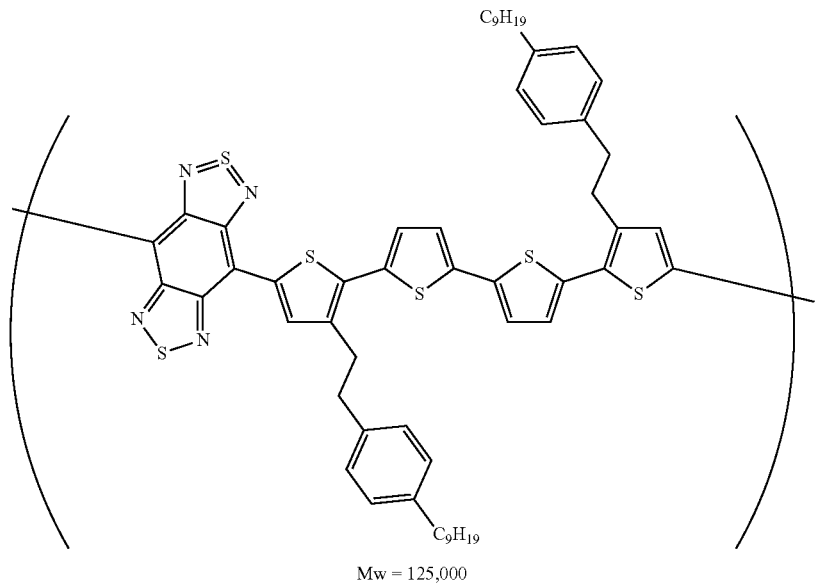
Mw = 125,000
Example Compound 15
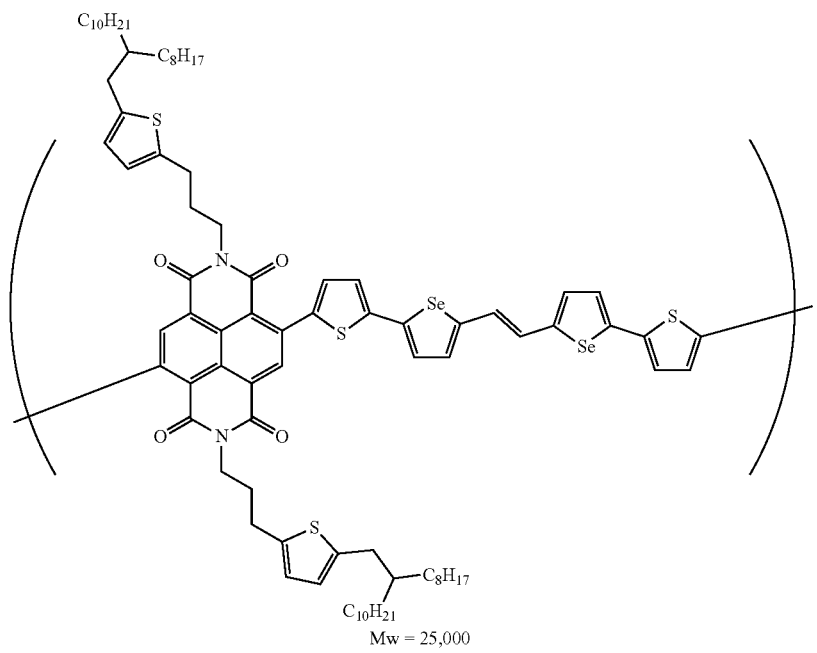
Mw = 25,000

Example Compound 16
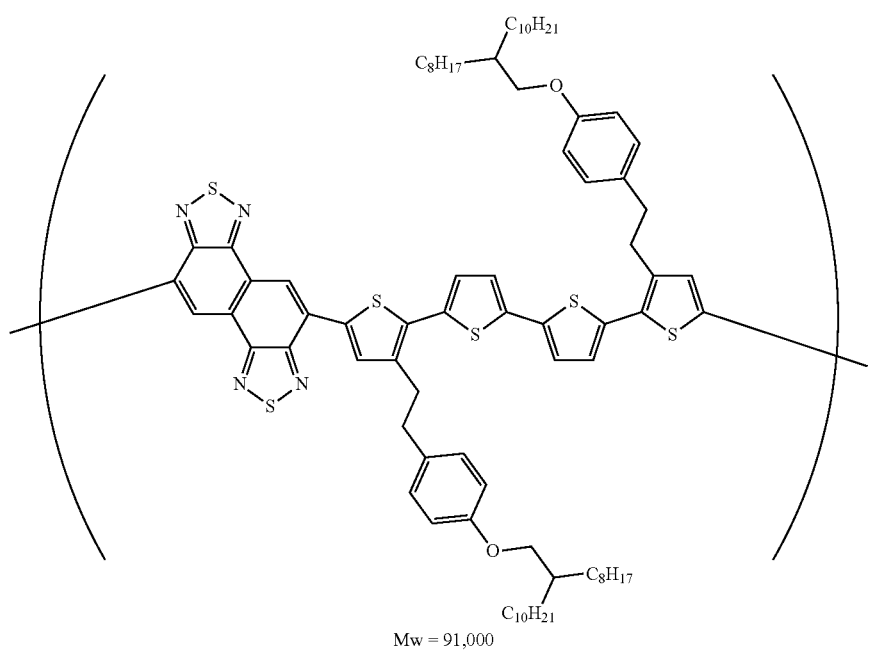
Mw = 91,000
Comparative Example Compound 1
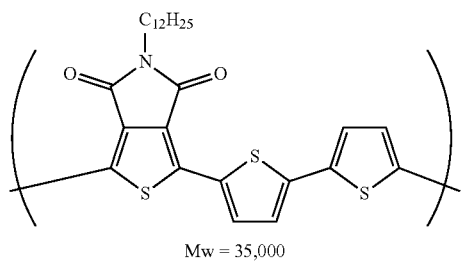
Mw = 35,000
Comparative Example Compound 2
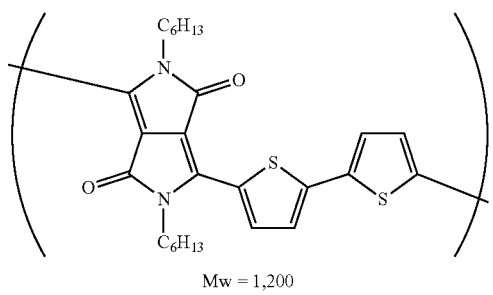
Mw = 1,200
Comparative Example Compound 3
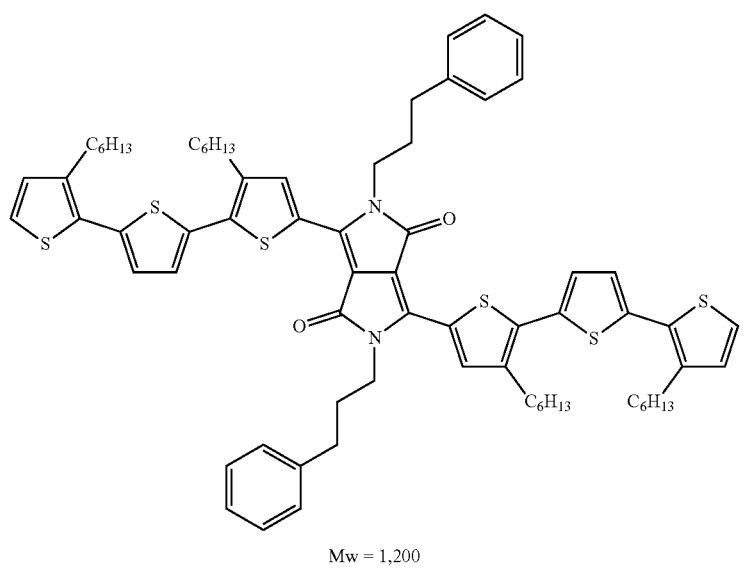
Mw = 1,200

Comparative Example Compound 4
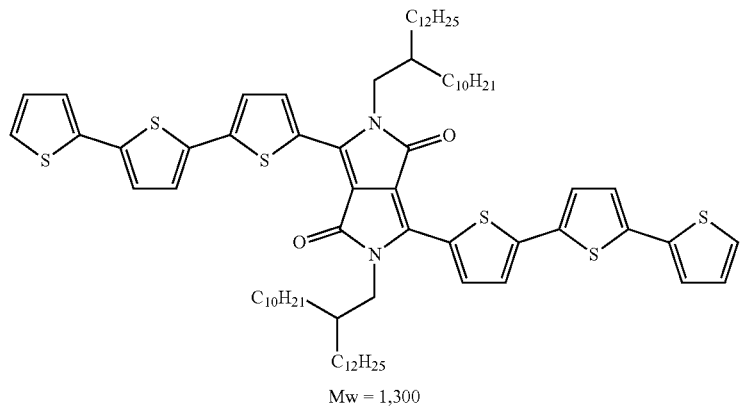
Mw = 1,300
Comparative Example Compound 5
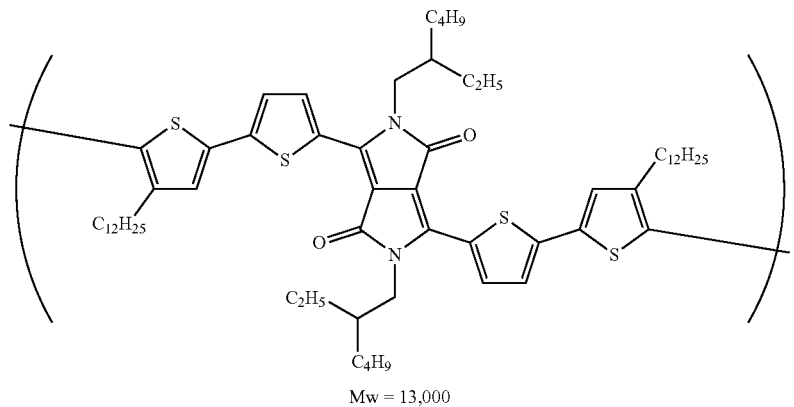
Mw = 13,000
Comparative Example Compound 6
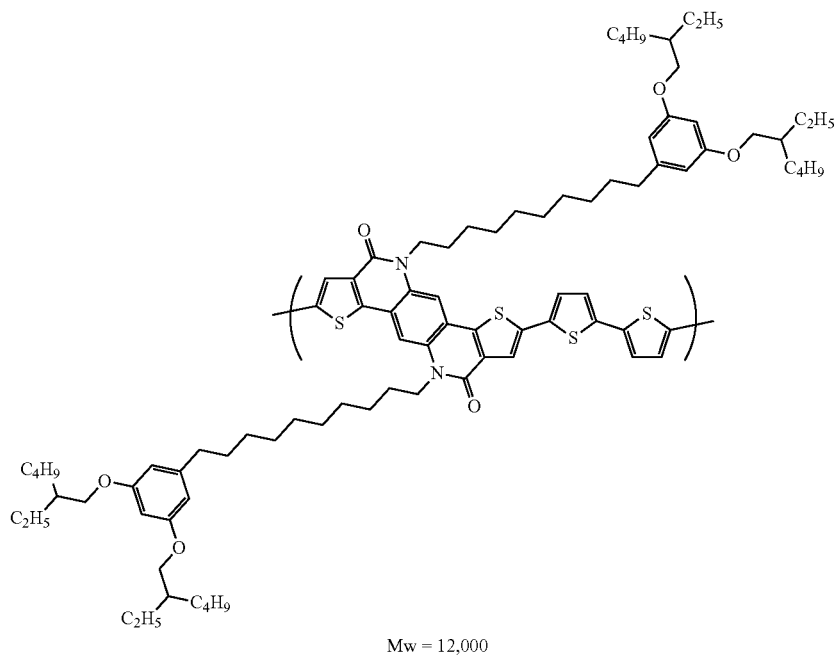
Mw = 12,000

Comparative Example Compound 7
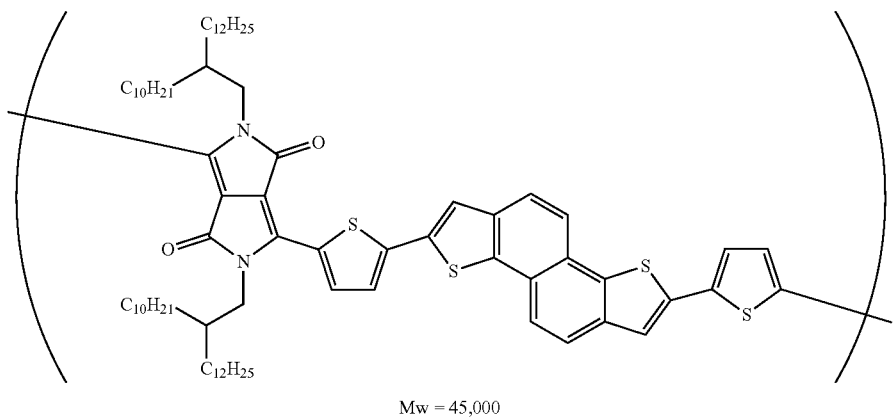
Mw = 45,000
Comparative Example Compound 8
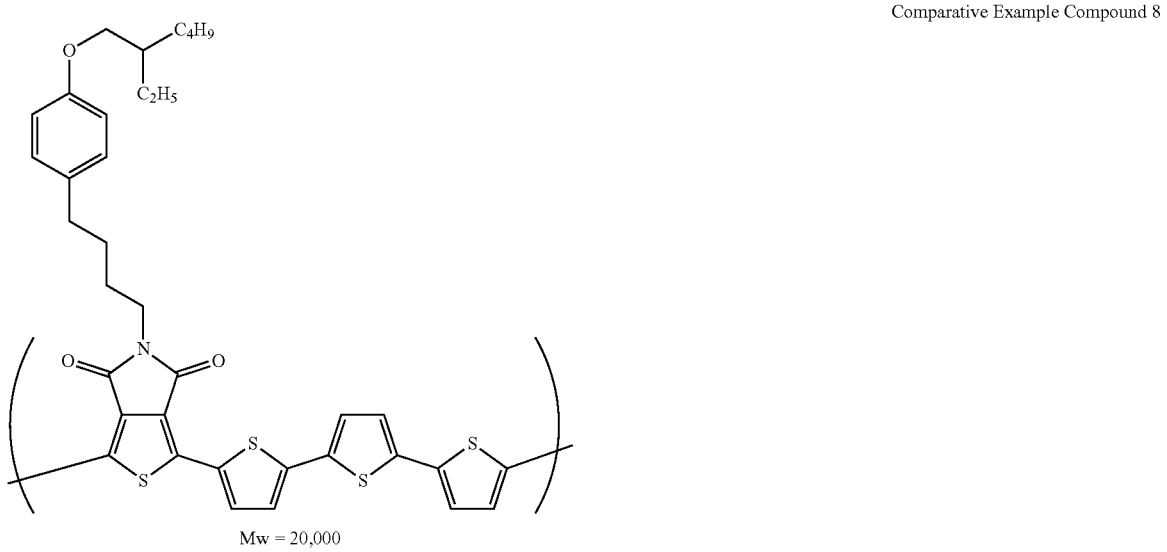
Mw = 20,000
Comparative Example Compound 9
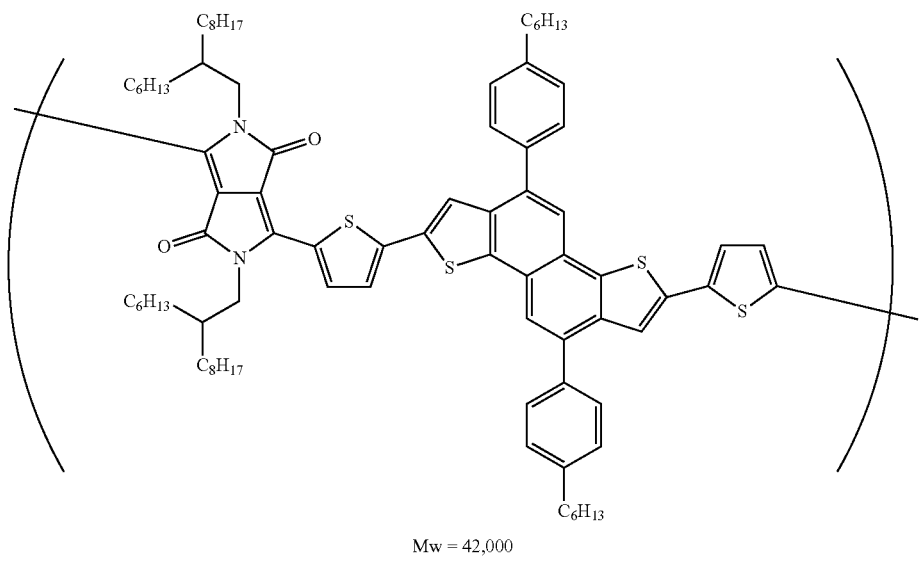
Mw = 42,000

89
Synthesis Example
The synthesis method follows the method of synthesizing a general D-A-type π conjugated polymer. As the representative examples, methods of synthesizing Example Compounds 5, 7 and 8 are provided.
90
Synthesis of Example Compound 5
Example Compound 5 was synthesized in the following scheme.
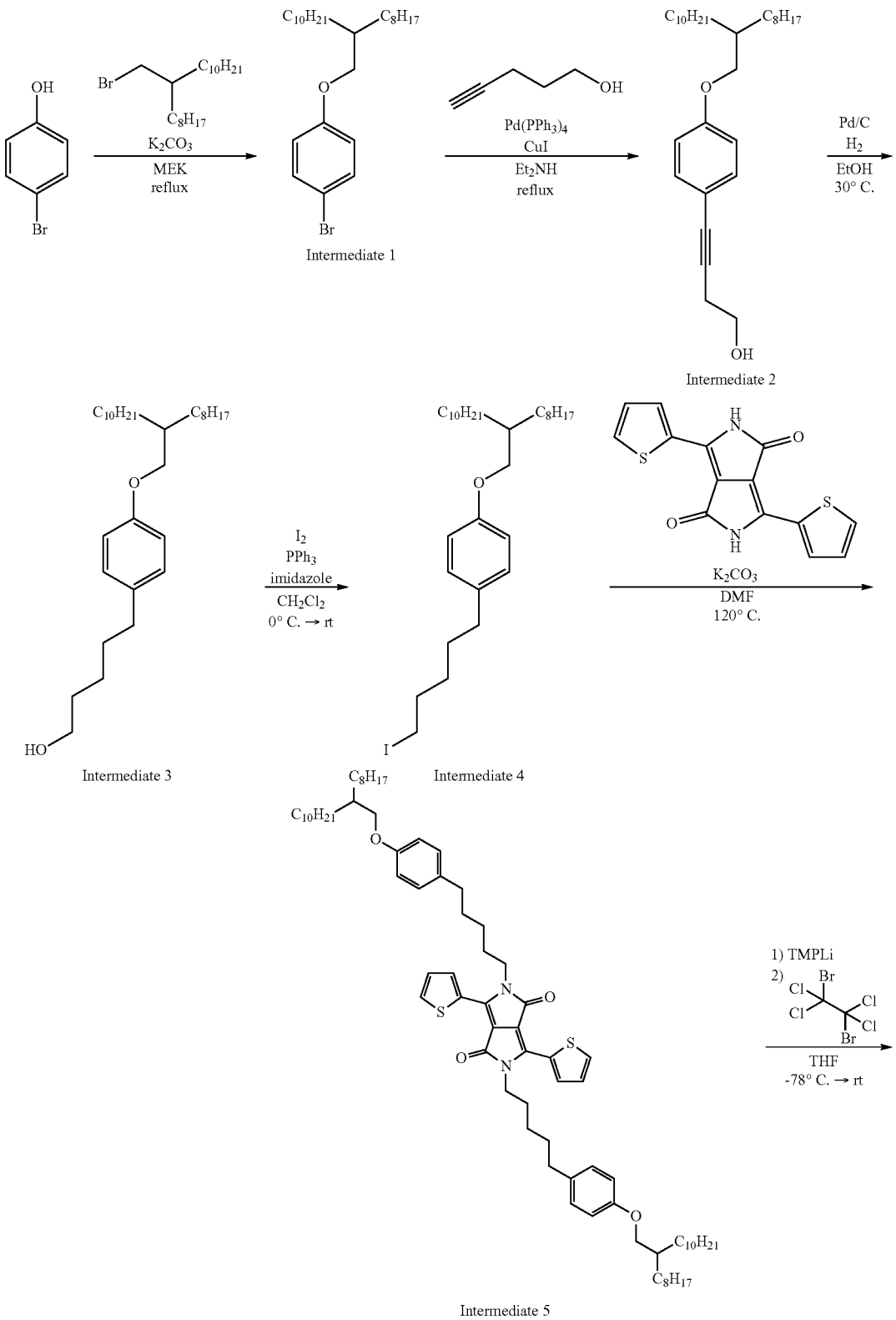

-continued

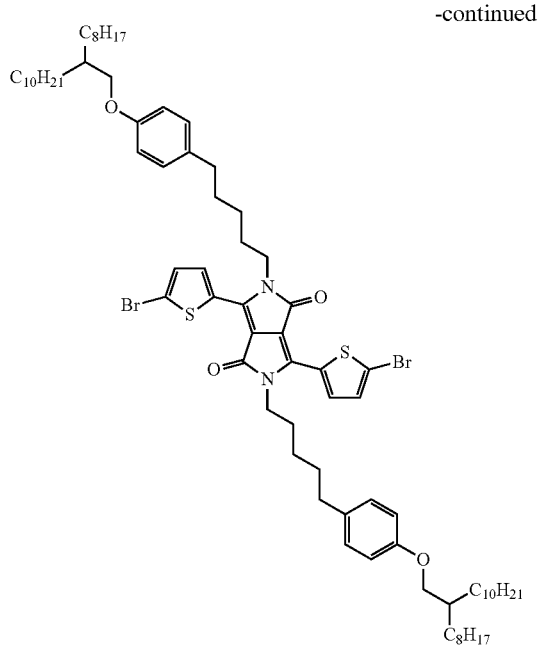

Intermediate 6

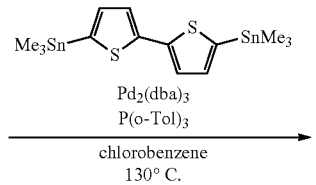

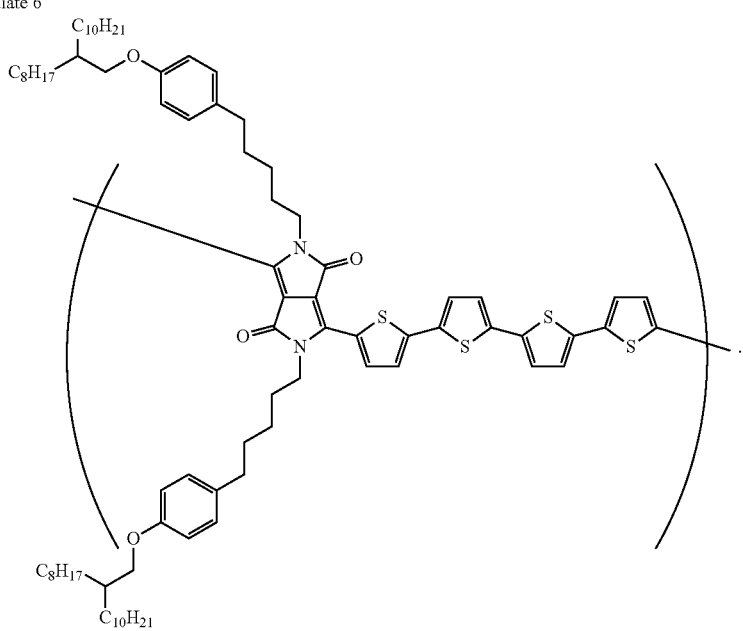

Example Compound 5

(Synthesis of Intermediate 1)

4-Bromophenol (41.6 g, 240 mmol), 2-octyl-1-dodecyl bromide (174 g, 480 mmol), potassium carbonate (100 g, 720 mmol), and methyl ethyl ketone (480 mL) were mixed and were stirred at 100° C. for 72 hours under the nitrogen atmosphere. The reaction solution was cooled to room temperature, filtration was performed through celite, and celite was washed with hexane. The filtrate was concentrated under reduced pressure, and the obtained crude product was purified by silica gel column chromatography (eluate: hexane) to obtain Intermediate 1 (80 g).

(Synthesis of Intermediate 2)

Intermediate 1 (30 g, 66 mmol), 4-pentyn-1-ol (18.3 mL, 198 mmol), copper iodide (630 mg, 3.3 mmol), diethylamine (90 mL), tetrakistriphenylphosphine palladium (1.9 g, 1.7 mmol) were mixed and stirred at 70° C. for four hours under nitrogen atmosphere. Ethyl acetate (200 mL) was added to the reaction solution, and filtration was performed through celite, so as to remove insoluble matter. The filtrate was concentrated under reduced pressure, and the obtained crude product was purified by silica gel column chromatography (eluate: hexane/ethyl acetate=4:1 to 1:1) to obtain Intermediate 2 (17.5 g).

(Synthesis of Intermediate 3)

Intermediate 2 (5.0 g, 11 mmol), 10 wt % Pd/C (3.6 g), and ethanol (25 mL) were mixed in an autoclave container. Hydrogen was charged at 0.9 Mpa and stirring was performed at 30° C. for four hours. The reaction vessel was returned to the atmosphere, the reaction solution was filtered through celite, and celite was washed with tetrahydrofuran.

The filtrate was concentrated under reduced pressure, and the obtained crude product was purified by silica gel column chromatography (eluate: hexane/ethyl acetate=4:1 to 2:1) to obtain Intermediate 3 (4.2 g).

(Synthesis of Intermediate 4)

Intermediate 4 (8.5 g, 18 mmol), imidazole (1.5 g, 22 mol), triphenylphosphine (5.8 g, 22 mol) and dichloromethane (54 mL) were mixed and were cooled to 0° C. under a nitrogen atmosphere. Iodine (5.6 g, 22 mol) was added in small portions. The temperature of the reaction solution was raised to room temperature, and stirring was performed for one hour. The reaction was stopped by adding an aqueous solution of sodium bisulfite, the solution was separated, and the aqueous layer was removed. The organic layer was dried on magnesium sulfate, filtration was performed, and vacuum concentration was performed. The obtained crude product was purified by silica gel column chromatography (eluate: hexane) to obtain Intermediate 4 (8.7 g).

(Synthesis of Intermediate 5)

3,6-di(2-thienyl)-2,5-dihydropyrrolo[3,4-c]pyrrole-1,4-dione (1.53 g, 5.1 mmol), N,N-dimethylformamide (75 mL) were mixed and stirred at 100° C. for one hour under a nitrogen atmosphere. Thereafter, Intermediate 4 (8.7 g, 15 mmol) was added, and the mixture was further stirred at 100° C. for six hours. The reaction solution was cooled to room temperature, filtration was performed through celite, and celite was washed with ethyl acetate. The filtrate was concentrated under reduced pressure, and the obtained crude product was purified by silica gel column chromatography (eluate: hexane/ethyl acetate=19:1 to 9:1) to obtain Intermediate 5 (3.2 g).

(Synthesis of Intermediate 6)

Under a nitrogen atmosphere, 2,2,6,6-tetramethylpiperidine (2.4 mL, 14 mmol) and dehydrated tetrahydrofuran (13 mL) were mixed and cooled to −78° C. 2.6 M of a normal butyllithium hexane solution (5.2 mL, 13 mmol) was added dropwise, and the temperature was raised to 0° C. to adjust a lithiation agent.

Under nitrogen atmosphere, Intermediate 5 (800 mg, 0.67 mmol) and dehydrated THF (3.6 mL) were mixed and cooled to −78° C. The lithiation agent (4.1 mL, corresponding to 4.2 mmol) adjusted above was added dropwise. After stirring was performed at −78° C. for one hour, 1,2-dibromo-1,1,2,2-tetrachloroethane (439 mg, 1.3 mmol) was added. Thereafter, the temperature of the reaction solution was raised to room temperature, stirring was performed for one hour, water was added, and the reaction was stopped. After the reaction solution was extracted with hexane, the organic layer was washed with 1 M of hydrochloric acid and saturated saline. The organic layer was dried on magnesium sulfate, filtration was performed, and vacuum concentration was performed. The obtained crude product was purified by silica gel column chromatography (eluate: hexane/ethyl acetate=19:1 to 9:1) to obtain Intermediate 6 (390 mg).

(Synthesis of Example Compound 5)

Synthesis Intermediate 6 (130 mg, 97 μmol), 5,5'-bis(trimethylstannyl)-2,2'-bithiophene (48 mg, 97 μmol), tri(o-tolyl)phosphine (2.4 mg, 7.7 μmol), tris(dibenzylideneacetone) dipalladium (1.8 mg, 1.9 μmol), and dehydrated chlorobenzene (3 mL) were mixed and stirred at 130° C. for 24 hours under nitrogen atmosphere. The reaction solution was cooled to room temperature and was introduced to a mixed solution of methanol (40 mL)/concentrated hydrochloric acid (2 mL) and stirred for two hours, and the precipitate was filtered and washed with methanol. The resulting crude product was sequentially subjected to Soxhlet extraction with methanol, acetone, and hexane, and soluble impurities were removed. Subsequently, Soxhlet extraction was performed with chlorobenzene, the obtained solution was subjected to vacuum concentration, methanol was added, the precipitated solid content was filtrated and washed with methanol, and vacuum drying was performed at 80° C. for 12 hours, so as to obtain Compound 5 (130 mg).

The number-average molecular weight in terms of polystyrene was $2.0 \times 10^4$, and the weight-average molecular weight thereof was $5.0 \times 10^4$.

Example Compound 7

Example Compound 7 was synthesized in the following scheme.

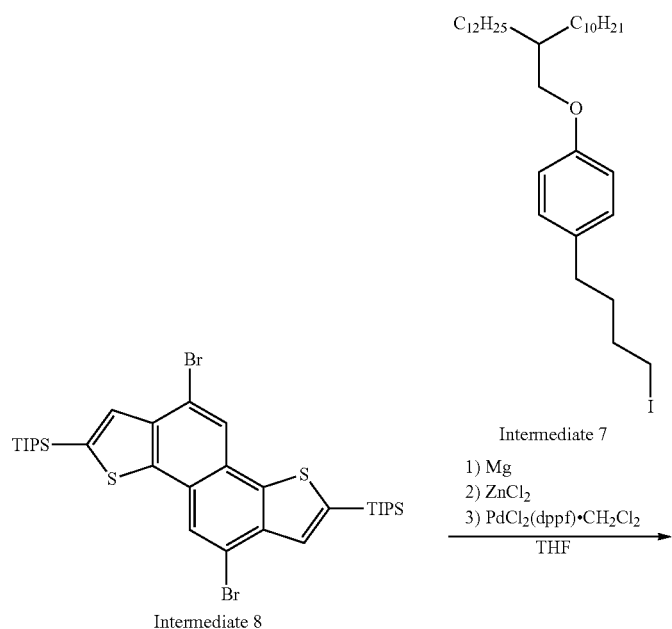

-continued
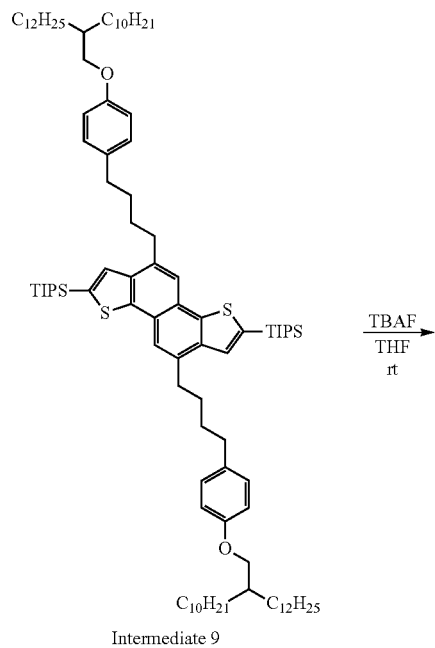
Intermediate 9
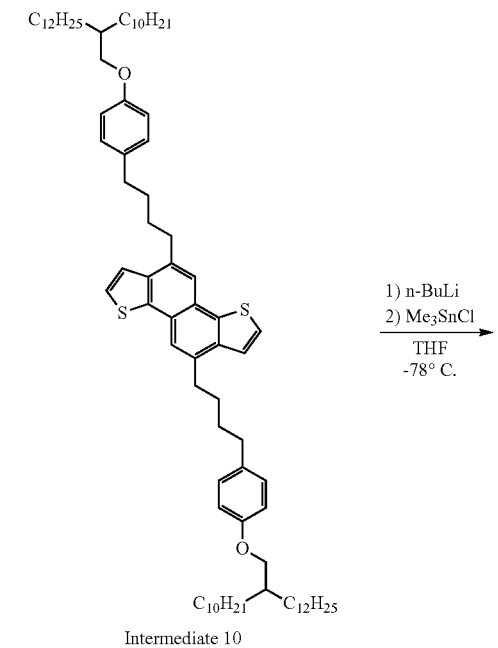
Intermediate 10
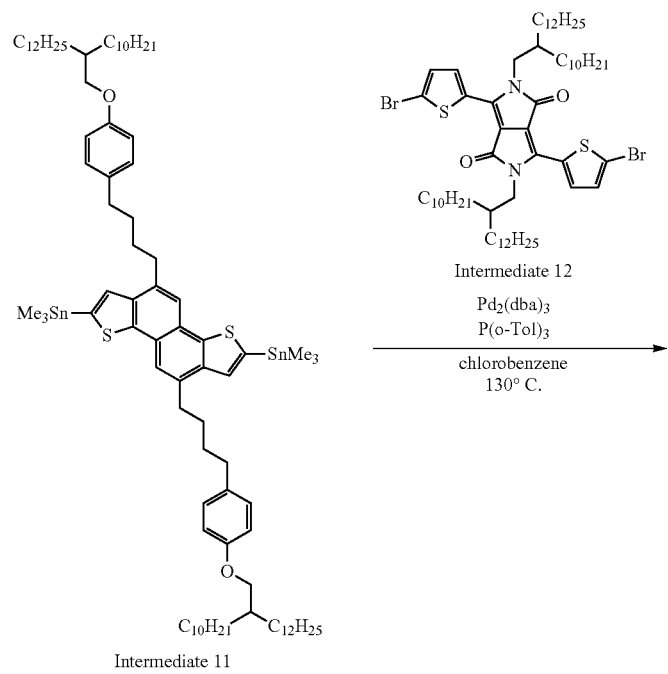
Intermediate 11

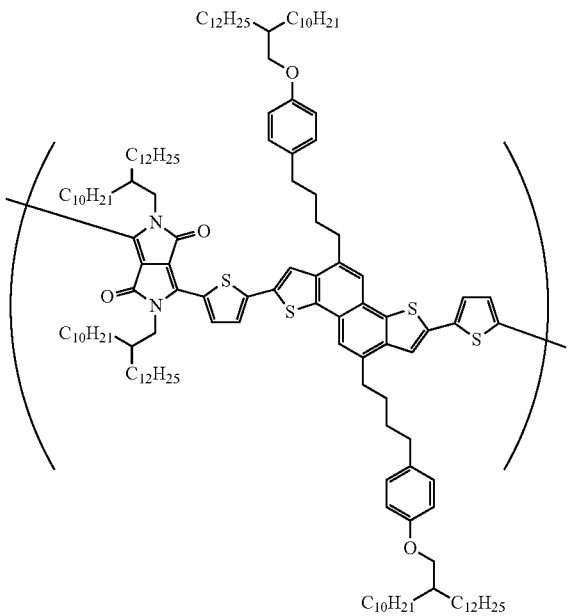

Example Compound 7

(Synthesis of Intermediate 7)

Intermediate 7 was synthesized in the same manner as Intermediate 4. That is, synthesis was performed in the same manner except for using 2-decyl-1-tetradecyl bromide instead of 2-octyl-1-dodecyl bromide and using 4-butyn-1-ol instead of 4-pentyn-1-ol.

(Synthesis of Intermediate 8)

Intermediate 8 was synthesized with reference to Organic Letters, 2012, 14, 4718-4721.

(Synthesis of Intermediate 9)

Magnesium (215 mg, 8.8 mmol), dehydrated tetrahydrofuran (1 mL), and iodine (1 fragment) were mixed under a nitrogen atmosphere and stirred at room temperature. A solution obtained by dissolving Intermediate 7 (5.2 g, 8.4 mmol) in tetrahydrofuran (7.4 mL) was added dropwise. After stirring was performed for one hour at room temperature, a 0.5 M zinc chloride tetrahydrofuran solution was further added dropwise, and was stirred for one hour at room temperature. Intermediate 8 (1.0 g, 1.4 mmol) and a [1,1'-bis(diphenylphosphino) ferrocene] palladium (II) dichloride dichloromethane adduct (115 mg, 0.14 mmol) were added and stirred at 75° C. for three hours. The reaction solution was filtrated through celite and silica gel and additionally washed with ethyl acetate. The filtrate was concentrated under reduced pressure to obtain Intermediate 9 (5 g). The obtained crude product was used in the subsequent reaction without purification.

(Synthesis of Intermediate 10)

Intermediate 9 (5 g) of crude product and tetrahydrofuran (50 mL) were mixed. A 1.0 M tetrabutylammonium fluoride tetrahydrofuran solution (14 mL, 14 mmol) was added and stirred at room temperature for 30 min. The reaction solution was filtered through silica gel and the silica gel was washed with ethyl acetate. The filtrate was concentrated under reduced pressure, the crude product was divided five times and purified by performing gel permeation chromatography (GPC) for preparative purification, so as to obtain Intermediate 10 (1.5 g).

(Synthesis of Intermediate 11)

Under a nitrogen atmosphere, Intermediate 10 (800 mg, 0.66 mmol), and dehydrated tetrahydrofuran (22 mL) were mixed and cooled to −78° C. A 2.6 M n-butyllithium hexane solution (1.0 mL, 2.6 mmol) was added dropwise, heated to room temperature, and stirred for 30 minutes. Thereafter, the mixture was cooled again to −78° C., and trimethyltin chloride (527 mg, 2.6 mmol) was added dropwise. The reaction solution was heated to room temperature and stirred for 90 minutes. Water was added, extraction was performed with chloroform, and the organic layer was washed with a 30 mass % sodium chloride aqueous solution. The organic layer was dried on magnesium sulfate, filtration was performed, and vacuum concentration was performed. The obtained crude product was purified by performing gel permeation chromatography (GPC) for preparative purification, so as to obtain Intermediate 11 (700 mg).

(Synthesis of Intermediate 12)

Intermediate 12 was synthesized with reference to Advanced Functional Materials, 2011, 21, 1910 to 1916.

(Synthesis of Example Compound 7)

Example Compound 7 was synthesized in the same manner as Example Compound 5. That is, synthesis was performed in the same manner except for using Intermediate 12 instead of Intermediate 6 and using Intermediate 11 instead of 5,5'-bis (trimethylstannyl)-2,2'-bithiophene.

The number-average molecular weight in terms of polystyrene was $2.0 \times 10^4$, and the weight-average molecular weight thereof was $5.3 \times 10^4$.

Example Compound 8
Example Compound 8 was synthesized in the following scheme.
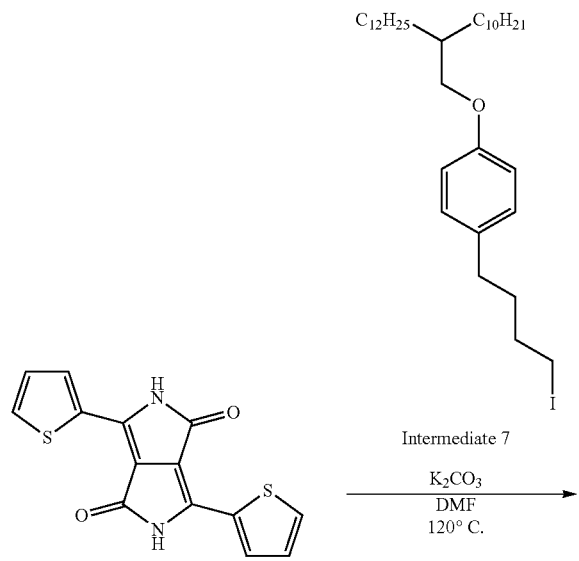
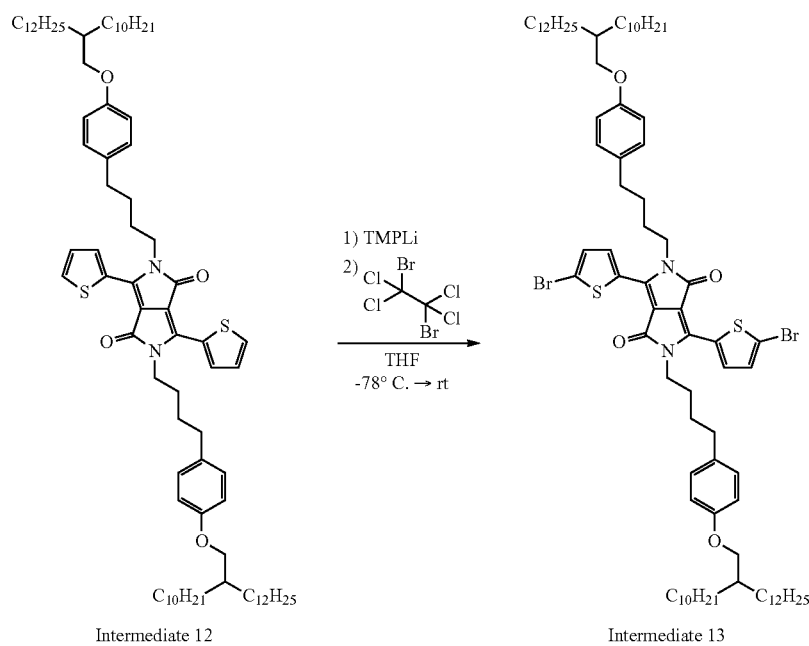
Intermediate 12
Intermediate 13

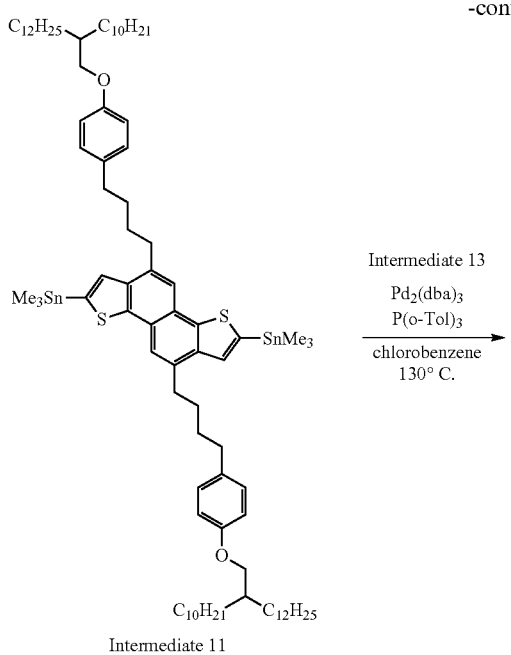

Intermediate 11

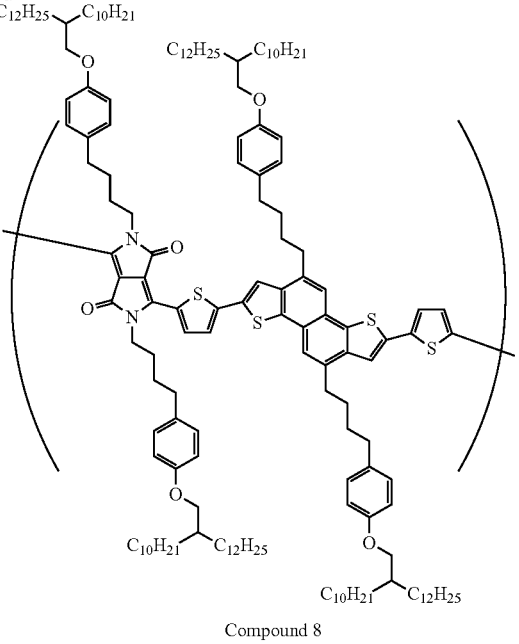

Compound 8

(Synthesis of Intermediate 12)

Intermediate 12 was synthesized in the same manner as Intermediate 5. That is, synthesis was performed in the same manner except for using Intermediate 7 instead of Intermediate 4.

(Synthesis of Intermediate 13)

Intermediate 13 was synthesized in the same manner as Intermediate 6.

(Synthesis of Example Compound 8)

Example Compound 8 was synthesized in the same manner as Example Compound 5. That is, synthesis was performed in the same manner except for using Intermediate 13 instead of Intermediate 6 and using Intermediate 11 instead of 5,5'-bis (trimethylstannyl)-2,2'-bithiophene.

The number-average molecular weight in terms of polystyrene was $2.6 \times 10^4$, and the weight-average molecular weight thereof was $8.9 \times 10^4$.

Comparative Compound 1 was a compound disclosed in JP2010-527327A, Comparative Compound 2 was a compound disclosed in JP2007-516315A, Comparative Compounds 3 and 4 were compounds disclosed in JP2011-501743A, Comparative Compound 5 was a compound disclosed in JP2009-541548A, Comparative Compound 6 was a compound disclosed in JP2014-237733A (Patent Document 1 above), Comparative Compound 7 was a compound disclosed in JP2012-131938A, and Comparative Compound 9 was a compound disclosed in Macromolecular Rapid Communications, 2014, 35, 1886 to 1889. Comparative Compound 8 was synthesized by with reference to JP2010-527327A.

<Preparation of Organic Semiconductor Composition>

Example Compound 1 presented in Table 1 (0.20 mass %)/1,2-dichlorobenzene was weighed on a glass vial, mixing under stirring was performed for 24 hours with a mix rotor (manufactured by AS ONE Corporation), and filtration was performed with a 0.5 μm membrane filter, so as to obtain Organic Semiconductor Composition 1.

Organic Semiconductor Compositions 2 to 16 and Comparative Organic Semiconductor Compositions 1 to 9 were respectively prepared in the same manner except for using any one of Example Compounds 2 to 16 or Comparative Compounds 1 to 9 instead of Compound 1.

<Preparation of Organic Thin Film Transistor (Organic TFT) Element>

Al that became a gate electrode was vapor-deposited on the glass substrate (EAGLE XG: manufactured by Corning Incorporated) (Thickness: 50 nm). Spin coating was performed with a composition for forming a gate insulating film (a propylene glycol monomethyl ether acetate (PGMEA) solution (concentration of solid content: 2 mass %) in which polyvinylphenol/2,4,6,-tris[bis(methoxymethyl) amino]-1,3, 5-triazine=1 part by mass/1 part by mass (w/w)), and the gate insulating film having a film thickness of 400 nm was formed by performing baking at 150° C. for 60 minutes. Shapes of source electrodes and drain electrodes (channel length: 60 μm, channel width: 200 μm) were drawn thereon, with silver ink (silver nano-colloid H-1, manufactured by Mitsubishi Materials Corporation) by using an ink jet device DMP-2831 (manufactured by Fujifilm Corporation). Thereafter, baking was performed in an oven at 180° C. for 30 minutes, sintering was performed, and source electrodes and drain electrodes were formed, so as to obtain an element substrate for TFT characteristic evaluation.

In a nitrogen glove box, spin coating was performed on the element substrate for TFT characteristic evaluation with Organic Semiconductor Composition 1 prepared above (for 10 seconds at 500 rpm and for 30 seconds at 1,000 rpm), and drying was performed on a hot plate at 150° C. for one hour, so as to form an organic semiconductor layer such that a bottom gate bottom contact-type organic TFT element (hereinafter, also referred to as an "element") 1 was obtained.

Each of Elements 2 to 16 and Comparative Elements 1 to 9 was prepared in the method of manufacturing Element 1 except for using any one of Organic Semiconductor Compositions 2 to 16 or Comparative Organic Semiconductor Compositions 1 to 9 instead of Organic Semiconductor Composition 1. Elements 1 to 16 and Comparative Elements 1 to 9 obtained were organic TFT elements of Examples 1 to 16 and Comparative Examples 1 to 9.

<Characteristics Evaluation>

The characteristic evaluation was performed under the atmosphere on respective organic TFT elements (Elements 1 to 16 and Comparative Elements 1 to 9), by using a semiconductor characteristic evaluating device B2900A (manufactured by Agilent Technologies, Inc.).

(a) Carrier Mobility

Carrier mobility μ was calculated by applying a voltage of −40 V between source electrodes-drain electrodes of the respective organic TFT elements (Elements 1 to 13 and Comparative Elements 1 to 6), changing a gate voltage in the range of +10 V to −60 V, and using an equation below indicating a drain current $I_d$, so as to evaluate the following seven steps.

$$I_d = (w/2L)\mu C_i (V_g - V_{th})^2$$

In the equation, L represents a gate length, w represents a gate width, $C_i$ represents the capacitance per unit area of the insulating layer, $V_g$ represents a gate voltage, and $V_{th}$ represents a threshold voltage.

The obtained results are shown in the following table.

"S": 0.25 cm²/Vs or greater
"AA": 0.2 cm²/Vs or greater and less than 0.25 cm²/Vs
"A": 0.1 cm²/Vs or greater and less than 0.2 cm²/Vs
"B": 0.05 cm²/Vs or greater and less than 0.1 cm²/Vs
"C": 0.02 cm²/Vs or greater and less than 0.05 cm²/Vs
"D": $10^{-4}$ cm²/Vs or greater and less than 0.02 cm²/Vs
"E": Less than $10^{-4}$ cm²/Vs As the carrier mobility μ is higher, the carrier mobility μ is more preferable. In practice, it is required to be "C" or greater, preferably "B" or greater, and more preferably "A" or greater.

(b) Temporal Stability Under High Temperature and High Humidity

In the carrier mobility test, after the respective organic TFT elements (Elements 1 to 16 and Comparative Elements 1, 4, 5, 7, 8, and 9) in which carrier mobility was $10^{-4}$ cm²/Vs or greater were stored at 70° C. in the humidity of 80% or less for 24 hours, carrier mobility maintenance ratio (in the following equation) in a case where carrier mobility was measured in the same method as "(a) Carrier mobility" was evaluated in the following five levels, so as to obtain an index of temporal stability under high temperature and high humidity. As this value becomes greater, temporal stability under high temperature and high humidity becomes higher. In practice, "B" or greater is preferable, and "A" or greater is more preferable.

Carrier mobility maintenance ratio (%) after storage under high temperature and high humidity = {Carrier mobility (after storage under high temperature and high humidity)/carrier mobility (before storage under high temperature and high humidity)} × 100

"A": 90% or greater
"B": 75% or greater and less than 90%
"C": 50% or greater and less than 75%
"D": 25% or greater and less than 50%

TABLE 1

| | | Organic semiconductor compound | | | | | | Evaluation | |
| | | | | | | | | Temporal stability | |
| | | | Weight- | Formula (1-1) | | | | | |
| | | | average molecular weight (Mw) | Number of carbon atoms in each $L_b$ in D | Number of carbon atoms in each $L_b$ in A | Kind of acceptor (A) | Formulae (2) to (5) | Carrier mobility (cm²/Vs) | under high temperature and high humidity (%) |
| | Organic TFT element | Kind | | | | | | | |
| --- | --- | --- | --- | --- | --- | --- | --- | --- | --- |
| Example 1 | Element 1 | Example Compound 1 | 35,000 | 10, 10 | — | Formula (A-1) | Formula (2) | C | A |
| Example 2 | Element 2 | Example Compound 2 | 45,000 | — | 20 | Formula (A-1) | Formula (2) | A | A |
| Example 3 | Element 3 | Example Compound 3 | 38,000 | — | 16 | Formula (A-1) | Formula (2) | B | B |
| Example 4 | Element 4 | Example Compound 4 | 65,000 | — | 10, 10 | Formula (A-2) | — | C | A |
| Example 5 | Element 5 | Example Compound 5 | 50,000 | — | 20, 20 | Formula (A-3) | Formula (3) | S | A |
| Example 6 | Element 6 | Example Compound 6 | 48,000 | — | 24, 24 | Formula (A-3) | Formula (3) | S | A |
| Example 7 | Element 7 | Example Compound 7 | 53,000 | 24, 24 | — | Formula (A-3) | Formula (3) | AA | A |
| Example 8 | Element 8 | Example Compound 8 | 89,000 | 24, 24 | 24, 24 | Formula (A-3) | Formula (3) | A | A |
| Example 9 | Element 9 | Example Compound 9 | 45,000 | — | 20, 20 | Formula (A-3) | Formula (3) | S | A |
| Example 10 | Element 10 | Example Compound 10 | 63,000 | 10, 10 | — | Formula (A-4) | — | C | B |
| Example 11 | Element 11 | Example Compound 11 | 114,000 | — | 16, 16, 6, 6 | Formula (A-5) | Formula (4) | A | A |
| Example 12 | Element 12 | Example Compound 12 | 74,000 | — | 20, 20 | Formula (A-6) | Formula (5) | AA | A |
| Example 13 | Element 13 | Example Compound 13 | 87,000 | 9, 9 | — | Formula (A-8) | — | C | B |
| Example 14 | Element 14 | Example Compound 14 | 125,000 | 9, 9 | — | Formula (A-9) | — | C | B |
| Example 15 | Element 15 | Example Compound 15 | 25,000 | — | 20, 20 | Formula (A-10) | — | C | A |

TABLE 1-continued

| | | | | Organic semiconductor compound | | | | | Evaluation | |
|---|---|---|---|---|---|---|---|---|---|---|
| | | | Weight- | Formula (1-1) | | | | | | Temporal stability |
| | Organic TFT element | Kind | average molecular weight (Mw) | Number of carbon atoms in each $L_b$ in D | Number of carbon atoms in each $L_b$ in A | Kind of acceptor (A) | Formulae (2) to (5) | Carrier mobility (cm$^2$/Vs) | under high temperature and high humidity (%) |
| Example 16 | Element 16 | Example Compound 16 | 91,000 | 20, 20 | — | Formula (A-12) | — | C | A |
| Comparative Example 1 | Comparative Element 1 | Comparative Example Compound 1 | 35,000 | — | — | Formula (A-1) | Formula (2) | D | D |
| Comparative Example 2 | Comparative Element 2 | Comparative Example Compound 2 | 1,200 | — | — | Formula (A-3) | Formula (3) | E | — |
| Comparative Example 3 | Comparative Element 3 | Comparative Example Compound 3 | 1,200 | — | — | Formula (A-3) | — | E | — |
| Comparative Example 4 | Comparative Element 4 | Comparative Example Compound 4 | 1,300 | — | — | Formula (A-3) | — | D | D |
| Comparative Example 5 | Comparative Element 5 | Comparative Example Compound 5 | 13,000 | — | — | Formula (A-3) | — | C | C |
| Comparative Example 6 | Comparative Element 6 | Comparative Example Compound 6 | 12,000 | — | 8, 8, 8, 8 | — | — | E | — |
| Comparative Example 7 | Comparative Element 7 | Comparative Example Compound 7 | 45,000 | — | — | Formula (A-3) | Formula (3) | C | C |
| Comparative Example 8 | Comparative Element 8 | Comparative Example Compound 8 | 20,000 | — | 8 | Formula (A-1) | Formula (2) | C | C |
| Comparative Example 9 | Comparative Element 9 | Comparative Example Compound 9 | 42,000 | — | — | Formula (A-3) | Formula (3) | C | C |

As presented in the results in Table 1, it was found that the organic TFT elements of the examples have excellent carrier mobility and excellent temporal stability under high temperature and high humidity.

According to the comparison between Examples 2 and 3, since the number of carbon atoms in the "$L_b$" group of Formula (1-1) is 20 or greater (Example 2), it was presented that the carrier mobility and the temporal stability under high temperature and high humidity became excellent.

From the comparison between Examples 2 and 5, in a case where two or more monovalent groups represented by Formula (1-1) in the repeating unit represented by Formula (1) were included (Example 5), it was presented that the carrier mobility becomes excellent.

According to the comparison of Examples 6 to 8, in a case where a monovalent group represented by Formula (1-1) was included only in the electron acceptor unit side (Example 6), it was presented that the carrier mobility became excellent.

On the other hand, it was presented that, in any one of the organic TFT elements of Comparative Examples 1 and 2 not having a monovalent group represented by Formula (1-1), carrier mobility and temporal stability under high temperature and high humidity were not be satisfactory.

It was presented that, in any one of the organic TFT elements of Comparative Examples 3 and 4 not having a monovalent group represented by Formula (1-1) and having a molecular weight of less than 2,000, carrier mobility and temporal stability under high temperature and high humidity were not be satisfactory.

On the other hand, it was presented that the organic TFT element of Comparative Example 5 not having a monovalent group represented by Formula (1-1) did not have satisfactory temporal stability under high temperature and high humidity.

It was presented that the organic TFT element of Comparative Example 6 using the D-A-type polymer obtained by introducing the substituent having the "$L_b$" group of Formula (1-1) and having less than 9 carbon atoms did not have satisfactory carrier mobility and temporal stability under the high temperature and high humidity.

On the other hand, it was presented that the organic TFT element of Comparative Example 7 not having a monovalent group represented by Formula (1-1) did not have satisfactory temporal stability under high temperature and high humidity.

It was presented that the organic TFT element of Comparative Example 8 using the D-A-type polymer obtained by introducing the substituent having the "$L_b$" group of Formula (1-1) and having less than 9 carbon atoms did not have satisfactory temporal stability under the high temperature and high humidity.

On the other hand, it was presented that the organic TFT element of Comparative Example 9 not having a monovalent group represented by Formula (1-1) did not have satisfactory temporal stability under high temperature and high humidity.

EXPLANATION OF REFERENCES

10: substrate
20: gate electrode

30: gate insulating film
40: source electrode
42: drain electrode
50: organic semiconductor film
60: sealing layer
100, 200: organic thin film transistor

What is claimed is:
1. An organic semiconductor element comprising:
a compound having a molecular weight of 2,000 or greater and having a repeating unit represented by Formula (1),

$$\text{\textendash}(D\text{-}A)\text{\textendash} \quad (1)$$

in Formula (1), A represents an electron acceptor unit including a partial structure having at least one of a sp2 nitrogen atom, a carbonyl group, or a thiocarbonyl group in a ring structure,
D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure, and
at least one of D or A has at least one monovalent group represented by Formula (1-1), $$*\text{-}C_a\text{-}L_a\text{-}Ar\text{-}(L_b)_l \quad (1\text{-}1)$$

in Formula (1-1), Ar represents an aromatic heterocyclic group or an aromatic hydrocarbon group having 5 to 18 carbon atoms,
$C_a$ represents $CR^1R^2$,
$L_a$ represents an alkylene group having 1 to 20 carbon atoms that may contain at least one of —O—, —S—, or —NR$^3$—,
$L_b$ represents an alkyl group having 9 or more carbon atoms that may contain at least one of —O—, —S—, or —NR$^4$—,
$R^1$ to $R^4$ each independently represent a hydrogen atom or a substituent,
l represents an integer of 1 to 5, in a case where l is 2 or greater, a plurality of $L_b$'s may be identical to as or different from each other, and
* represents a bonding site to another structure.
2. The organic semiconductor element according to claim 1,
wherein, in -($L_b$)$_l$ in Formula (1-1), the number of carbon atoms of at least one $L_b$ is 20 to 100.
3. The organic semiconductor element according to claim 1,
wherein A in Formula (1) has at least one structure selected from the group consisting of structures represented by Formulae (A-1) to (A-12), as a partial structure,

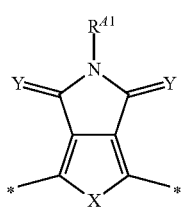
(A-1)

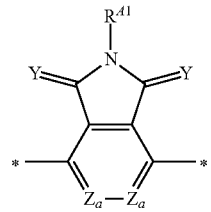
(A-2)

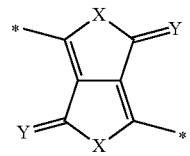
(A-3)

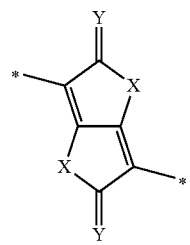
(A-4)

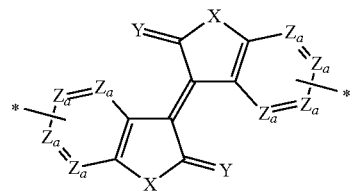
(A-5)

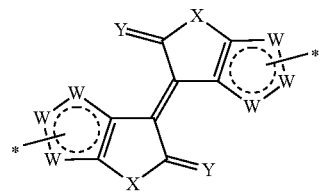
(A-6)

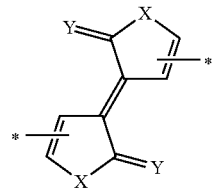
(A-7)

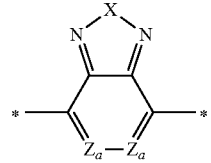
(A-8)

-continued

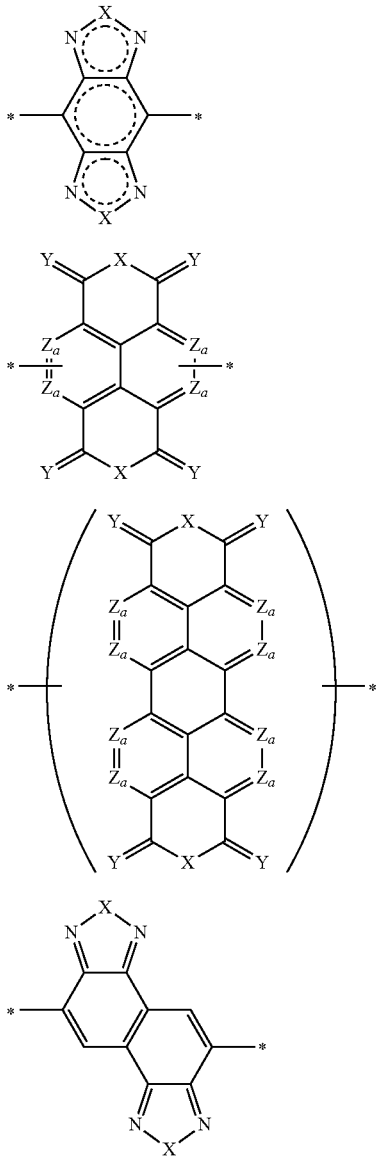

(A-9)

(A-10)

(A-11)

(A-12)

in Formulae (A-1) to (A-12), X's each independently represent an O atom, a S atom, a Se atom, or NR$^{A1}$,
Y's each independently represent an O atom or a S atom,
Z$_a$'s each independently represent CR$^{A2}$ or a N atom,
W's each independently represent C(R$^{A2}$)$_2$, NR$^{A1}$, a N atom, CR$^{A2}$, an O atom, a S atom, or a Se atom,
R$^{A1}$'s each independently represent an alkyl group that may contain at least one of —O—, —S—, or —NR$^{A3}$—, the monovalent group represented by Formula (1-1), or a bonding site to another structure,
R$^{A2}$'s each independently represent a hydrogen atom, a halogen atom, an alkyl group that may contain at least one of —O—, —S—, or —NR$^{A3}$—, or a bonding site to another structure,
R$^{A3}$'s each independently represent a hydrogen atom or a substituent, and
*'s each independently represent a bonding site to another structure.

4. The organic semiconductor element according to claim 1, wherein D in Formula (1) is a structure represented by Formula (D-1),

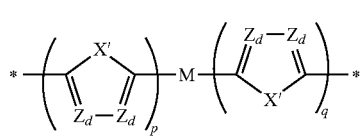

(D-1)

in Formula (D-1), X″s each independently represent O, S, Se, or NR$^{D1}$, R$^{D1}$'s each independently represent a monovalent organic group that may be the monovalent group represented by Formula (1-1),
Z$_d$'s each independently represent N or CR$^{D2}$, R$^{D2}$'s each independently represent a hydrogen atom or a monovalent organic group that may be the monovalent group represented by Formula (1-1),
M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —NR$^{D3}$— or the monovalent group represented by Formula (1-1), R$^{D3}$'s each independently represent a hydrogen atom or a substituent,
p and q each independently represent an integer of 0 to 4, and
*'s each independently represent a bonding site to another structure.

5. The organic semiconductor element according to claim 1,
wherein the repeating unit represented by Formula (1) is a repeating unit represented by any one of Formulae (2) to (5),

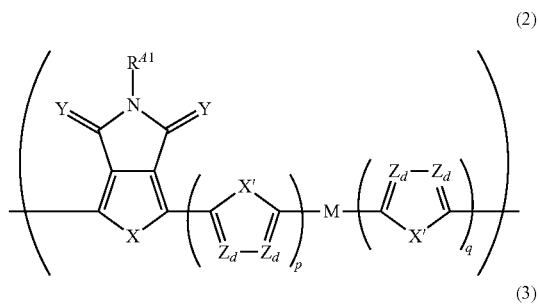

(2)

(3)

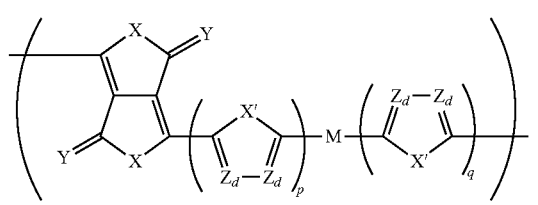

(4)

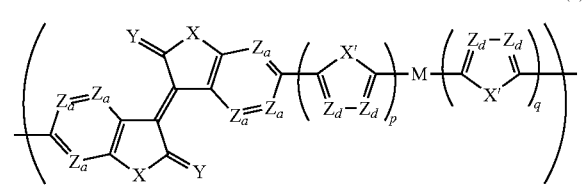

-continued (5)

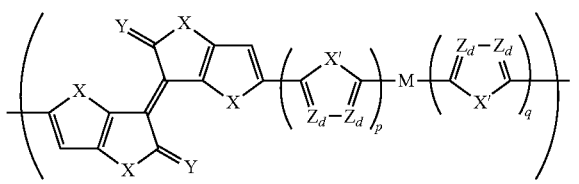

in Formulae (2) to (5), X's each independently represent an O atom, a S atom, a Se atom, or $NR^{A1}$, $R^{A1}$'s each independently represent an alkyl group that may contain at least one of —O—, —S—, or —$NR^{A3}$—, the monovalent group represented by Formula (1-1), or a bonding site to another structure, Y's each independently represent an O atom or a S atom, $Z_a$'s each independently represent $CR^{A2}$ or a N atom, $R^{A2}$'s each independently represent a hydrogen atom, a halogen atom, an alkyl group that may contain at least one of —O—, —S—, or —$NR^{A3}$—, or a bonding site to another structure, $R^{A3}$'s each independently represent a hydrogen atom or a substituent, X"s each independently represent O, S, Se, or $NR^{D1}$, $R^{D1}$'s each independently represent a monovalent organic group that may be the monovalent group represented by Formula (1-1), $Z_d$'s each independently represent N or $CR^{D2}$, $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —$NR^{D3}$— or the monovalent group represented by Formula (1-1), $R^{D3}$'s each independently represent a hydrogen atom or a substituent, and p and q each independently represent an integer of 0 to 4.

6. The organic semiconductor element according to claim 3,
   wherein Formulae (A-1) to (A-12) each have at least one of $R^{A1}$ or $R^{A2}$, and
   wherein at least one of $R^{A1}$ or $R^{A2}$ in each formula is the monovalent group represented by Formula (1-1).

7. The organic semiconductor element according to claim 5,
   wherein Formulae (2) to (5) each have at least one of $R^{A1}$ or $R^{A2}$, and
   wherein at least one of $R^{A1}$ or $R^{A2}$ in each formula is the monovalent group represented by Formula (1-1).

8. A compound having a molecular weight of 2,000 or greater and having a repeating unit represented by Formula (1),
   wherein A in Formula (1) has at least one structure selected from the group consisting of structures represented by Formulae (A-1) to (A-12), as a partial structure,

─(-D-A-)─     (1)

in Formula (1), A represents an electron acceptor unit including a partial structure having at least one of a sp2 nitrogen atom, a carbonyl group, or a thiocarbonyl group in a ring structure, D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure, and at least one of D or A has at least one monovalent group represented by Formula (1-1),

*-$C_a$-$L_a$-Ar-($L_b$)$_l$     (1-1)

in Formula (1-1), Ar represents an aromatic heterocyclic group or an aromatic hydrocarbon group having 5 to 18 carbon atoms, $C_a$ represents $CR^1R^2$, $L_a$ represents an alkylene group having 1 to 20 carbon atoms that may contain at least one of —O—, —S—, or —$NR^3$—, $L_b$ represents an alkyl group having 9 or more carbon atoms that may contain at least one of —O—, —S—, or —$NR^4$—, $R^1$ to $R^4$ each independently represent a hydrogen atom or a substituent, l represents an integer of 1 to 5, in a case where l is 2 or greater, a plurality of $L_b$'s may be identical to as or different from each other, and

* represents a bonding site to another structure,

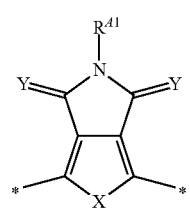

(A-1)

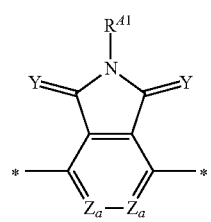

(A-2)

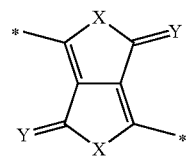

(A-3)

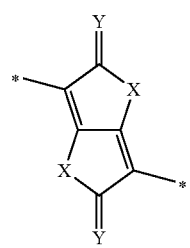

(A-4)

-continued (A-5) 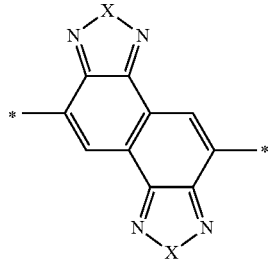

(A-6)

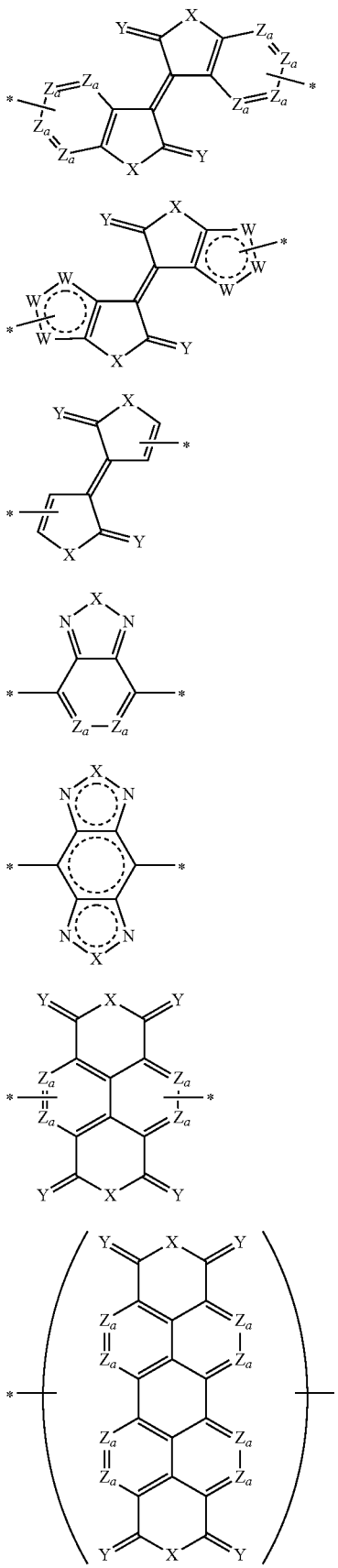

(A-7)

(A-8)

(A-9)

(A-10)

(A-11)

(A-12)

in Formulae (A-1) to (A-12), X's each independently represent an O atom, a S atom, a Se atom, or $NR^{A1}$, Y's each independently represent an O atom or a S atom, $Z_a$'s each independently represent $CR^{A2}$ or a N atom, W's each independently represent $C(R^{A2})_2$, $NR^{A1}$, a N atom, $CR^{A2}$, an O atom, a S atom, or a Se atom, $R^{A1}$'s each independently represent an alkyl group that may contain at least one of —O—, —S—, or —$NR^{A3}$—, the monovalent group represented by Formula (1-1), or a bonding site to another structure, $R^{A2}$'s each independently represent a hydrogen atom, a halogen atom, an alkyl group that may contain at least one of —O—, —S—, or —$NR^{A3}$—, or a bonding site to another structure, $R^{A3}$'s each independently represent a hydrogen atom or a substituent, and

*'s each independently represent a bonding site to another structure.

9. The compound according to claim 8,
wherein the repeating unit represented by Formula (1) is a repeating unit represented by any one of Formulae (2) to (5), (2)

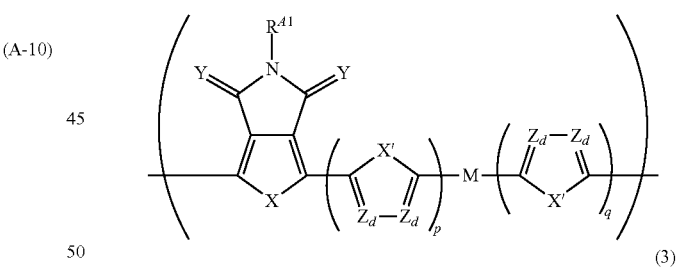

(3)

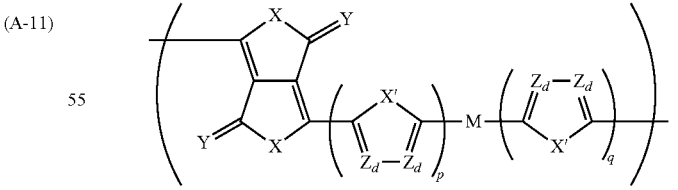

(4)

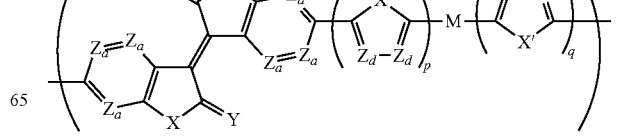

-continued

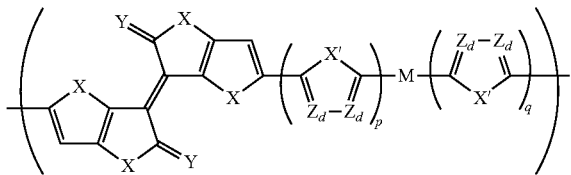
(5)

in Formulae (2) to (5), X's each independently represent an O atom, a S atom, a Se atom, or $NR^{41}$, $R^{41}$'s each independently represent an alkyl group that may contain at least one of —O—, —S—, or —$NR^{43}$—, the monovalent group represented by Formula (1-1), or a bonding site to another structure, Y's each independently represent an O atom or a S atom, $Z_a$'s each independently represent $CR^{42}$ or a N atom, $R^{42}$'s each independently represent a hydrogen atom, a halogen atom, an alkyl group that may contain at least one of —O—, —S—, or —$NR^{43}$—, or a bonding site to another structure, $R^{43}$'s each independently represent a hydrogen atom or a substituent, X"s each independently represent O, S, Se, or $NR^{D1}$, $R^{D1}$'s each independently represent a monovalent organic group that may be the monovalent group represented by Formula (1-1), $Z_d$'s each independently represent N or $CR^{D2}$, $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —$NR^{D3}$— or the monovalent group represented by Formula (1-1), $R^{D3}$'s each independently represent a hydrogen atom or a substituent, and p and q each independently represent an integer of 0 to 4.

10. An organic semiconductor composition comprising:
a compound having a molecular weight of 2,000 or greater and having a repeating unit represented by Formula (1); and
a solvent, $$-(D-A)-\quad (1)$$

in Formula (1), A represents an electron acceptor unit including a partial structure having at least one of a sp2 nitrogen atom, a carbonyl group, or a thiocarbonyl group in a ring structure, D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure, and at least one of D or A has at least one monovalent group represented by Formula (1-1), $$*-C_a-L_a-Ar(-L_b)_l \quad (1\text{-}1)$$

in Formula (1-1), Ar represents an aromatic heterocyclic group or an aromatic hydrocarbon group having 5 to 18 carbon atoms, $C_a$ represents $CR^1R^2$, $L_a$ represents an alkylene group having 1 to 20 carbon atoms that may contain at least one of —O—, —S—, or —$NR^3$—, $L_b$ represents an alkyl group having 9 or more carbon atoms that may contain at least one of —O—, —S—, or —$NR^4$—, $R^1$ to $R^4$ each independently represent a hydrogen atom or a substituent, l represents an integer of 1 to 5, in a case where l is 2 or greater, a plurality of $L_b$'s may be identical to as or different from each other, and

* represents a bonding site to another structure.

11. A method of manufacturing an organic semiconductor film, comprising:
a coating step of coating a substrate with the organic semiconductor composition according to claim 10.

12. The organic semiconductor element according to claim 2,
wherein A in Formula (1) has at least one structure selected from the group consisting of structures represented by Formulae (A-1) to (A-12), as a partial structure,

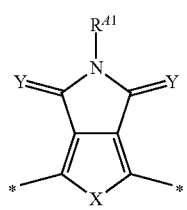
(A-1)

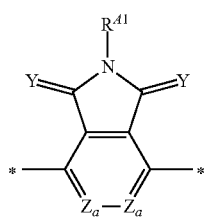
(A-2)

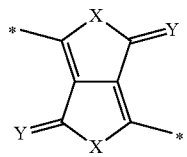
(A-3)

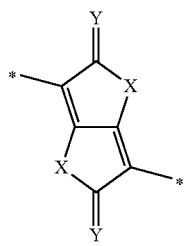
(A-4)

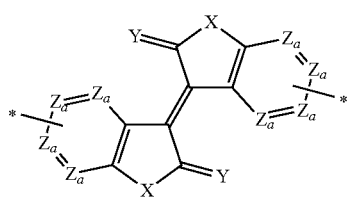
(A-5)

-continued (A-6)

(A-7)

(A-8)

(A-9)

(A-10)

(A-11)

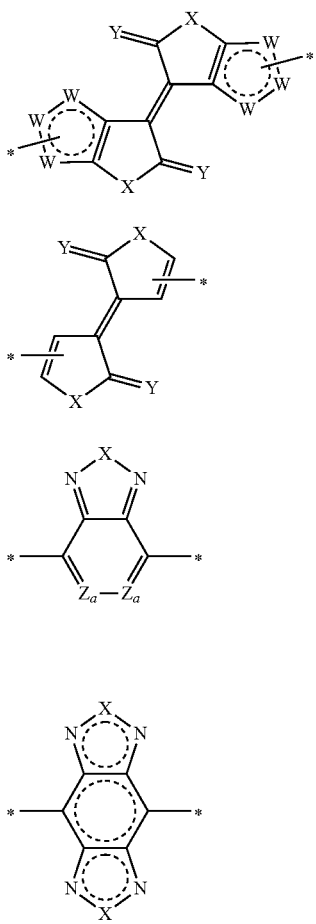

-continued (A-12)

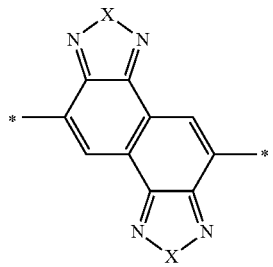

in Formulae (A-1) to (A-12), X's each independently represent an O atom, a S atom, a Se atom, or $NR^{A1}$, Y's each independently represent an O atom or a S atom, $Z_a$'s each independently represent $CR^{A2}$ or a N atom, W's each independently represent $C(R^{A2})_2$, $NR^{A1}$, a N atom, $CR^{A2}$, an O atom, a S atom, or a Se atom, $R^{A1}$'s each independently represent an alkyl group that may contain at least one of —O—, —S—, or —$NR^{A3}$—, the monovalent group represented by Formula (1-1), or a bonding site to another structure, $R^{A2}$'s each independently represent a hydrogen atom, a halogen atom, an alkyl group that may contain at least one of —O—, —S—, or —$NR^{A3}$—, or a bonding site to another structure, $R^{A3}$'s each independently represent a hydrogen atom or a substituent, and

*'s each independently represent a bonding site to another structure.

13. The organic semiconductor element according to claim 2,
wherein D in Formula (1) is a structure represented by Formula (D-1),

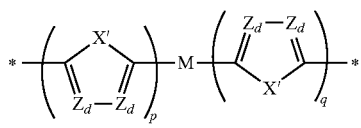

(D-1)

in Formula (D-1), X'''s each independently represent O, S, Se, or $NR^{D1}$, $R^{D1}$'s each independently represent a monovalent organic group that may be the monovalent group represented by Formula (1-1), $Z_d$'s each independently represent N or $CR^{D2}$, $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —$NR^{D3}$— or the monovalent group represented by Formula (1-1), $R^{D3}$'s each independently represent a hydrogen atom or a substituent, p and q each independently represent an integer of 0 to 4, and

*'s each independently represent a bonding site to another structure.

14. The organic semiconductor element according to claim 3,

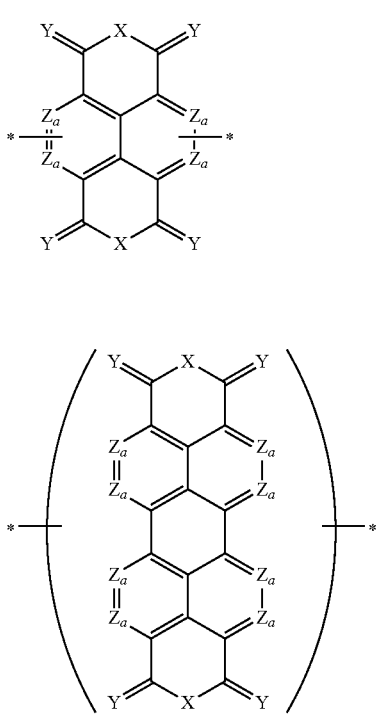

wherein D in Formula (1) is a structure represented by Formula (D-1),

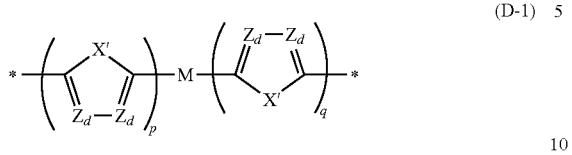

(D-1)

in Formula (D-1), X″s each independently represent O, S, Se, or $NR^{D1}$, $R^{D1}$'s each independently represent a monovalent organic group that may be the monovalent group represented by Formula (1-1), $Z_d$'s each independently represent N or $CR^{D2}$, $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —$NR^{D3}$— or the monovalent group represented by Formula (1-1), $R^{D3}$'s each independently represent a hydrogen atom or a substituent, p and q each independently represent an integer of 0 to 4, and

*'s each independently represent a bonding site to another structure.

15. The organic semiconductor element according to claim 12, wherein D in Formula (1) is a structure represented by Formula (D-1),

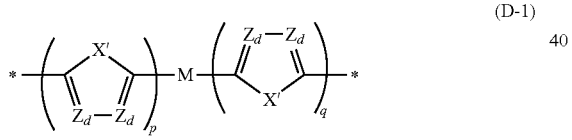

(D-1)

in Formula (D-1), X″s each independently represent O, S, Se, or $NR^{D1}$, $R^{D1}$'s each independently represent a monovalent organic group that may be the monovalent group represented by Formula (1-1), $Z_d$'s each independently represent N or $CR^{D2}$, $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —$NR^{D3}$— or the monovalent group represented by Formula (1-1), $R^{D3}$'s each independently represent a hydrogen atom or a substituent, p and q each independently represent an integer of 0 to 4, and

*'s each independently represent a bonding site to another structure.

16. The organic semiconductor element according to claim 2, wherein the repeating unit represented by Formula (1) is a repeating unit represented by any one of Formulae (2) to (5),

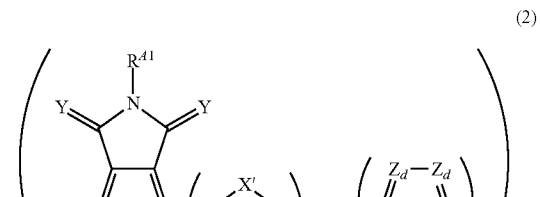

(2)

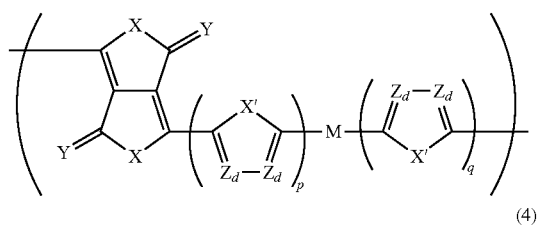

(3)

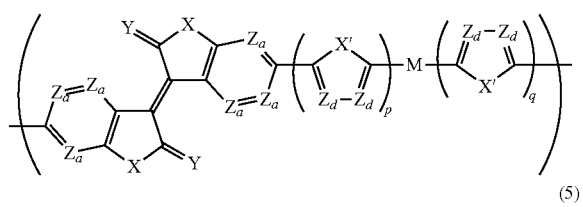

(4)

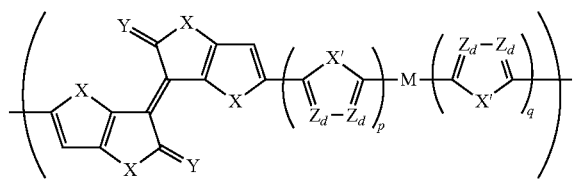

(5)

in Formulae (2) to (5), X's each independently represent an O atom, a S atom, a Se atom, or $NR^{41}$, $R^{41}$'s each independently represent an alkyl group that may contain at least one of —O—, —S—, or —$NR^{43}$—, the monovalent group represented by Formula (1-1), or a bonding site to another structure, Y's each independently represent an O atom or a S atom, $Z_a$'s each independently represent $CR^{42}$ or a N atom, $R^{42}$'s each independently represent a hydrogen atom, a halogen atom, an alkyl group that may contain at least one of —O—, —S—, or —$NR^{43}$—, or a bonding site to another structure, $R^{43}$'s each independently represent a hydrogen atom or a substituent, X″s each independently represent O, S, Se, or $NR^{D1}$, $R^{D1}$'s each independently represent a monovalent organic group that may be the monovalent group represented by Formula (1-1), $Z_d$'s each independently represent N or $CR^{D2}$, $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —NR$^{D3}$— or the monovalent group represented by Formula (1-1), R$^{D3}$'s each independently represent a hydrogen atom or a substituent, and p and q each independently represent an integer of 0 to 4.

17. The organic semiconductor element according to claim 3, wherein the repeating unit represented by Formula (1) is a repeating unit represented by any one of Formulae (2) to (5),

(2)

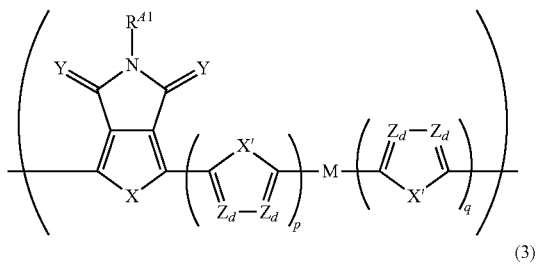
(3)

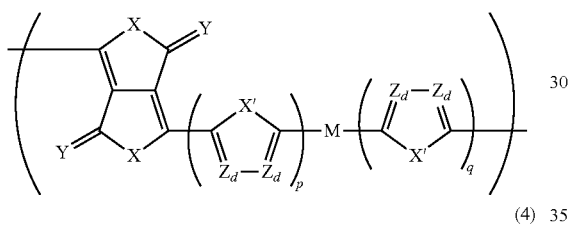
(4)

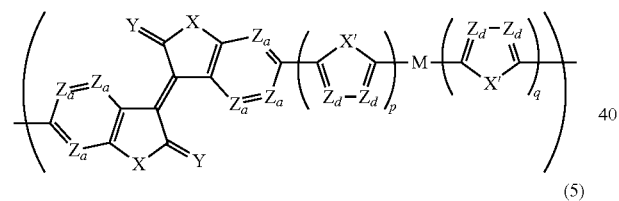
(5)

in Formulae (2) to (5), X's each independently represent an O atom, a S atom, a Se atom, or NR$^{41}$, R$^{41}$'s each independently represent an alkyl group that may contain at least one of —O—, —S—, or —NR$^{43}$—, the monovalent group represented by Formula (1-1), or a bonding site to another structure, Y's each independently represent an O atom or a S atom, Z$_a$'s each independently represent CR$^{42}$ or a N atom, R$^{42}$'s each independently represent a hydrogen atom, a halogen atom, an alkyl group that may contain at least one of —O—, —S—, or —NR$^{43}$—, or a bonding site to another structure, R$^{43}$'s each independently represent a hydrogen atom or a substituent, X"s each independently represent O, S, Se, or NR$^{D1}$, R$^{D1}$'s each independently represent a monovalent organic group that may be the monovalent group represented by Formula (1-1), Z$_d$'s each independently represent N or CR$^{D2}$, R$^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —NR$^{D3}$— or the monovalent group represented by Formula (1-1), R$^{D3}$'s each independently represent a hydrogen atom or a substituent, and p and q each independently represent an integer of 0 to 4.

18. The organic semiconductor element according to claim 4, wherein the repeating unit represented by Formula (1) is a repeating unit represented by any one of Formulae (2) to (5),

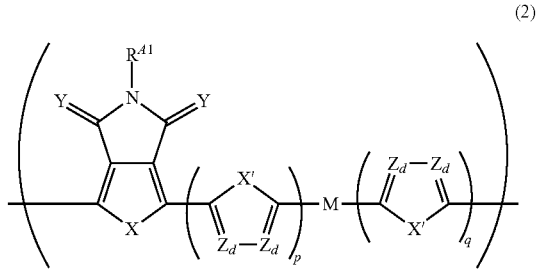
(2)

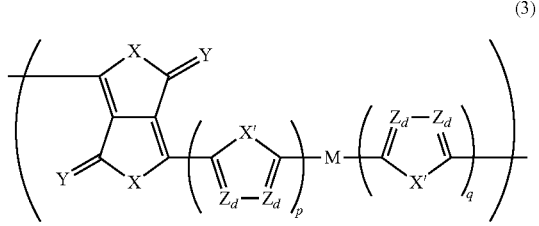
(3)

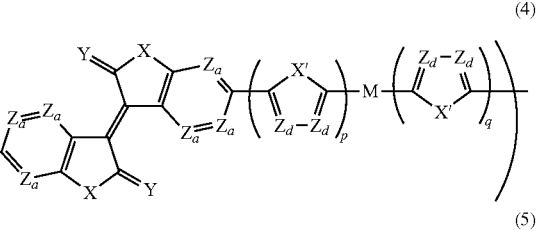
(4)

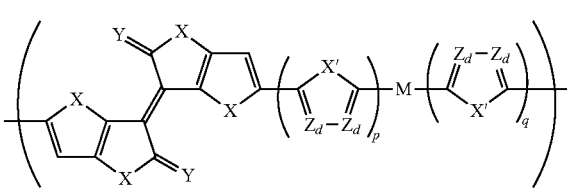
(5)

in Formulae (2) to (5), X's each independently represent an O atom, a S atom, a Se atom, or NR$^{41}$, R$^{41}$'s each independently represent an alkyl group that may contain at least one of —O—, —S—, or —NR$^{43}$—, the monovalent group represented by Formula (1-1), or a bonding site to another structure, Y's each independently represent an O atom or a S atom, $Z_a$'s each independently represent $CR^{A2}$ or a N atom, $R^{A2}$'s each independently represent a hydrogen atom, a halogen atom, an alkyl group that may contain at least one of —O—, —S—, or —$NR^{A3}$—, or a bonding site to another structure, $R^{A3}$'s each independently represent a hydrogen atom or a substituent, X"s each independently represent O, S, Se, or $NR^{D1}$, $R^{D1}$'s each independently represent a monovalent organic group that may be the monovalent group represented by Formula (1-1), $Z_d$'s each independently represent N or $CR^{D2}$, $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —$NR^{D3}$— or the monovalent group represented by Formula (1-1), $R^{D3}$'s each independently represent a hydrogen atom or a substituent, and p and q each independently represent an integer of 0 to 4.

19. The organic semiconductor element according to claim 12, wherein the repeating unit represented by Formula (1) is a repeating unit represented by any one of Formulae (2) to (5), (2)

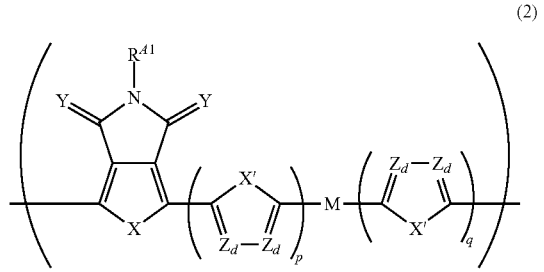

(3)

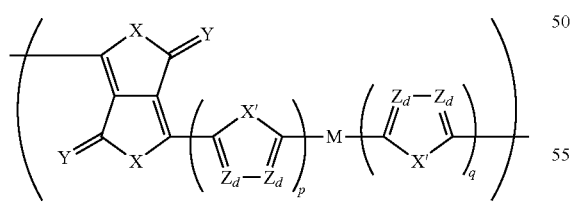

(4)

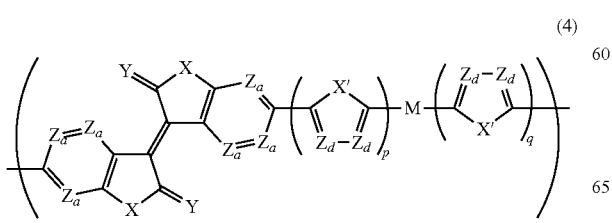

(5)

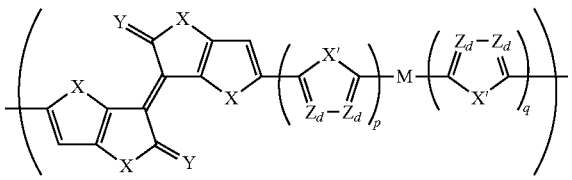

in Formulae (2) to (5), X's each independently represent an O atom, a S atom, a Se atom, or $NR^{41}$, $R^{41}$'s each independently represent an alkyl group that may contain at least one of —O—, —S—, or —$NR^{A3}$—, the monovalent group represented by Formula (1-1), or a bonding site to another structure, Y's each independently represent an O atom or a S atom, $Z_a$'s each independently represent $CR^{A2}$ or a N atom, $R^{A2}$'s each independently represent a hydrogen atom, a halogen atom, an alkyl group that may contain at least one of —O—, —S—, or —$NR^{A3}$—, or a bonding site to another structure, $R^{A3}$'s each independently represent a hydrogen atom or a substituent, X"s each independently represent O, S, Se, or $NR^{D1}$, $R^{D1}$'s each independently represent a monovalent organic group that may be the monovalent group represented by Formula (1-1), $Z_d$'s each independently represent N or $CR^{D2}$, $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —$NR^{D3}$— or the monovalent group represented by Formula (1-1), $R^{D3}$'s each independently represent a hydrogen atom or a substituent, and p and q each independently represent an integer of 0 to 4.

20. The organic semiconductor element according to claim 13, wherein the repeating unit represented by Formula (1) is a repeating unit represented by any one of Formulae (2) to (5), (2)

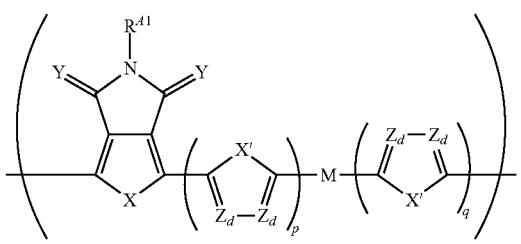

-continued

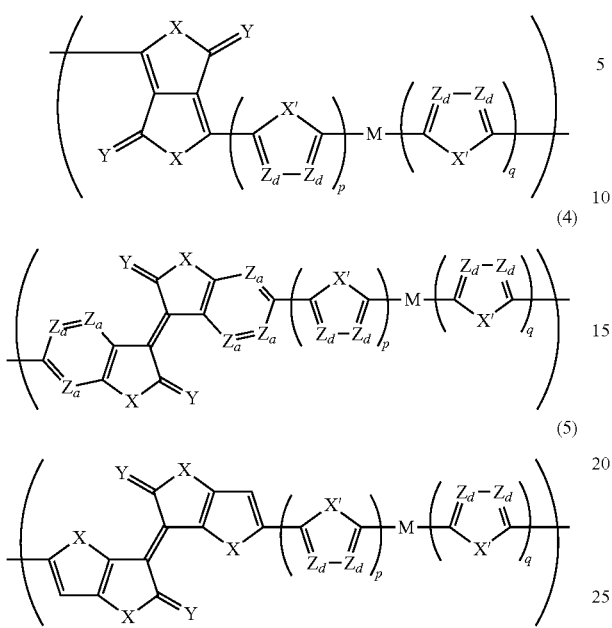

(3)

(4)

(5)

in Formulae (2) to (5), X's each independently represent an O atom, a S atom, a Se atom, or $NR^{41}$, $R^{41}$'s each independently represent an alkyl group that may contain at least one of —O—, —S—, or —$NR^{43}$—, the monovalent group represented by Formula (1-1), or a bonding site to another structure, Y's each independently represent an O atom or a S atom, $Z_a$'s each independently represent $CR^{42}$ or a N atom, $R^{42}$'s each independently represent a hydrogen atom, a halogen atom, an alkyl group that may contain at least one of —O—, —S—, or —$NR^{43}$—, or a bonding site to another structure, $R^{43}$'s each independently represent a hydrogen atom or a substituent, X"s each independently represent O, S, Se, or $NR^{D1}$, $R^{D1}$'s each independently represent a monovalent organic group that may be the monovalent group represented by Formula (1-1), $Z_d$'s each independently represent N or $CR^{D2}$, $R^{D2}$'s each independently represent a hydrogen atom or a monovalent organic group that may be the monovalent group represented by Formula (1-1), M represents a single bond, a divalent aromatic heterocyclic group, a divalent aromatic hydrocarbon group, an alkenylene group, an alkynylene group, or a divalent group obtained by combining these, M may be substituted with an alkyl group that may contain at least one of —O—, —S—, or —$NR^{D3}$— or the monovalent group represented by Formula (1-1), $R^{D3}$'s each independently represent a hydrogen atom or a substituent, and p and q each independently represent an integer of 0 to 4.

* * * * *